(12) United States Patent
Matsuura et al.

(10) Patent No.: US 9,064,839 B2
(45) Date of Patent: Jun. 23, 2015

(54) IGBT AND DIODE

(75) Inventors: Hitoshi Matsuura, Kanagawa (JP);
Makoto Koshimizu, Kanagawa (JP);
Yoshito Nakazawa, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 160 days.

(21) Appl. No.: 13/470,412

(22) Filed: May 14, 2012

(65) Prior Publication Data
US 2012/0313139 A1   Dec. 13, 2012

(30) Foreign Application Priority Data

Jun. 7, 2011 (JP) .................................. 2011-127305

(51) Int. Cl.
| | |
|---|---|
| H01L 29/76 | (2006.01) |
| H01L 29/74 | (2006.01) |
| H01L 29/36 | (2006.01) |
| H01L 29/66 | (2006.01) |
| H01L 29/739 | (2006.01) |
| H01L 29/861 | (2006.01) |
| H01L 29/08 | (2006.01) |

(Continued)

(52) U.S. Cl.
CPC .......... *H01L 29/36* (2013.01); *H01L 29/66348* (2013.01); *H01L 29/7397* (2013.01); *H01L 29/8611* (2013.01); *H01L 29/0834* (2013.01); *H01L 29/1095* (2013.01); *H01L 29/1608* (2013.01)

(58) Field of Classification Search
CPC .............................. H01L 29/739; H01L 29/32
USPC .................. 257/139, 617, E29.197, E29.107
See application file for complete search history.

(56) References Cited

U.S. PATENT DOCUMENTS 5,838,026 A * 11/1998 Kitagawa et al. ............. 257/139
6,610,572 B1 * 8/2003 Takei et al. ................... 438/268

(Continued)

FOREIGN PATENT DOCUMENTS

| | | |
|---|---|---|
| JP | 2001-077357 A | 3/2001 |
| JP | 2002-305305 A | 10/2002 |

(Continued)

OTHER PUBLICATIONS

Japanese Office Action received in corresponding Japanese Application No. 2011-127305 dated Feb. 5, 2015.

*Primary Examiner* — Asok K Sarkar
*Assistant Examiner* — Dmitriy Yemelyanov
(74) *Attorney, Agent, or Firm* — Mattingly & Malur, PC

(57) ABSTRACT

In an IGBT, defects generated by ion implantation for introduction of the P-type collector region or N-type buffer region into the $N^-$-type drift region near the N-type buffer region remain to improve the switching speed, however the leak current increases by bringing a depletion layer into contact with the crystal defects at the off time. To avoid this, an IGBT is provided which includes an N-type buffer region having a higher concentration than that of an $N^-$-type drift region and being in contact with a P-type on its backside, and a defect remaining region provided near the boundary between the N-type buffer region and the $N^-$-type drift region. The $N^-$-type drift region located on the front surface side with respect to the defect remaining region is provided with an N-type field stopping region having a higher concentration than that of the $N^-$-type drift region.

12 Claims, 39 Drawing Sheets

(51) Int. Cl.
*H01L 29/10* (2006.01)
*H01L 29/16* (2006.01)

(56) References Cited

U.S. PATENT DOCUMENTS

| | | |
|---|---|---|
| 6,617,641 B2 | 9/2003 | Nakagawa et al. |
| 7,776,660 B2 | 8/2010 | Miyashita et al. |
| 8,072,241 B2 | 12/2011 | Kouno |
| 8,450,793 B2 | 5/2013 | Rahimo et al. |
| 2002/0100934 A1* | 8/2002 | Nakagawa et al. ............ 257/330 |
| 2006/0237793 A1* | 10/2006 | Nadd et al. .................... 257/355 |
| 2008/0076238 A1* | 3/2008 | Miyashita et al. ............ 438/527 |
| 2008/0265315 A1* | 10/2008 | Mauder et al. ................ 257/330 |

FOREIGN PATENT DOCUMENTS

| | | |
|---|---|---|
| JP | 2004-193212 A | 7/2004 |
| JP | 2005-135979 A | 5/2005 |
| JP | 2008-004866 A | 1/2008 |
| JP | 2008-085050 A | 4/2008 |
| JP | 2009-099690 A | 5/2009 |
| JP | 2010-541266 A | 12/2010 |
| JP | 2011-049384 A | 3/2011 |

* cited by examiner

IGBT AND DIODE

CROSS-REFERENCE TO RELATED APPLICATIONS

The disclosure of Japanese Patent Application No. 2011-127305 filed on Jun. 7, 2011 including the specification, drawings and abstract is incorporated herein by reference in its entirety.

BACKGROUND

The invention relates to a technique effectively applied to a device structure and a manufacturing technology of power semiconductor devices (or semiconductor integrated circuit devices), such as an insulated gate bipolar transistor (IGBT) or a diode.

Japanese Unexamined Patent Publication No. 2004-193212 (Patent Document 1) discloses a technique that provides an $n^+$-type region at some midpoint of an $n^-$-type drift region in a punch-through type IGBT or the like so as to suppress vibrations of voltage and current waveforms at the time of turn-off.

Japanese Unexamined Patent Publication No. 2001-77357 (Patent Document 2) discloses a technique that provides an $n^-$-type intermediate region and a low lifetime region included therein, between a $p^+$-type collector region and an $n^+$-type field stopping region in a punch-through IGBT or the like so as to achieve low tail current characteristics or the like.

Japanese Unexamined Patent Publication No. 2008-85050 (Patent Document 3) or U.S. Pat. No. 7,776,660 (Patent Document 4) corresponding thereto discloses a technique for an IGBT or the like with a field stopping region, using a silicon single crystal wafer formed by a floating zone (FZ) method. The technique involves using crystal defects remaining due to ion implantation as a lifetime killer upon annealing after performing the ion implantation for formation of a collector from its backside.

RELATED ART DOCUMENTS

Patent Documents

[Patent Document 1]
Japanese Unexamined Patent Publication No. 2004-193212
[Patent Document 2]
Japanese Unexamined Patent Publication No. 2001-77357
[Patent Document 3]
Japanese Unexamined Patent Publication No. 2008-85050
[Patent Document 4]
U.S. Pat. No. 7,776,660

SUMMARY

As to an IGBT including an N-type buffer region having a higher concentration than that of an $N^-$-type drift region (or $N^-$-type base region) in contact with a P-type collector region on its backside, the following method for forming a device structure is known. The method involves leaving defects generated by ion implantation or the like for introducing a P-type collector region or an N-type buffer region into the $N^-$-drift region near the N-type buffer region, thereby improving a switching speed. In such an "ion implantation residual defect type IGBT", residual crystal defects work as the center of recombination to improve the switching speed at the off time, while a depletion layer is brought into contact with the crystal defects at the off time to adversely increase a leak current. The same goes for a fly-back diode coupled in antiparallel to the IGBT or the like.

The invention in the present application is to solve these problems.

It is an object of the present invention to provide an IGBT with high reliability, and a diode used in a pair with the IGBT.

The above and other objects and the novel features of the invention will become apparent from the description of the present specification and the accompanying drawings.

The outline of representative aspects of the invention disclosed in the present application will be briefly described below.

That is, one aspect of the invention in the present application provides an IGBT which includes an N-type buffer region having a higher concentration than that of an $N^-$-type drift region and in contact with a P-type collector region on its backside, and a defect remaining region (crystal defect region) provided from the vicinity of the boundary between the N-type buffer region and the $N^-$-type drift region to apart near the $N^-$-type drift region. A high-concentration N-type field stopping region having a higher concentration than that of the $N^-$-type drift region is provided at the $N^-$-type drift region located on the front surface side with respect to the defect remaining region.

Effects of the representative aspects of the invention disclosed in the present application will be briefly described as follows.

That is, the IGBT includes an N-type buffer region having a higher concentration than that of an $N^-$-type drift region and in contact with a P-type collector region on its backside, and a defect remaining region provided from the vicinity of the boundary between the N-type buffer region and the $N^-$-type drift region to a part near the $N^-$-type drift region. The high-concentration N-type field stopping region having a higher concentration than that of the $N^-$-type drift region is provided at the $N^-$-type drift region located on the front surface side with respect to the defect remaining region. Thus, a depletion layer cannot reach the defect remaining region in an off state.

DETAILED DESCRIPTION

Outline of Preferred Embodiments

Figure 1:
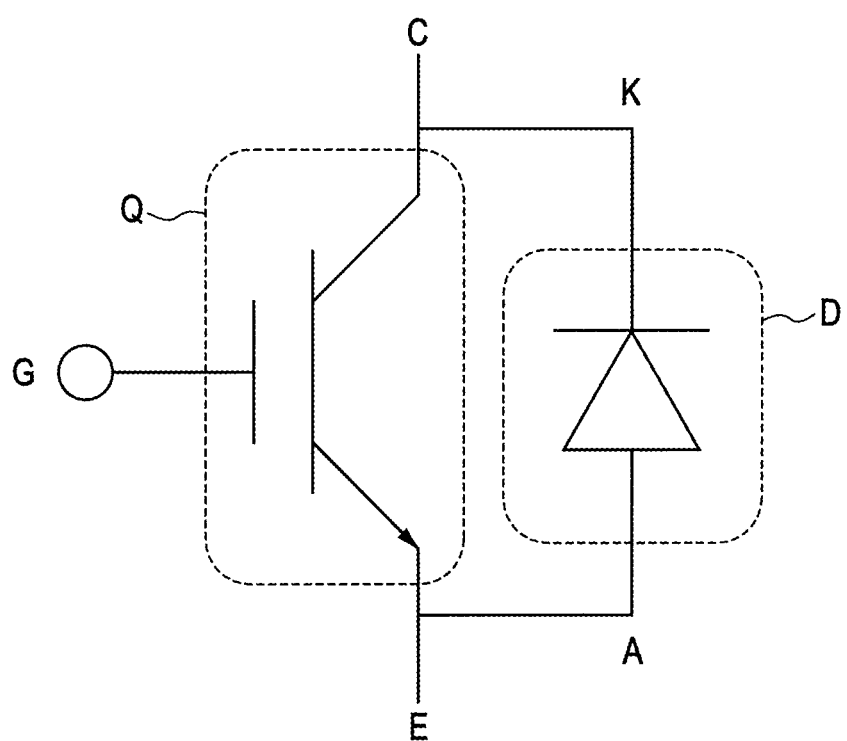
FIG. 1 is a connection diagram between a pair of an IGBT and a diode in the use form of a semiconductor device (including the IGBT and the diode) of each embodiment of the invention in the present application.

First, the outline of representative preferred embodiments of the invention disclosed in the present application will be described below.

An IGBT in one embodiment of the invention includes:

(a) a semiconductor substrate having a first main surface and a second main surface, (b) a drift region of a first conductive type occupying a main part of the semiconductor substrate;

(c) a channel region of a second conductive type opposite to the first conductive type, provided at a front surface region on the first main surface side of the drift region;

(d) an emitter region of the first conductive type provided at a front surface region on the first main surface side of the channel region;

(e) a collector region of the second conductive type provided at a front surface region on the second main surface side of the drift region;

(f) a buffer region of the first conductive type provided at the drift region on an inner side of the collector region so as to be in contact with the collector region, the buffer region having a higher concentration than that of the drift region;

(g) a crystal defect region provided along the buffer region from a vicinity of a boundary with the buffer region to a part near the drift region; and (h) a field stopping region of the first conductive type provided along the crystal defect region at the drift region located on the first main surface side with respect to the crystal defect region, the field stopping region having a higher concentration than that of the drift region.

2. In the IGBT according to Item 1, the semiconductor substrate is a single crystal silicon substrate.

3. The IGBT according to Item 2, the single crystal silicon substrate is formed by a FZ method.

4. In the IGBT according to Item 3, the field stopping region is formed by ion-implanting hydrogen ions or helium ions.

5. In the IGBT according to any one of Items 1 to 4, the IGBT is of a trench gate type.

6. In the IGBT according to any one of Items 1 to 5, the IGBT is an IE-type trench gate IGBT.

7. The IGBT according to any one of Items 1 to 6 further includes:

(i) a metal collector electrode provided over the second main surface of the semiconductor substrate; and (j) a high-concentration collector contact region provided at the collector region on the metal collector electrode side, the collector contact region having the same conductive type as that of the collector region, and a higher impurity concentration than that of the collector region. The high-concentration collector contact region is a region doped with aluminum.

8. In the IGBT according to Item 7, a part in contact with the high-concentration collector contact region of the metal collector electrode is a metal film containing aluminum as a principal component.

9. A diode according to the invention includes:

(a) a semiconductor substrate having a first main surface and a second main surface, (b) a drift region of a first conductive type occupying a main part of the semiconductor substrate;

(c) an anode metal electrode provided over the first main surface of the semiconductor substrate;

(d) a cathode region of the first conductive type provided at a front surface region on the second main surface side of the drift region, the cathode region having a higher concentration than that of the drift region;

(e) a crystal defect region provided along the cathode region from a vicinity of a boundary with the cathode region to a part near the drift region; and (f) a field stopping region of the first conductive type provided along the crystal defect region at the drift region located on the first main surface side with respect to the crystal defect region, said field stopping region having a higher concentration than that of the drift region.

10. In the diode according to Item 9, the semiconductor substrate is a single crystal silicon substrate.

11. In the diode according to Item 10, the single crystal silicon substrate is formed by a FZ method.

12. In the IGBT according to Item 11, the field stopping region is formed by ion-implanting hydrogen ions or helium ions.

Explanation of Description Format, Basic Terms, and Usage in Present Application 1. The following preferred embodiments in the present application may be described below by being divided into a plurality of sections or embodiments for convenience, if necessary, which are not independent from each other unless otherwise specified. Each embodiment corresponds to each component in a single example. Alternatively, one of the embodiments related to the details of the other, or a modified example of a part or all of the other. The same facts will not be repeatedly described in principle. Each component of the embodiment is not necessarily essential unless otherwise specified, except when the number of the components is limited to a specific one in principle, or except when apparently not understood so from context.

Further, the term "semiconductor device" as used in the present application mainly means various transistors, a single diode (positive element), or a resistor, or a capacitor including the transistor or diode as a main part integrated over a semiconductor chip or the like (for example, a single crystal silicon substrate, a circuit board, or the like). The representative one of various transistors can be, by way of example, a metal insulator semiconductor field effect transistor (MISFET), typified by a metal oxide semiconductor field effect transistor (MOSFET). At this time, the representative one of various single transistors can be, by way of example, a power MOSFET, or an insulated gate bipolar transistor (IGBT). These are defined as one type of the power semiconductor device. These transistors include a bipolar power transistor, a thyristor, a power diode, and the like in addition to the power MOSFET and the IGBT.

The representative form of the power MOSFET includes a double diffused vertical power MOSFET including a source electrode on its front surface and a drain electrode on its back surface. The double diffused vertical power MOSFET can be mainly classified into two types, namely, first, a planar gate type, which will be mainly described in the embodiment, and second, a trench gate type, such as an U-MOSFET.

The power MOSFETs include a lateral-diffused MOSFET (LD-MOSFET), in addition to the above ones.

2. Likewise, in the description of the embodiments, the term "X comprised of A" or the like as to material or component does not exclude a component including an element other than A as a principal component unless otherwise specified and except when not apparently understood from context. For example, as to a component, the above term means "X containing A as a principal component" and the like. For example, the term "silicon member" or the like is not limited to pure silicon, and apparently contain a multi metal alloy which contains a SiGe alloy, or a component containing silicon as a principal element, and another additive. Likewise, the term "silicon oxide film", or "silicon oxide-based insulating film" means not only a relatively pure undoped silicon dioxide, but also a thermal oxide film comprised of, fluoro-silicate glass (FSG), TEOS-based silicon oxide, silicon oxicarbide (SiOC), carbon-doped silicon oxide, organosilicate glass (OSG), phosphorus silicate glass (PSF), or borophosphosilicate glass (BPSG), an application oxide silicon film, such as a CVD oxide film, a spin On glass (SOG) film, or a nano-clustering silica (NCS), a silica low-k insulating film (porous insulating film) comprised of the above same material with holes introduced thereinto, a composite film comprised of a combination of another silicon insulating film containing the above element as a principal component.

The silicon insulating film generally used in the field of semiconductor may be, in addition to the silicon oxide insulating film, a silicon nitride insulating film. Suitable materials contained in the insulating film are, for example, SiN, SiCN, SiNH, SiCNH, and the like. The term "silicon nitride" contains both SiN and SiNH, unless otherwise specified. Likewise, the term "SiCN" as used therein means both SiCN and SiCNH, unless otherwise specified.

3. Likewise, although preferred specific graphic, position, and attribute will be described by way of example, apparently the invention is not strictly limited to specific graphic, position, and attribute, and the like unless otherwise specified, and except when not understood so from context.

4. Further, even when the reference is made to a specific numerical value or quantity, unless otherwise specified, except when limited to the specific numerical value in theory, and except when not understood so from context, the number thereof may be greater than, or less than the specific number.

5. The term "wafer" as used herein means a single crystal silicon wafer or the like over which a semiconductor device (semiconductor integrated circuit device, or electronic device) is generally formed, but apparently may mean an epitaxial wafer, an SOI substrate, a composite wafer including an insulating substrate, such as a LCD glass substrate, and a semiconductor layer. Suitable materials for the wafer are not limited to silicon, and may include SiGe, SiC, GaN, GaAs, InP, and the like.

6. Like the previous description of the power MOSFET, the IGBT is generally classified into a planar gate type and a trench gate type. The trench gate type IGBT has a relatively low on resistance. In order to further promote conductivity modulation and to further decrease the on resistance, an "injection enhancement (IE)-type trench gate IGBT" (or "active cell spaced trench gate IGBT") utilizing the injection enhancement (IE) effect has been developed. The IE-type trench gate IGBT has an active cell actually coupled to an emitter electrode and an inactive cell having a floating P body region in a cell region. These cells are alternately arranged, or disposed in the form of comb teeth, whereby holes (acceptors) tend to be stored on the device main surface side (emitter side) of the semiconductor substrate.

In the present application, a related art trench gate IGBT which is not an IE-type trench gate IGBT or an active cell spaced type IGBT is called "full active trench gate IGBT (or non-IE-type trench gate IGBT" so as to be distinguished from the IE-type trench gate IGBT. The term "full active" as used herein does not exclude a dummy cell positioned in the surroundings, or an inactive cell or the like serving as a peripheral structure.

7. The term "narrow active cell IE-type trench gate IGBT" as used in the present application means an IE-type trench gate IGBT in which the width of a main active cell is narrower than that of a main inactive cell.

The direction across a trench gate is called "cell width direction", and the extending direction (longitudinal direction) of the trench gate (linear gate) perpendicular to the above width direction is called "cell length direction".

The present application mainly handles "linear unit cell region" (comprised of a linear active cell region and a linear inactive cell region), and the linear unit cell regions are repeated in a cyclic manner, and arranged in an inner region of the semiconductor chip to thereby form the "cell region".

Generally, a cell peripheral coupling region is provided around the cell region, and further a floating field ring or field limiting ring or the like is provided around the cell peripheral coupling region, which forms an end structure. The floating field ring or field limiting ring is provided at the surface (device surface) of a drift region apart from a P-type body region (P-type well region), but has the same conduction type as that of the P-type body region and the similar concentration (which is such a concentration not to cause complete depletion when a reverse voltage is applied to a main junction) to that of the P-type body region. The floating field ring is an impurity region or a group of impurity regions comprised of one or more rings of cell regions.

The floating field ring is provided with a field plate. The field plate is a conductor film pattern coupled to the floating field ring, and extends above the surface (device surface) of a drift region via an insulating film to enclose the cell region in a ring-like manner.

In the linear unit cell region which serves as a cyclic element forming the cell region, linear inactive cell regions having a half width are arranged as one set on both sides of the linear active cell region positioned at the center thereof, which is reasonable. Specifically, the individual description of the linear inactive cell regions is inconvenient because the inactive cell regions are separated into both sides. In such a case, specifically, an integrated part is hereinafter referred to as a linear inactive cell region.

8. In the present application, the diode will be described below, assisted by the description about the IGBT, if necessary. Suppose that the diode is a two-polar structure without a gate of the IGBT, an anode of the diode corresponds to an emitter of the IGBT, and a cathode of the diode corresponds to a collector of the IGBT.

The diode used as a fly-back diode is classified into a PIN diode and a schottky diode. Alternatively, a composite diode is, for example, a merged pin-schottky (MPS) diode, a static-shielding-diode (SSD), and the like.

Details of Preferred Embodiments

Some preferred embodiments will be further described below in detail. In the respective drawings, the same or like parts are indicated by the same or like reference character or numeral, and its description will not be repeated in principle.

In the accompanying drawings, hatching will be omitted even in the cross-sectional view when complicated or clearly distinguished from a void. In this context, when apparently cleared from the description or the like, even the contour of a hole closed in a planar manner will be omitted in some cases. Further, hatching is often given to a part which is not a void, not even in the cross-sectional view so as to show that the part is not the void.

1. Description of Main Application Fields of Semiconductor Devices (IGBT, diode) of Respective Embodiments of Present Application (See Mainly FIGS. 1 and 2)

In the following, a motor drive circuit will be specifically described below as an application example. The application field of the semiconductor device (IGBT, diode) of the respective embodiments in the present application is not apparently limited thereto.

Figure 2:
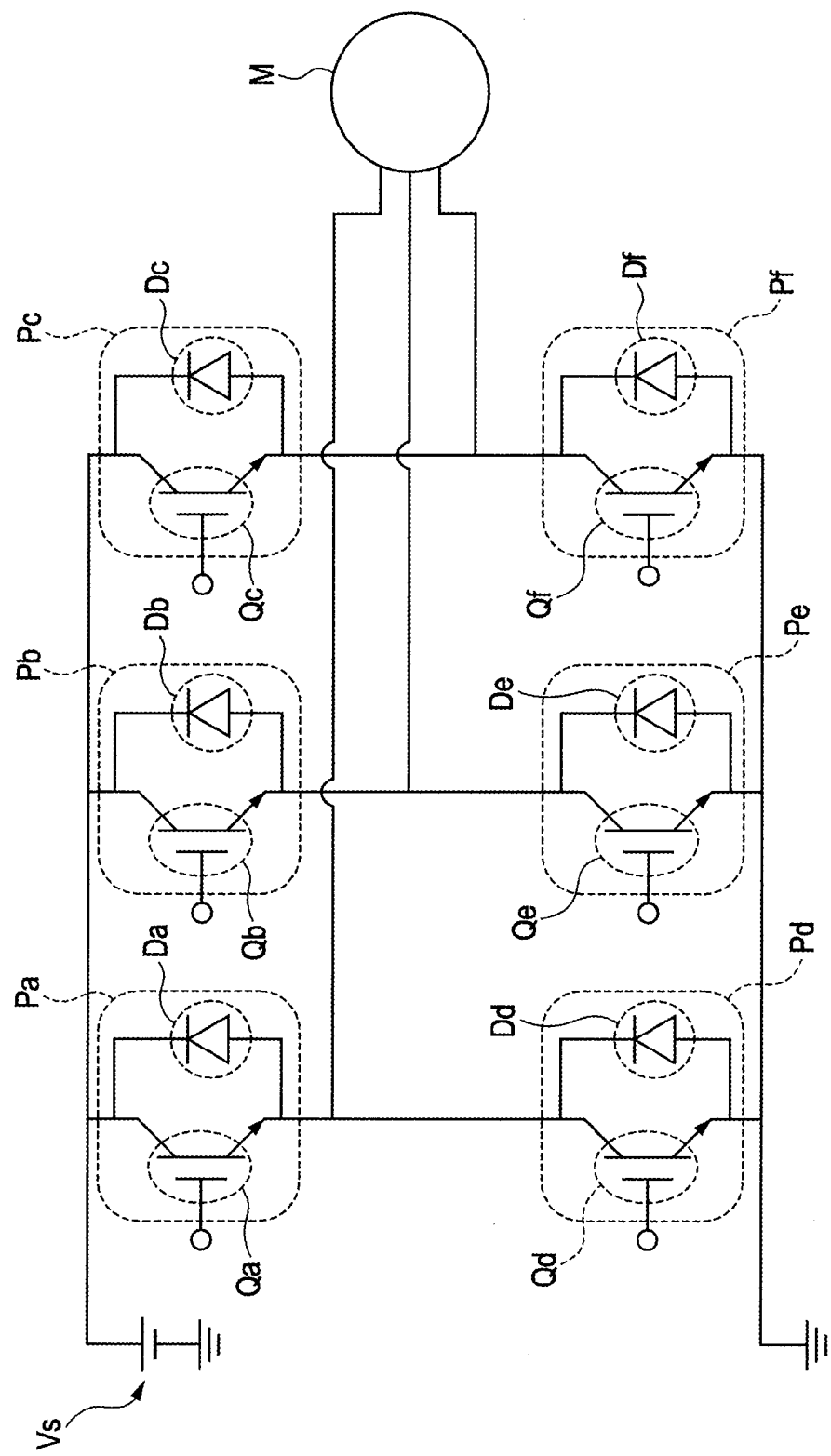
FIG. 2 is a circuit diagram of a motor driving circuit to which the pair of the IGBT and diode shown in FIG. 1 is used to driving for a three-phase motor.

FIG. 1 is a connection diagram between a pair of an IGBT and a diode in the use form of a semiconductor device (including the IGBT and the diode) of each embodiment of the invention in the present application. FIG. 2 is a circuit diagram of a motor driving circuit to which the pair of the IGBT and diode shown in FIG. 1 is applied to driving for a three-phase motor. Based on the accompanying drawings, the main application fields or the like of the semiconductor device (IGBT, diode) of the respective embodiments in the present application will be described below.

The IGBT and diode of this embodiment in the present application is used in the state of a paired connection shown in FIG. 1 (for example, as a paired module). That is, a collector terminal C of the IGBT (Q) is coupled to a cathode terminal K of a fly-back diode D. An emitter terminal E of the IGBT (Q) is coupled to an anode terminal A of the fly-back diode D. The paired module has three terminals including the terminal G as viewed from the outside.

FIG. 2 shows one example (three-phase motor driving circuit) of a specific application circuit which includes pairs of IGBTs and diodes Pa, Pb, Pc, Pd, Pe, and Pf. As shown in FIG. 2, the three-phase motor driving circuit uses the pairs of IGBTs and diodes Pa, Pb, Pc, Pd, Pe, and Pf to drive a three-phase motor 30 by switching an output from a direct current power supply 31 at the. The respective paired IGBTs and diodes Pa, Pb, Pc, Pd, Pe, and Pf are comprised of a combination of the IBGT elements Qa, Qb, Qc, Qd, Qe, and Qf and the power diode elements Da, Db, Dc, Dd, De, and Df.

The power diode element in the invention of the present application may be used not only for the above IGBT, but also for a switching element, such as a MOS transistor or a bipolar transistor. Further, the power diode element can be widely used not only for the three-phase motor, but also for a circuit, such as a two-phase motor or a solenoid driving circuit.

2. Description of Entire Structure or the like of IGBT Device Chip of One Embodiment in Present Application (See, Mainly, FIGS. 3 to 5)

In this section, by way of example, the previous definitions or the like are complemented, while the outline of the representative examples in the present application will be explained by taking the examples to thereby provide the entire preliminary explanation.

In the following, specifically, the IE-type trench gate IGBT will be mainly described below. As will be described later, the same goes for a full active type trench gate IGBT.

Figure 3:
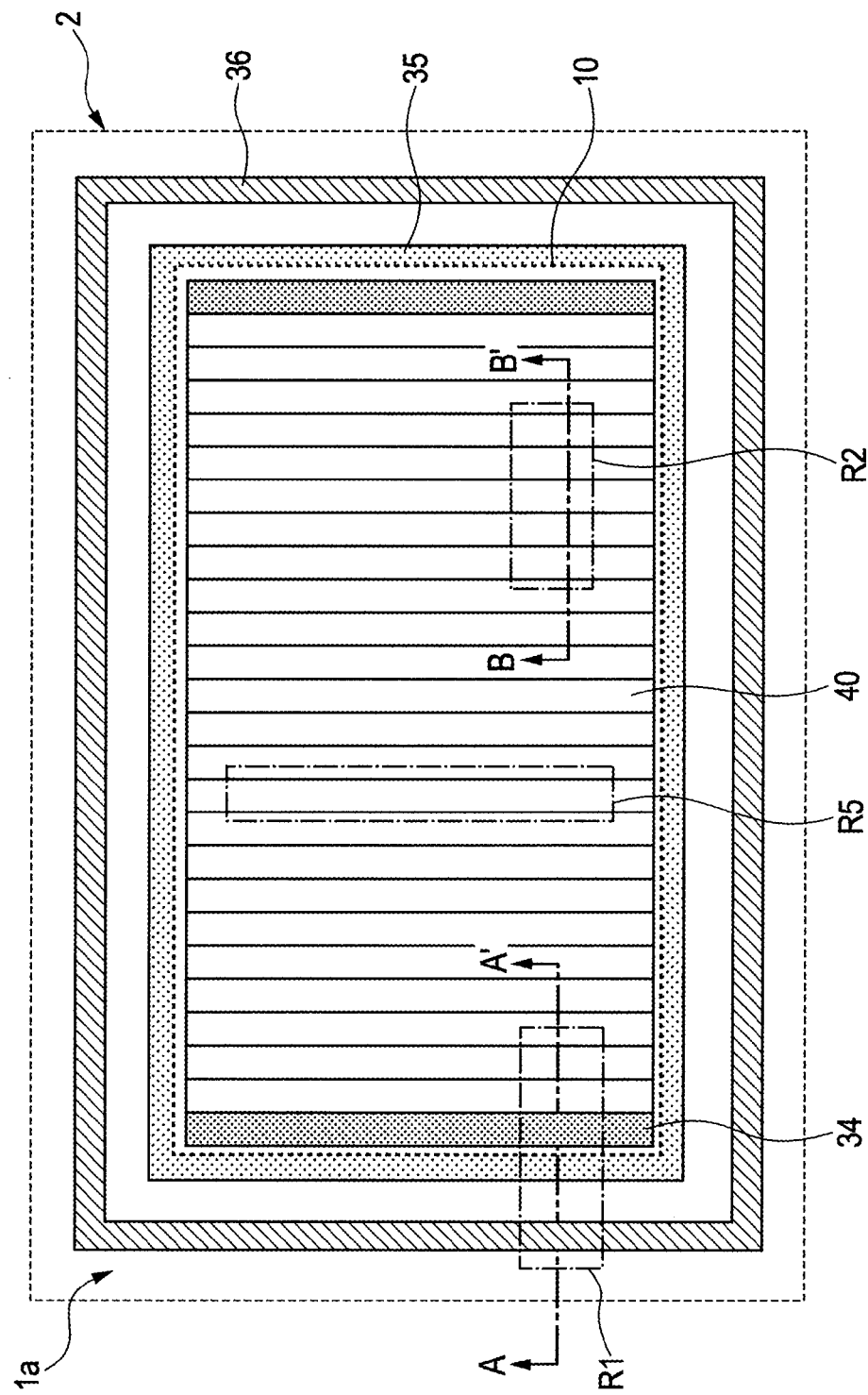
FIG. 3 is an exemplary layout diagram of an upper surface of a cell region of an IE-type trench gate IGBT device chip and its surroundings for explaining the outline of the main embodiment of the invention in the present application.
Figure 4:
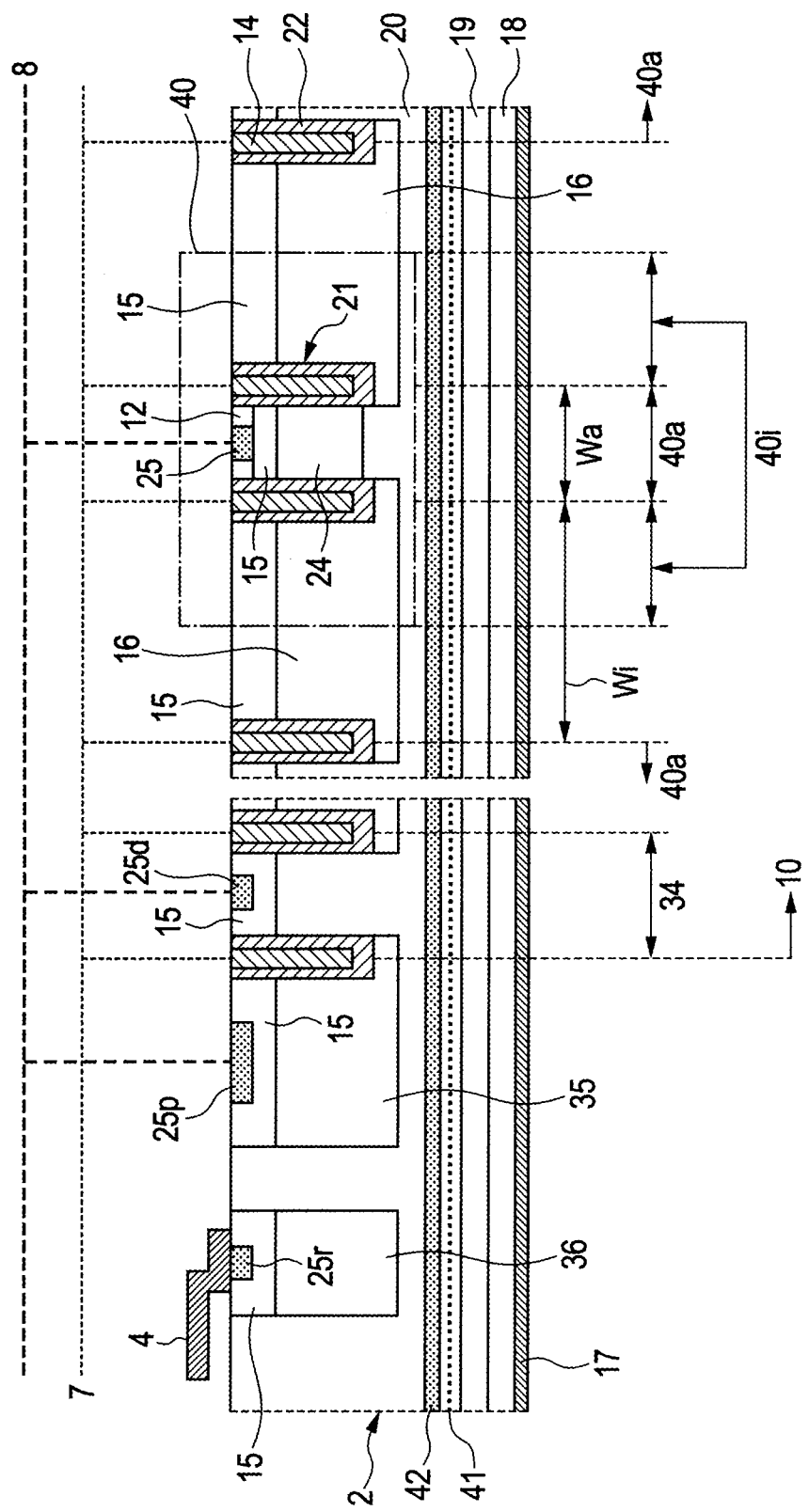
FIG. 4 is an exemplary cross-sectional view of a cutout region R1 at an end of the cell region of the device, taken along the line A-A' of FIG. 3.
Figure 5:
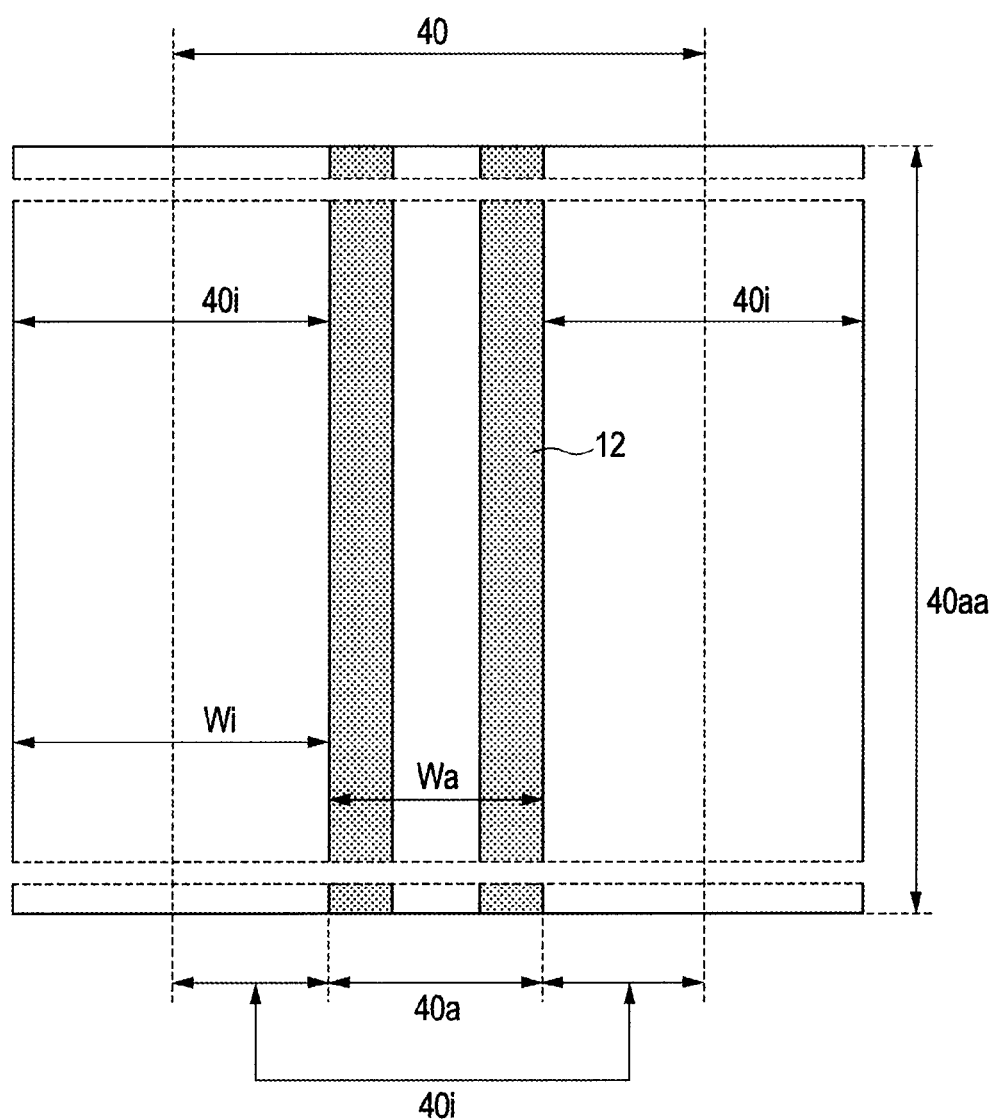
FIG. 5 is an enlarged top view of a linear unit cell region shown in FIG. 3 and its surroundings R5 in one embodiment of the invention in the present application (corresponding to FIGS. 6 to 8 showing a one-dimensional active cell spaced structure)
Figure 6:
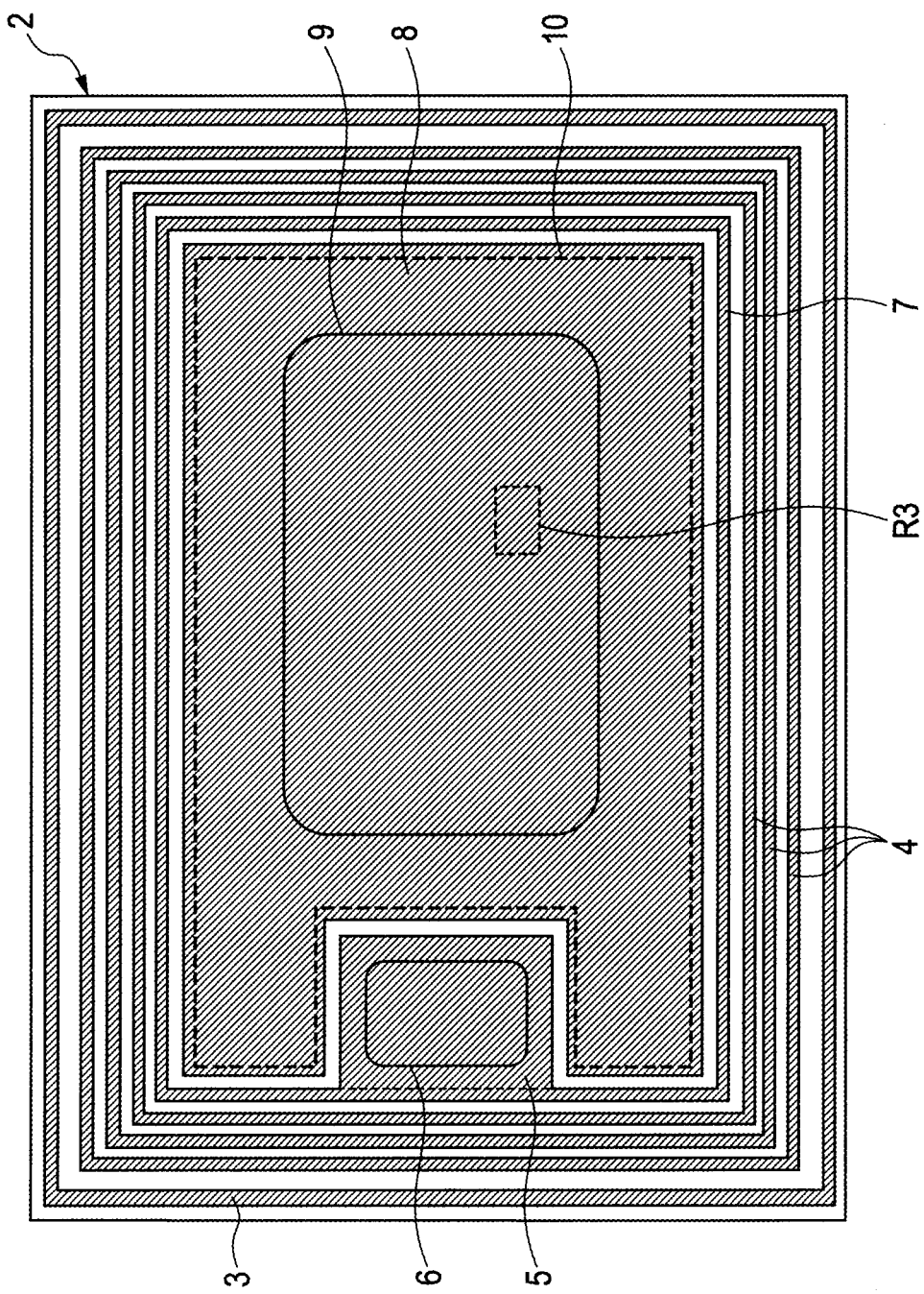
FIG. 6 is a top view (substantially corresponding to FIG. 3, more specifically, showing the shape similar to that shown in FIG. 3) of the entire IE-type trench gate IGBT device chip in the one embodiment (which is common to other embodiments) of the invention in the present application.
Figure 7:
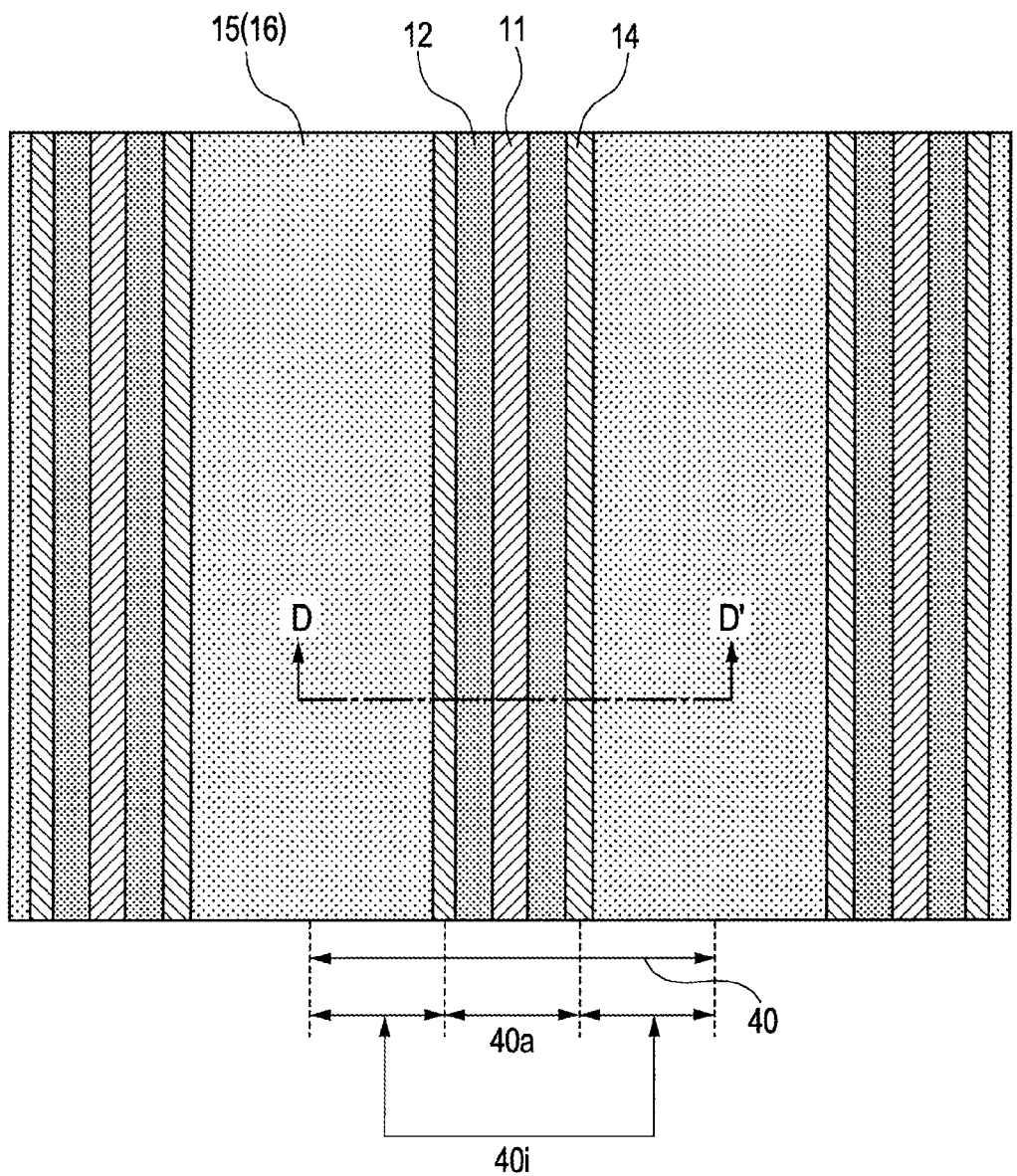
FIG. 7 is an enlarged top view of a cut region R3 in the cell region shown in FIG. 6.
Figure 8:
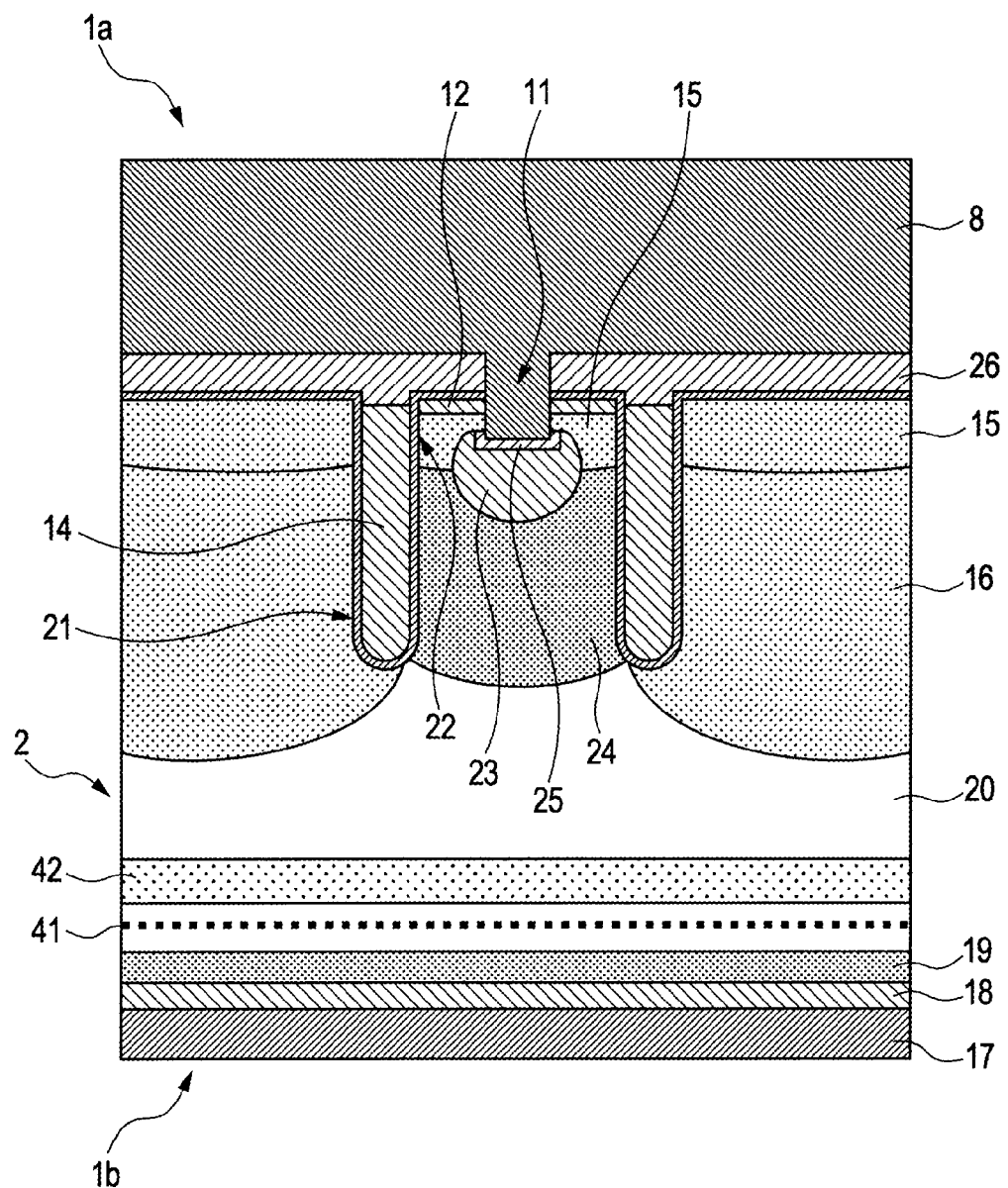
FIG. 8 is a cross-sectional view of the device taken along the line D-D' of FIG. 7.

FIG. 3 is an exemplary layout diagram of an upper surface of a cell region of an IE-type trench gate IGBT device chip and its surroundings for explaining the outline of the main embodiment of the invention in the present application. FIG. 4 shows an exemplary cross-sectional view of the device taken along the line A-A' of a cut region R1 at the cell region end of FIG. 3. FIG. 5 shows an enlarged top view of a linear unit cell region shown in FIG. 3 and its surroundings R5 in one embodiment of the invention in the present application (corresponding to FIGS. 6 to 8 showing a one-dimensional active cell spaced structure). Based on these drawings, the entire structure of the IGBT device chip of the one embodiment in the present application will be described below.

(1) Description of Planar Structure of Cell Region and its Surroundings (see mainly FIG. 3): First, FIG. 3 shows a top view of an inner region (a part inside a guard ring or the like positioned at the outermost part of an end structure, that is, a main part of a chip 2) of the device chip 2 of an IE-type trench gate IGBT, which is a main object of description in this section. As shown in FIG. 3, the main part of the inner region of the chip 2 (semiconductor substrate) is occupied by a cell region 10. The cell region 10 is provided with a ring-like P-type cell peripheral coupling region 35 so as to enclose its outer periphery thereof. A P-type floating field rings 36 (that is, field limiting ring 36 (that is, field limiting ring) in the form of a single or plurality of rings is provided by some distance outside the cell peripheral coupling region 35, which forms the end structure together with the cell peripheral coupling region 35, the guard ring 4 (see FIG. 6), and the like with respect to the cell region 10.

In this example, a number of linear unit cell regions 40 are spread over the cell region 10. In such an end region, a pair or more (one line or several lines for each side) of dummy cell regions 34 (linear dummy cell regions) are disposed.

(2) Description of Intermediate Field Stopping Region, Narrow Active Cell type Unit Cell, and Alternate Arrangement System (see, mainly FIG. 4): FIG. 4 shows a cross-sectional view of a cut region R1 of the end of the cell region taken along the line A-A' of FIG. 3. As shown in FIG. 4, a P$^+$-type collector region 18 is provided at the semiconductor region (silicon single crystal region in this example) at a backside 1$b$ (main back side or second main surface of the semiconductor substrate) of the chip 2. A metal collector electrode 17 is provided over the surface of the P$^+$-type collector region 18. An N-type buffer region 19 (first conductive type buffer region) having a higher concentration than that of an N$^-$-type drift region 20 is provided between the N$^-$-type drift region 20 (first conductive type drift region) forming a main part of the semiconductor substrate 2 and the P$^+$-type collector region 18 (second conductive type collector region). That is, the N-type buffer region 19 is provided at the N-type drift region 20 located on the inner side of the P$^+$-type collector region 18 so as to be in contact with the P$^+$-type collector region 18. A crystal defect region 41 is provided along the N-type buffer region 19 from the vicinity of the boundary of the N-type buffer region 19 (boundary between the N-type buffer region 19 and the N$^-$-type drift region 20) to a part near the N$^-$-type drift region 20. Further, an N-type field stopping region 42 having a higher concentration than that of the N$^-$-type drift region 20 is provided over the N$^-$-type drift region 20 on the first main surface side along the crystal defect region 41.

The crystal defect region 41 is to improve the switching characteristics by restricting the lifetime of the holes. For example, this embodiment uses crystal defects remaining at the time of activation annealing after introduction of the N-type buffer region 19 and the P$^+$-type collector region 18. An N-type field stopping region 42 (intermediate field stopping region) prevents the depletion layer from reaching the crystal defect region 41 in the off state to effectively prevent the increase in leak current. The N-type field stopping region 42 (intermediate field stopping region) is independently disposed with the N$^-$-type drift region 20 sandwiched between the N-type buffer region 19 and the region 42. The relationship of concentration in PN junction between the P$^+$-type collector region 18 and the N-type buffer region 19, which define an implantation efficiency of the holes, and the concentration of the N-type field stopping region 42 can be independently set appropriately, which are the merit.

A number of trenches 21 is provided in the semiconductor region on the front surface side 1$a$ (main surface on the front side of the semiconductor substrate or the first main surface) of the N-type drift region 20. In each trench, a trench gate electrode 14 is embedded via a gate insulating film 22. Each trench gate electrodes 14 is coupled to a metal gate electrode 5.

These trenches 21 serve to separate the respective regions. For example, a dummy region 34 is partitioned from both sides thereof by a pair of trenches 21. The cell region 10 and the cell peripheral coupling region 35 are separated from each other by one of the trenches 21. The cell peripheral coupling region 35 is coupled to the metal emitter electrode 8 via a P$^+$-type body contact region 25$p$. In the present application, unless otherwise specific, the thicknesses of the gate insulating films 22 in any parts of the trenches are substantially the same (however, the thickness of a part may be compared to, and different from that of the other if necessary). In this way, in the cell peripheral coupling region 35 and the dummy cell region 34, even when the width of the dummy cell region 34 or the like is changed over the process, the reduction of the withstand voltage can be prevented by the emitter contact.

A P-type floating field ring 36 is provided in the semiconductor region on the front surface side 1$a$ of the N$^-$-type drift region 20 outside the cell peripheral coupling region 35. A field plate 4 is provided over the surface 1$a$, and coupled to the floating field ring 36 via a P$^+$-type body contact region 25$r$.

Next, the cell region 10 will be further described below. The dummy cell region 34 is basically the same as the linear active cell region 40$a$ in structure and size except that the dummy cell region does not have the N$^+$-type emitter region 12. A P$^+$-type body contact region 25$d$ provided at the surface of the P-type body region 15 is coupled to the metal emitter electrode 8. Most parts in the inner region of the cell region 10 are basically comprised of a repeated structure in the parallel direction using the linear unit cell 40 as a unit cell (note that the repeated structure does not require the symmetric property in a strict sense, which can also be applied in the same manner to the following description). The linear unit cell region 40 as a unit cell is comprised of the linear active cell region 40$a$ and half-width linear inactive regions 40$i$ positioned on both sides of the active cell 40$a$. Specifically, a full-width linear inactive cell 40$i$ can be considered to be positioned between the adjacent linear active cell regions 40$a$ (see FIG. 5).

A P-type body region 15 (second conduction type channel region) is provided in a semiconductor surface region on the main front surface 1$a$ (first main surface) side of the semiconductor substrate in the linear active cell region 40$a$. An N$^+$-type emitter region 12 (first conductive type emitter region) and a P$^+$-type body contact region 25 are provided over the body region 15. The P$^+$-type body contact region 25 is coupled to a metal emitter electrode 8. An N-type hole barrier region 24 is provided over an N$^-$-type drift region 20 under the P-type body region 15 in the linear active cell region 40$a$.

In contrast, likewise, the P-type body region 15 is provided over the semiconductor surface region on the main front surface 1$a$ (first main surface) of the semiconductor substrate in the linear inactive cell region 40$i$. A P-type floating region 16 (second conduction type floating region) is provided in the N$^-$-type drift region 20 under the P-type body region 15. The floating region 16 covers the lower end of trenches 21 on both sides thereof, and is deeper than the trench 21. Provision of the P-type floating region 16 can increase the width Wi of the linear inactive cell region without reducing the drastic decrease in withstand voltage. This arrangement can effectively reinforce the hole trapping effect. In the IE-type trench gate IGBT, the P-type floating region 16 traps the holes to thereby increase the concentration of holes in the N-type drift region 20 (N base region) under the linear active cell region 40$a$. As a result, the concentration of electrons charged from the MOSFET in the IGBT into the N base region is improved to decrease the on resistance.

In this example, the width Wa of the linear active cell region 40$a$ is narrower than the width Wi of the linear inactive cell region 40$i$. In the present application, this cell is called "narrow active cell-type unit cell". In the following, the device mainly including the narrow active cell-type unit cell will be specifically described. The invention in the present application is not limited thereto, and apparently can also be applied to a "non-narrow active cell-type unit cell".

In the example shown in FIG. 4, the linear active cell region 40a and the linear inactive cell region 40i are alternately arranged to form the linear unit cell region 40. This structure is called "alternate arrangement system" in the present application. In the following, unless otherwise specified, the alternate arrangement system will be described, but the same may go for the "non-alternate arrangement system".

FIG. 4 exemplarily shows main components including respective components in various embodiments of the invention in the present application. Now, these components are divided into a cell (section and planar structure thereof) and a peripheral portion of the cell, which will be described below. These elements are not independent from one another, and as shown in FIG. 4, each of various modified examples is substituted for each component to form a main portion.

(3) Description of Active Cell One-Dimensional Spaced Structure (see mainly FIG. 5)

FIG. 5 shows one example of a detailed planar structure including a main part of the linear unit cell region shown in FIG. 3 and its peripheral cut region R5. As shown in FIG. 5, an $N^+$-type emitter region 12 is provided over the entire linear active cell region 40a in the length direction. That is, the whole area of the linear active cell region 40a in the length direction becomes an active section 40aa. The active section 40aa is a section of the linear active cell region 40a extending in the length direction and provided with the $N^+$-type emitter region 12

The structure is called the "active cell one-dimensional spaced structure" in the present application.

3. Description of Cell Structure of IGBT of One Embodiment of the Invention in Present Application (see mainly FIGS. 6 to 8)

This section will describe, in addition to the description of the sections 1 and 2, one specific example of the layout of an upper surface of a chip, and a unit cell structure which corresponds to the one embodiment (which is the example of the active cell one-dimensional spaced structure corresponding to FIGS. 3 to 5 in section 2). The cell structure described in this section is a narrow active cell-type unit cell of the alternate arrangement type.

A normal IGBT element 2 having a withstand voltage of 600 volts will be described by way of example. The average chip size is about 3 to 6 mm square. For convenience of the description, a chip which is 4 mm long and 5.2 mm wide is used by way of example. The withstand voltage of the device is about 600 volts.

FIG. 6 shows a top view of the entire IE-type trench gate IGBT device chip of the one embodiment (common to other embodiments) in the present application (which substantially corresponds to the form shown in FIG. 3, and whose shape is very similar to a more specific shape shown in FIG. 3). FIG. 7 is an enlarged top view of the cut region R3 within the cell region shown in FIG. 6 (which is a P-type deep floating and hole barrier linear unit cell structure). FIG. 8 is a device cross-sectional view taken along the line D-D' of FIG. 7. Based on these drawings, the device structure of the IE-type trench gate IGBT of the one embodiment in the present application will be described below.

As shown in FIG. 6, a ring-like guard ring 3 formed of, for example, aluminum wiring layer or the like is provided at an outer periphery of the upper surface 1a of the IGBT device chip 2. Inside the guard ring, several (single or a plurality of) ring-like field plates 4 (for example, comprised of the same aluminum wiring layer or the like as that described above) are provided to be coupled to the ring-like floating field rings and the like. The cell region 10 is provided inside the field plate 4 (floating field ring 36) and in a main part within the inner region at the upper surface 1a of the chip 2. The cell region 10 has a part near its outer periphery covered with the metal emitter electrode 8 composed of the previous same aluminum wiring layer as that described above. At the center of the metal emitter electrode 8, a metal emitter pad 9 is provided for coupling to a bonding wire or the like. For example, a metal gate wiring 7 formed of the same aluminum wiring layer as that described above is disposed between the metal emitter electrode 8 and the field plate 4. The metal gate wiring 7 is coupled to a metal gate electrode 5 formed of the same aluminum wiring layer as that described above. The center of the metal gate electrode 5 becomes a gate pad 6 for coupling the bonding wire or the like.

FIG. 7 shows an enlarged top view of the cut region R3 inside the cell region shown in FIG. 6. As shown in FIG. 7, the cell region 10 is comprised of the linear active cell region 40a and the linear inactive cell region 40i which are alternately arranged in the lateral direction. The trench gate electrode 14 is disposed between the linear active cell region 40a and the linear inactive cell region 40i. Further, a linear contact groove 11 (or contact hole) is disposed at the center of the linear active cell region 40a. The linear active cell regions 40a on both sides of the contact trench 11 are provided with the linear $N^+$-emitter regions 12. In contrast, over the entire surface of the linear inactive cell region 40i, a P-type body region 15 is provided on the upper side, and a P-type floating region 16 is provided on the lower side (see FIG. 4 or FIG. 8).

Next, FIG. 8 shows the cross-sectional view taken along the line D-D' of FIG. 7. As shown in FIG. 8, in the semiconductor region at the backside 1b of the semiconductor chip 2, a $P^+$-type collector region 18 and an N-type buffer region 19 are formed in contact with each other on the upper side and the lower side, respectively. A metal collector electrode 17 is formed over the backside 1b of the semiconductor chip 2. That is, as described above, the N-type buffer region 19 is provided at the N-type drift region 20 located on the inner side of the $P^+$-type collector region 18 so as to be in contact with the $P^+$-type collector region 18. A crystal defect region 41 is provided along the N-type buffer region 19 from the vicinity of the boundary with the N-type buffer region 19 (boundary between the N-type buffer region 19 and the W-type drift region 20) to a part near the $N^-$-type drift region 20. Further, an N-type field stopping region 42 having a higher concentration than that of the W-type drift region 20 is provided over the $N^-$-type drift region 20 located on the first main surface side with respect to the region 41 along the crystal defect region 41.

The N-type hole barrier region 24 (first conductive type hole barrier region), the P-type body region 15, and the $N^+$-type emitter region 12 are provided from the bottom in that order over the $N^-$-type drift region 20 (front surface side semiconductor region of the semiconductor substrate) on the front surface 1a side (first main surface) of the semiconductor chip 2 in the linear active cell region 40a. An interlayer insulating film 26 is formed over the front surface 1a of the semiconductor chip 2. The interlayer insulating film 26 in the linear active cell region 40a has the contact trenches 11 (or contact holes) reaching the inside of the semiconductor substrate. The $P^+$-type body contact region 25 and the $P^+$-type latch-up preventing region 23 are provided from above in that order in the semiconductor region at the bottom of each contact trench 11 or the like. The P-type body region 15 and the $N^+$-type emitter region 12 are coupled to the metal emitter electrode 8 provided over the interlayer insulating film 26 via the contact trench 11 or the like.

The N-type hole barrier region 24 is a barrier region for blocking the flow of holes through a route from the $N^-$-type drift region 20 to the N⁺-type emitter region 12. The concentration of impurities of the N-type hole barrier region 24 is lower than that of the N⁺-type emitter region 12 and higher than that of the N-type drift region 20. The presence of the N-type hole barrier region 24 can effectively prevent the holes trapped in the linear inactive cell regions 40i from entering an emitter passage of the linear active cell region 40a (a passage from the N⁻-type drift region 20 to the P⁺-type body contact region 25).

In contrast, the P-type floating region 16 and the P-type body region 15 are provided from the bottom in that order in the N⁻-type drift region 20 (semiconductor region on the front surface side of the semiconductor substrate) on the surface 1a (first main surface) side of the semiconductor chip 2 in the linear inactive cell region 40i. The P-type floating region 16 is deeper than the trench 21 to cover the lower end of the trench 21.

Now, one example of main sizes of each component of the device will be described so as to specifically explain the device structure (see FIGS. 4 and 8). That is, the width Wa of the linear active cell region is about 2.3 µm, and the width Wi of the linear inactive cell region is about 6 µm (note that the width Wa of the linear active cell region is desirably narrower that the width Wi of the linear inactive cell region, and the ratio of Wi to Wa (Wi/Wa) is preferably in a range of, for example, 2 to 3). The contact width is about 0.5 µm, and the trench width is about 0.7 µm (preferably, 0.8 µm or less). The trench depth is about 3 µm, and the depth of the N⁺-type emitter region 12 is about 250 nm. The depth of the P-type body region 15 (channel region) is about 0.8 µm. The depth of the P⁺-type latch-up preventing region 23 is about 1.4 µm. The depth of the P⁺-type latch-up preventing region 23 is about 1.4 µm. The depth of the P-type floating region 16 is about 4.5 µm. The thickness of the N⁺-type buffer region 19 is about 1.5 µm. The depth of the P⁺-type collector region is about 0.5 µm. The N-type field stopping region 42 has a thickness of about 10 µm, and is positioned apart from the surface of the substrate by about 50 µm. The thickness of the semiconductor substrate 2 is about 70 µm (at a withstand voltage of about 600 volts, by way of example). The thickness of the semiconductor substrate 2 largely depends on the required withstand voltage. Thus, the thickness of the semiconductor substrate 2 is, for example, about 120 µm at a withstand voltage of 1200 volts, and the thickness of the semiconductor substrate 2 is, for example, about 40 µm at a withstand voltage of 400 volts.

In the following examples and also in the examples shown in the section 2, the size of the corresponding component is substantially the same as that described above, and a description thereof will not be repeated.

4. Description of Surface Device Formation Process of IGBT of One embodiment in Present Application (see mainly FIGS. 9 to 25)

This section will describe one example of the manufacturing method of the device structure described in section 3. In the following, peripheral components or the like of the cell region 10 will be described focusing on the cell region 10 with reference to FIGS. 3 to 5 if necessary.

Figure 9:
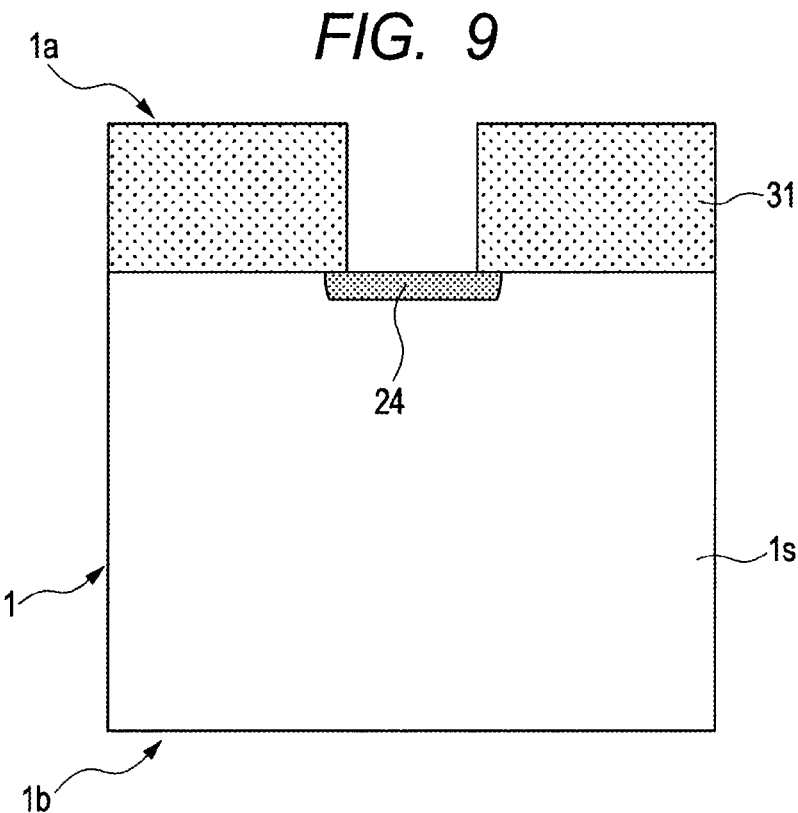
FIG. 9 is a cross-sectional view of the device in a manufacturing step (hole barrier region introduction step) corresponding to FIG. 8 for explaining a manufacturing method of the device structure of the one embodiment of the invention in the present application.
Figure 10:
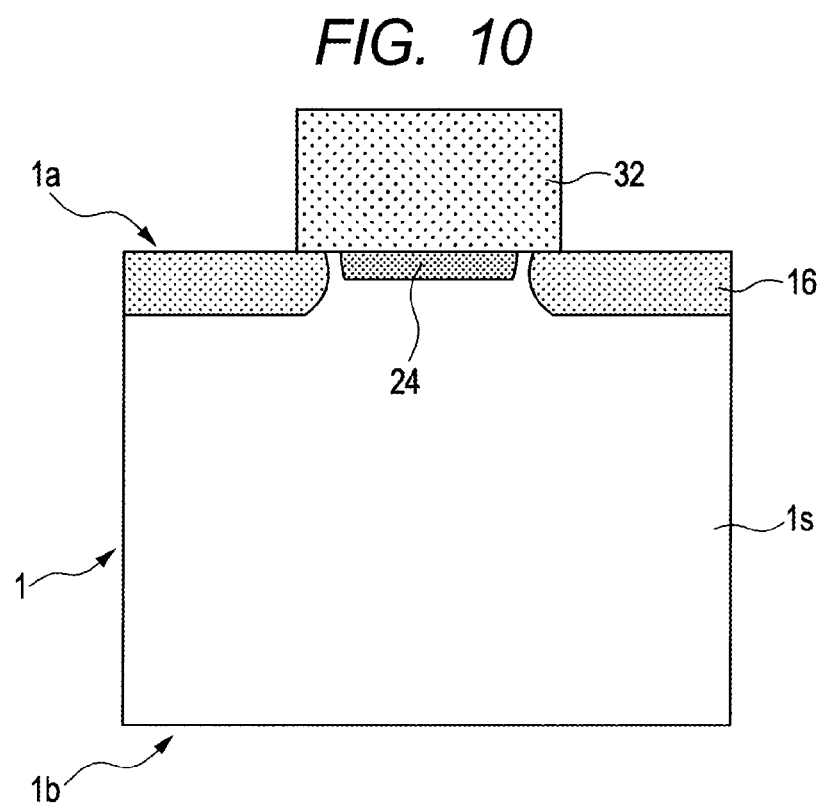
FIG. 10 is a cross-sectional view of the device in another manufacturing step (p-type floating region introduction step) corresponding to FIG. 8 for explaining the manufacturing method of the device structure of the one embodiment of the invention in the present application.
Figure 11:
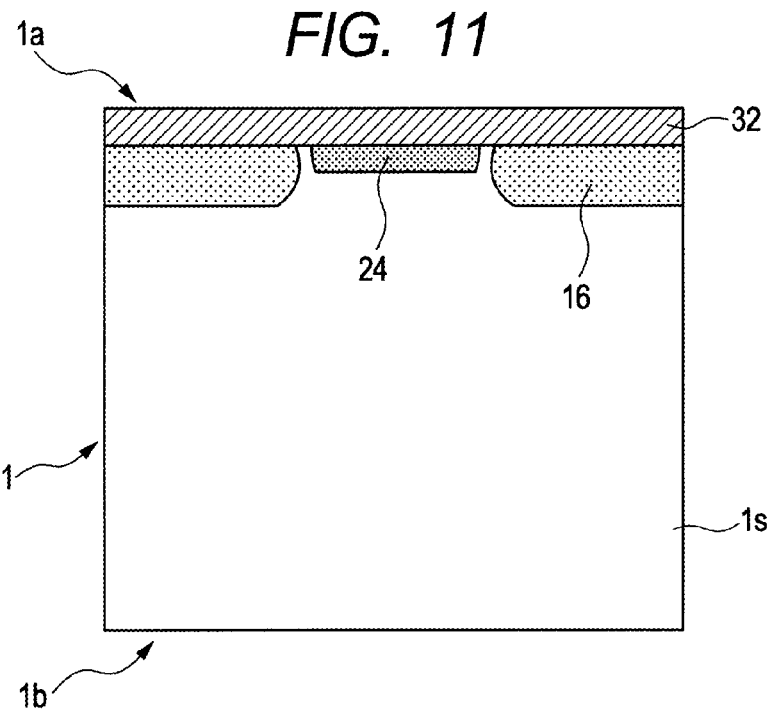
FIG. 11 is a cross-sectional view of the device in another manufacturing step (hard mask deposition step for trench processing) corresponding to FIG. 8 for explaining the manufacturing method of the device structure of the one embodiment of the invention in the present application.
Figure 12:
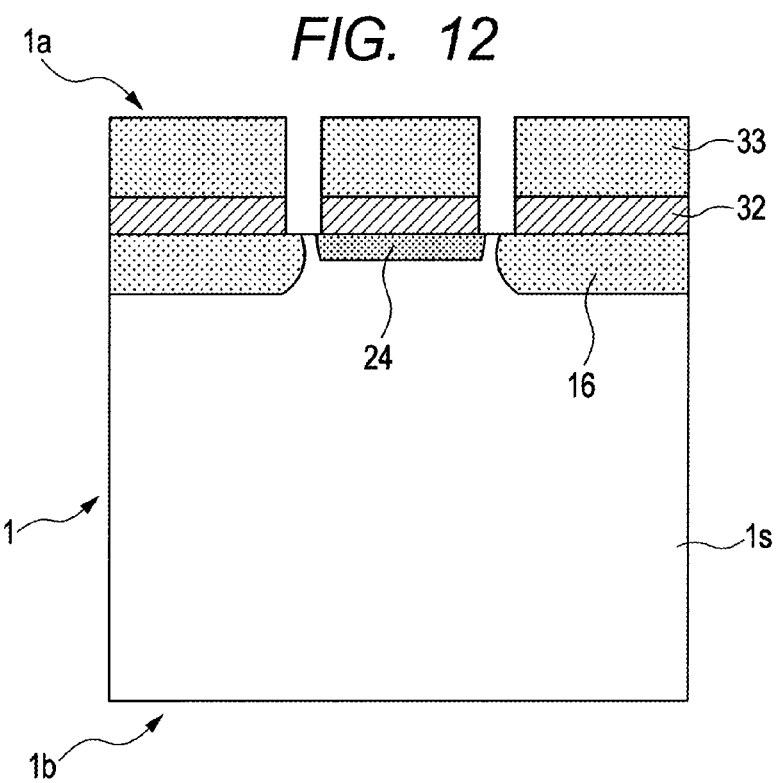
FIG. 12 is a cross-sectional view of the device in another step (trench hard mask processing step) corresponding to FIG. 8 for explaining the manufacturing method of the device structure of the one embodiment of the invention in the present application.
Figure 13:
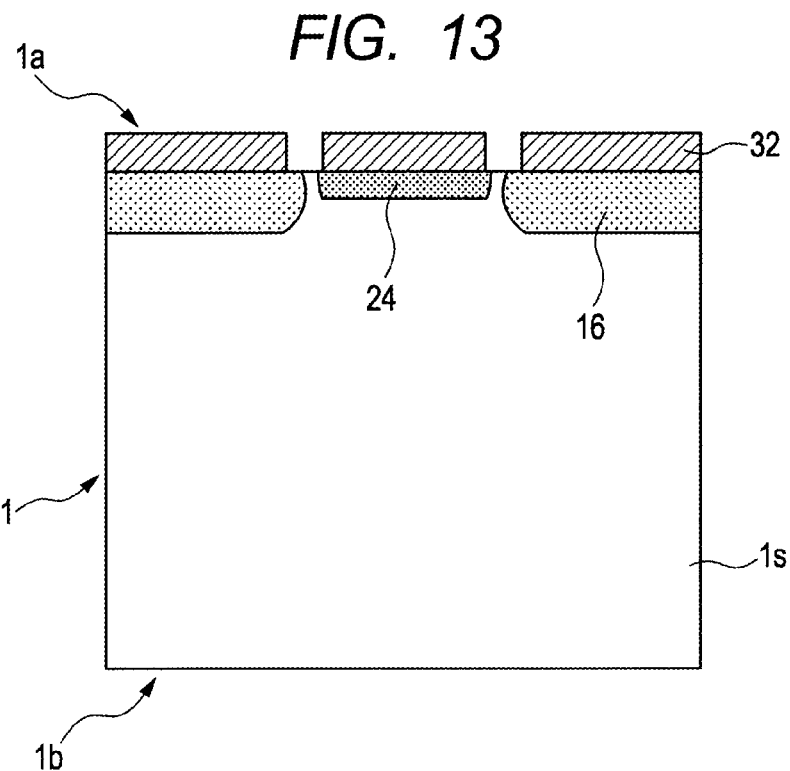
FIG. 13 is a cross-sectional view of the device in another step (resist removal step for trench hard mask processing) corresponding to FIG. 8 for explaining the manufacturing method of the device structure of the one embodiment of the invention in the present application.
Figure 14:
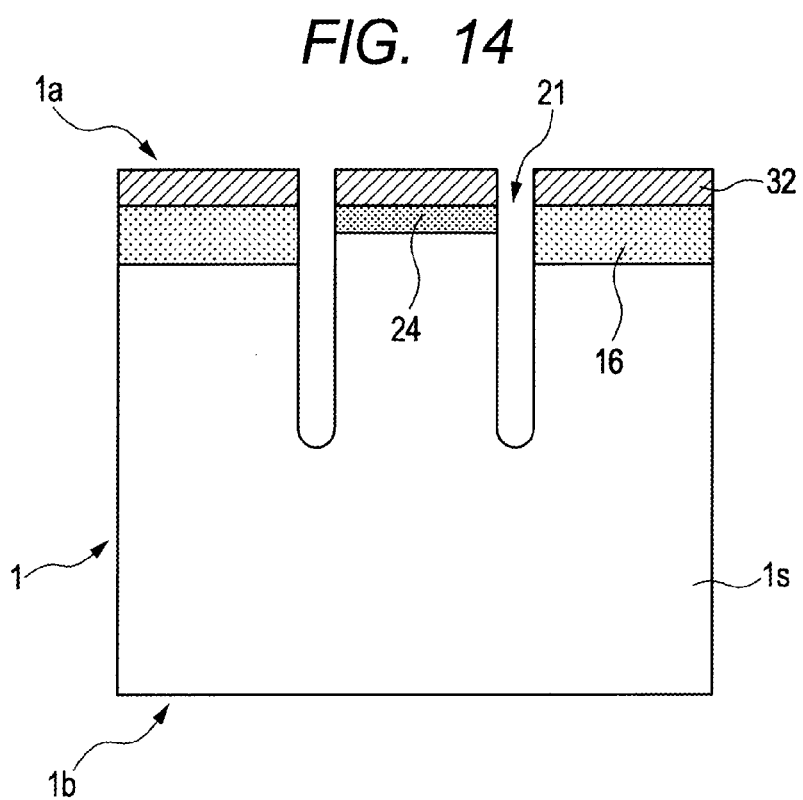
FIG. 14 is a cross-sectional view of the device in another step (trench processing step) corresponding to FIG. 8 for explaining the manufacturing method of the device structure of the one embodiment of the invention in the present application.
Figure 15:
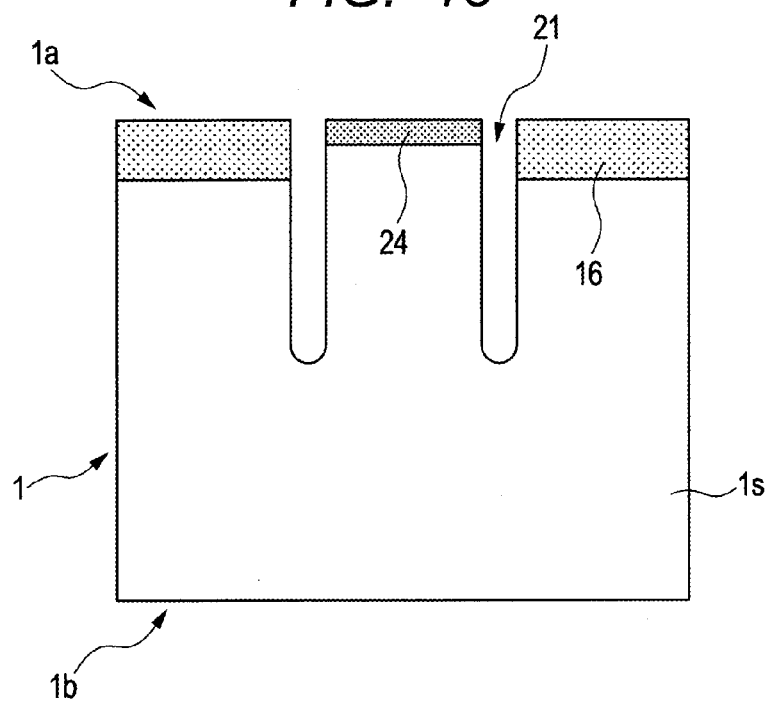
FIG. 15 is a cross-sectional view of the device in another step (hard mask removal step for trench processing) corresponding to FIG. 8 for explaining the manufacturing method of the device structure of the one embodiment of the invention in the present application.
Figure 16:
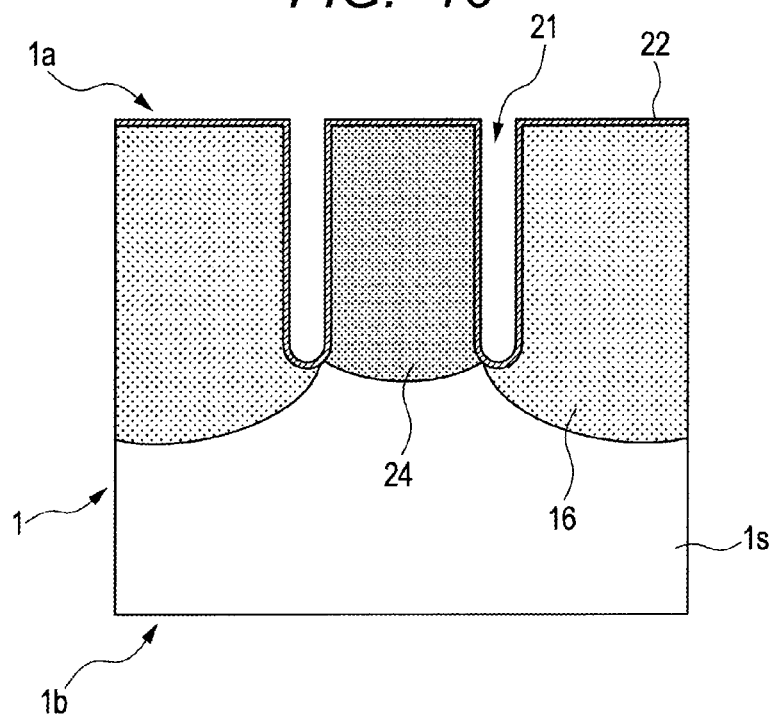
FIG. 16 is a cross-sectional view of the device in another step (extending diffusion and gate oxidation step) corresponding to FIG. 8 for explaining the manufacturing method of the device structure of the one embodiment of the invention in the present application.
Figure 17:
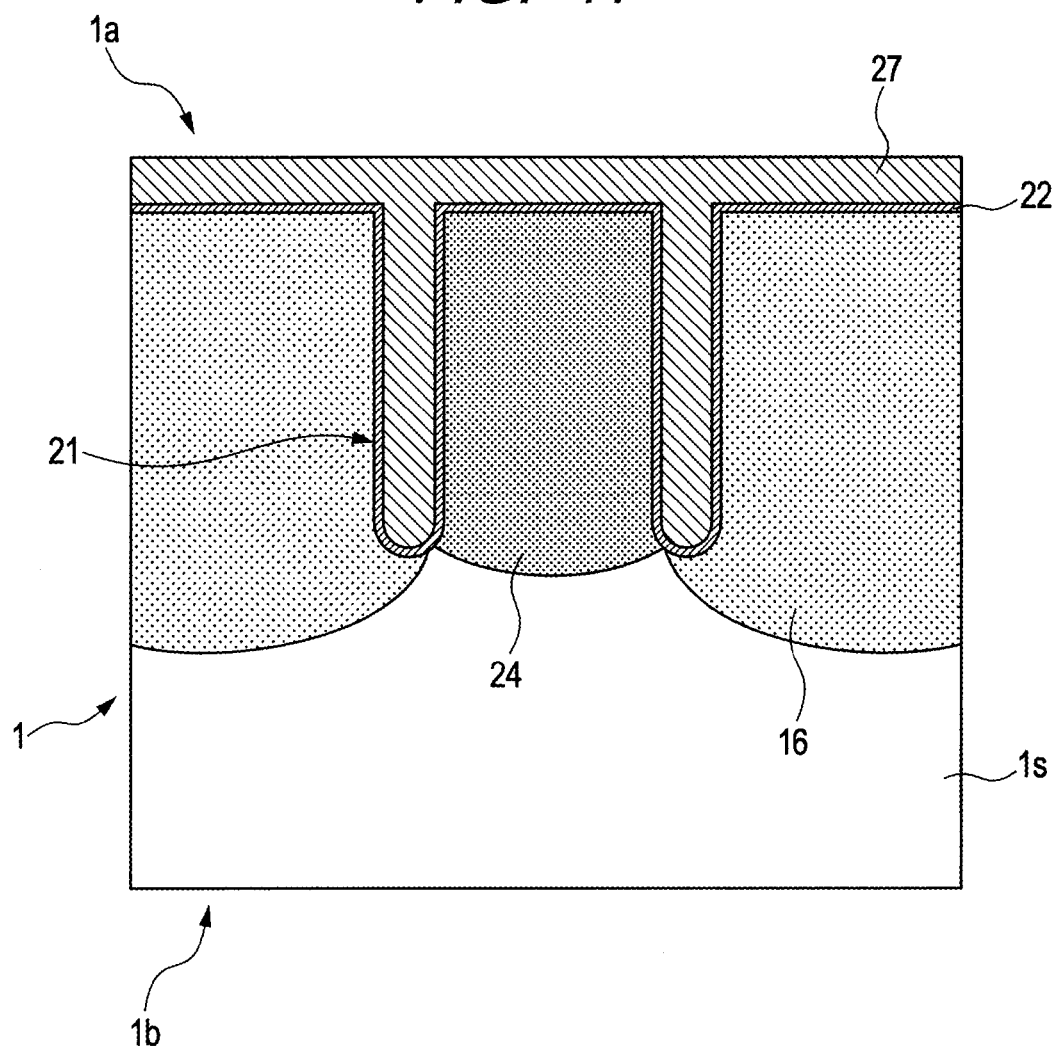
FIG. 17 is a cross-sectional view of the device in another step (gate polysilicon deposition step) corresponding to FIG. 8 for explaining the manufacturing method of the device structure of the one embodiment of the invention in the present application.
Figure 18:
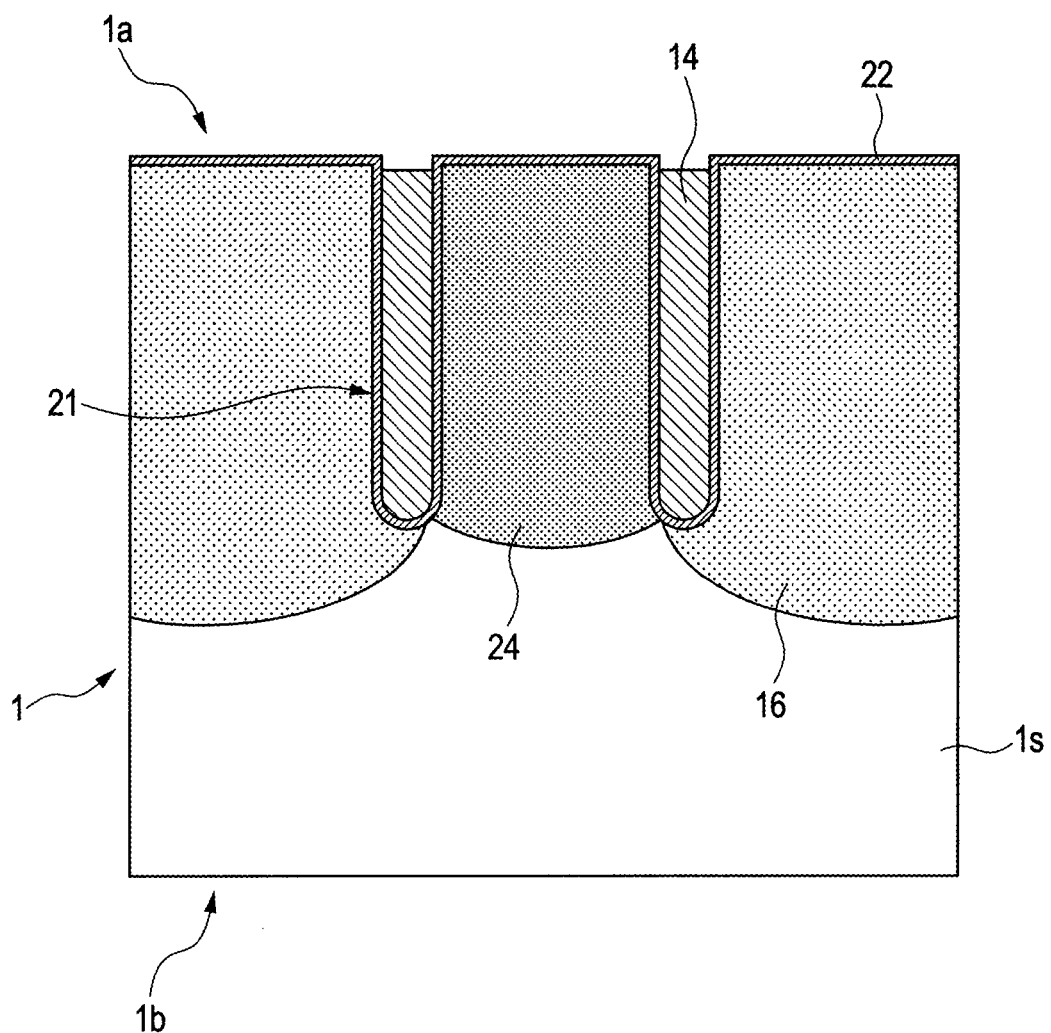
FIG. 18 is a cross-sectional view of the device in another step (gate polysilicon etching back step) corresponding to FIG. 8 for explaining the manufacturing method of the device structure of the one embodiment of the invention in the present application.
Figure 19:
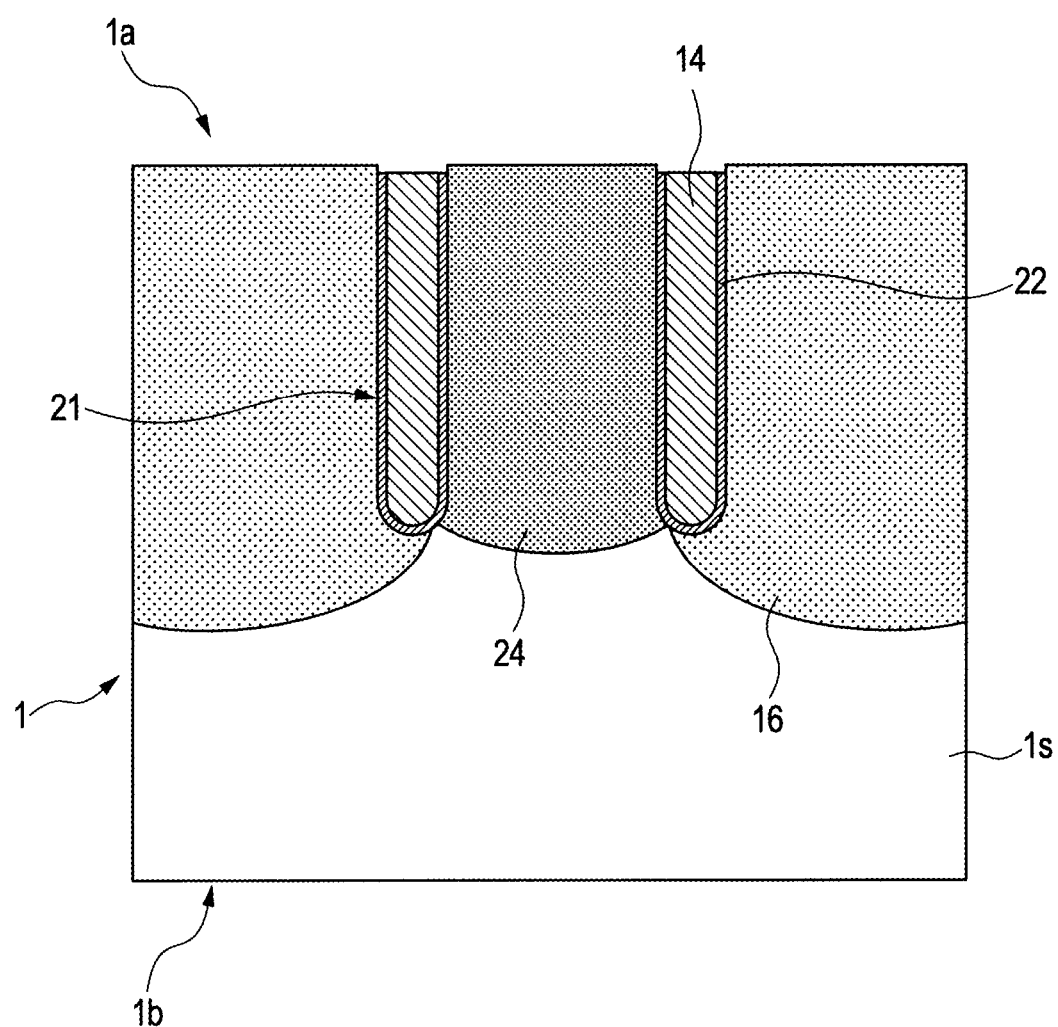
FIG. 19 is a cross-sectional view of the device in another step (gate oxide film etching back step) corresponding to FIG. 8 for explaining the manufacturing method of the device structure of the one embodiment of the invention in the present application.
Figure 20:
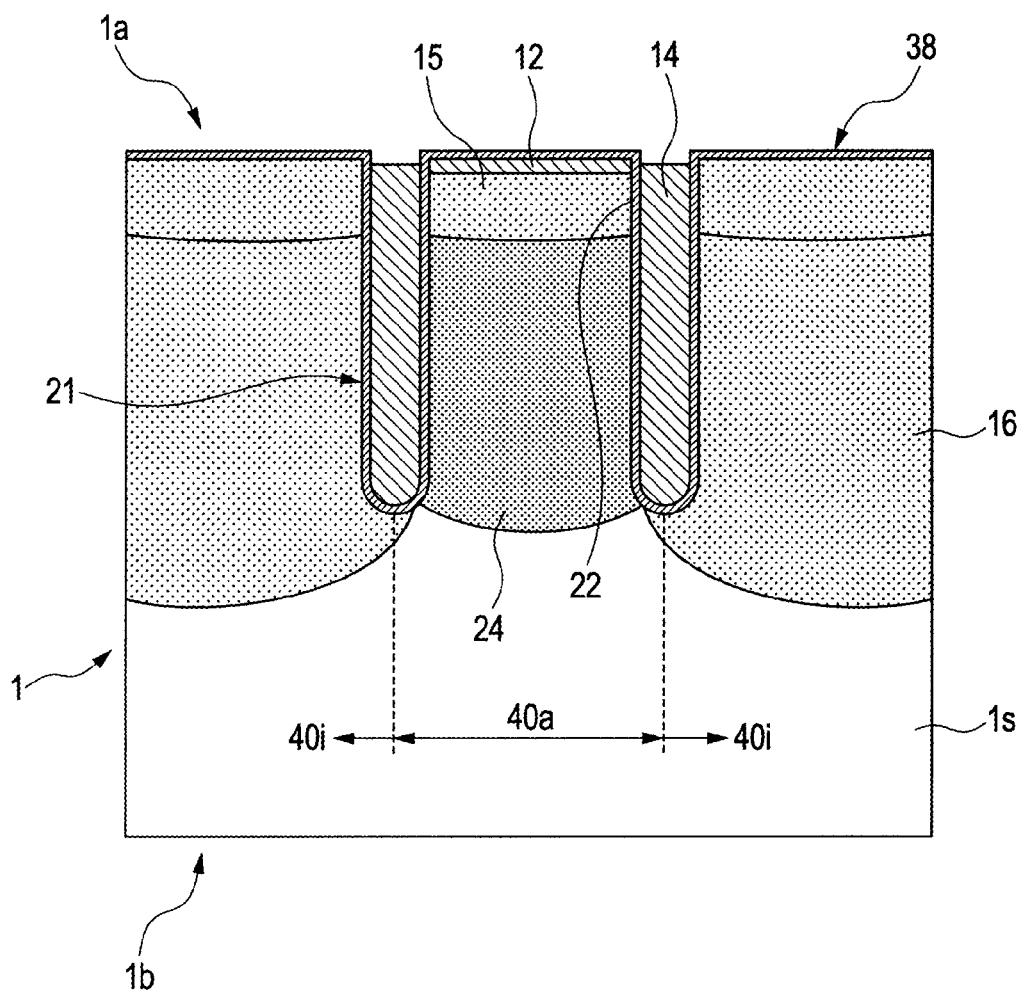
FIG. 20 is a cross-sectional view of the device in another step (P-type body region and $N^+$-type emitter region introduction step) corresponding to FIG. 8 for explaining the manufacturing method of the device structure of the one embodiment of the invention in the present application.
Figure 21:
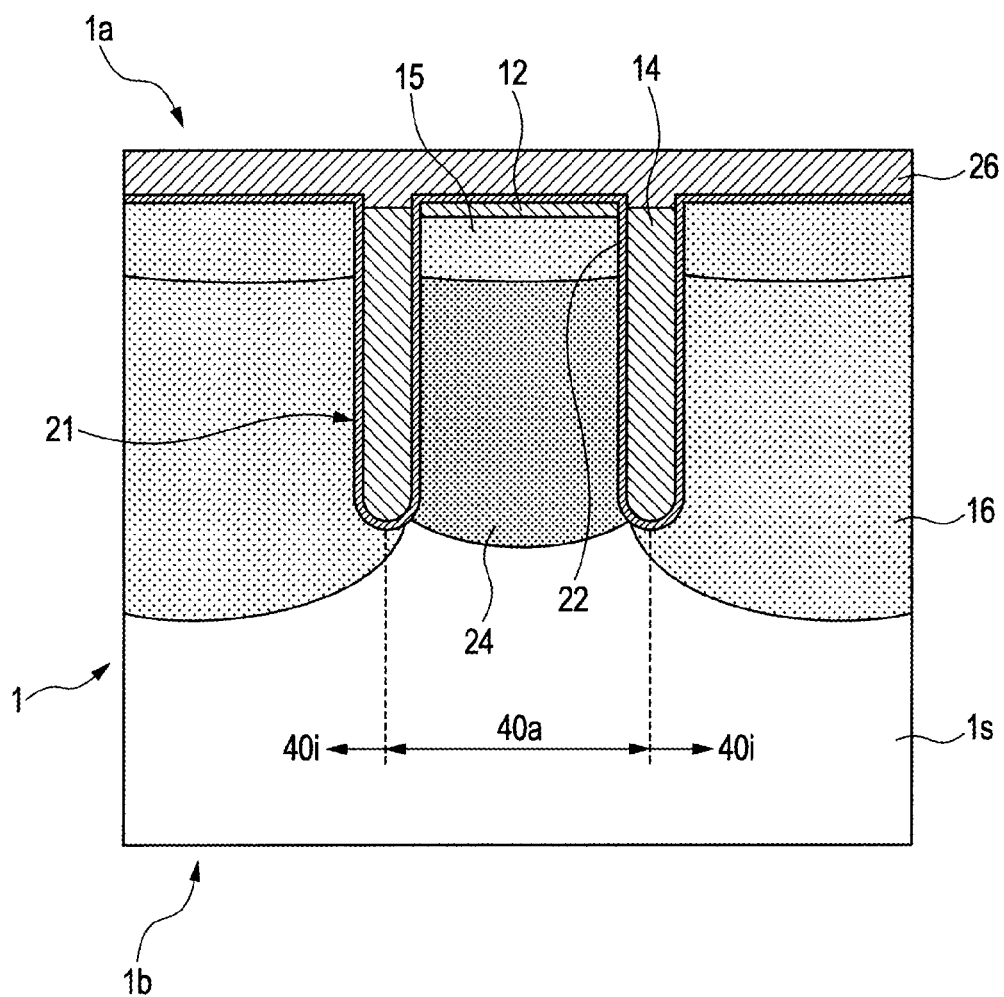
FIG. 21 is a cross-sectional view of the device in another step (interlayer insulating film deposition step) corresponding to FIG. 8 for explaining the manufacturing method of the device structure of the one embodiment of the invention in the present application.
Figure 22:
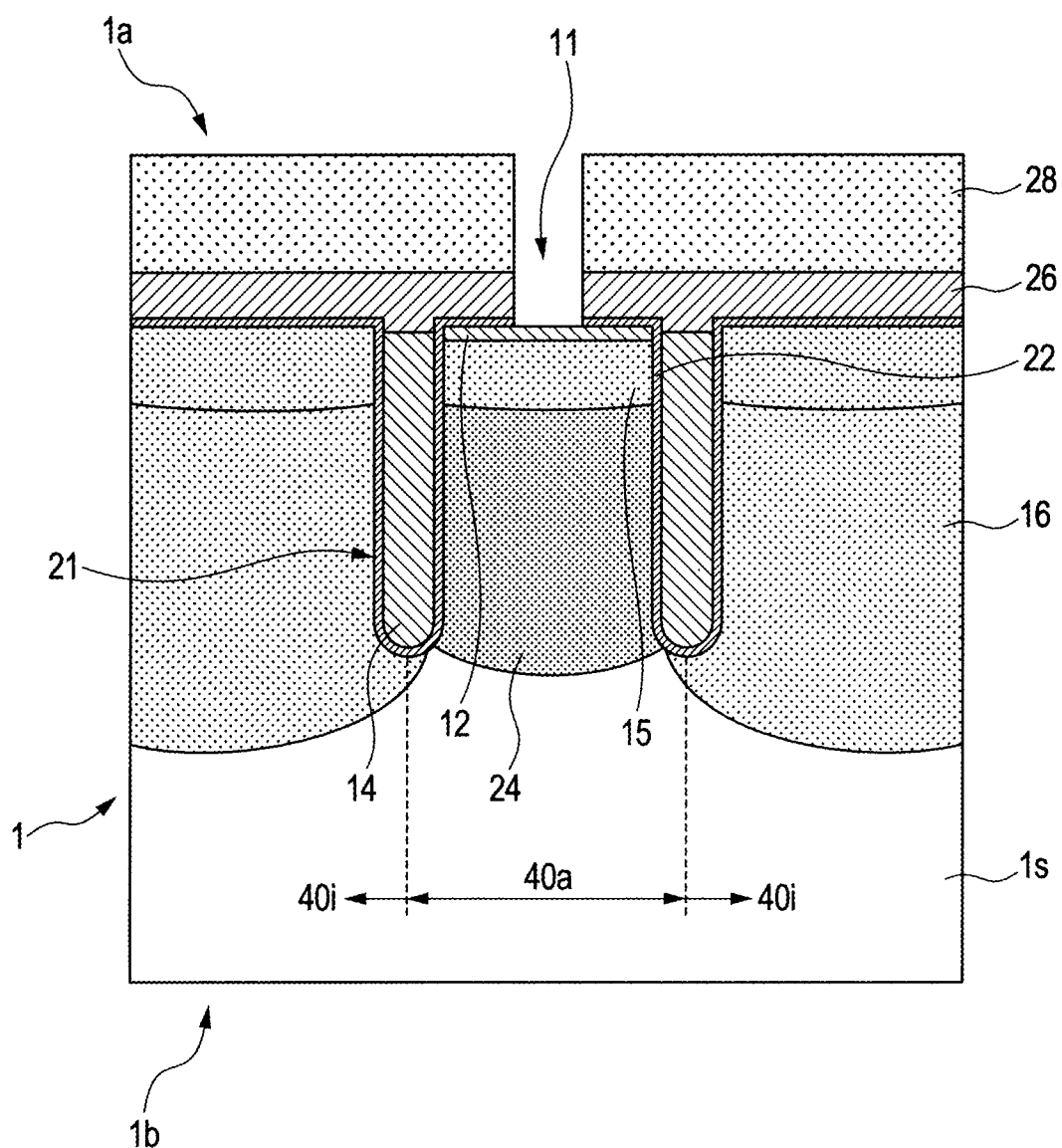
FIG. 22 is a cross-sectional view of the device in another step (contact hole formation step) corresponding to FIG. 8 for explaining the manufacturing method of the device structure of the one embodiment of the invention in the present application.
Figure 23:
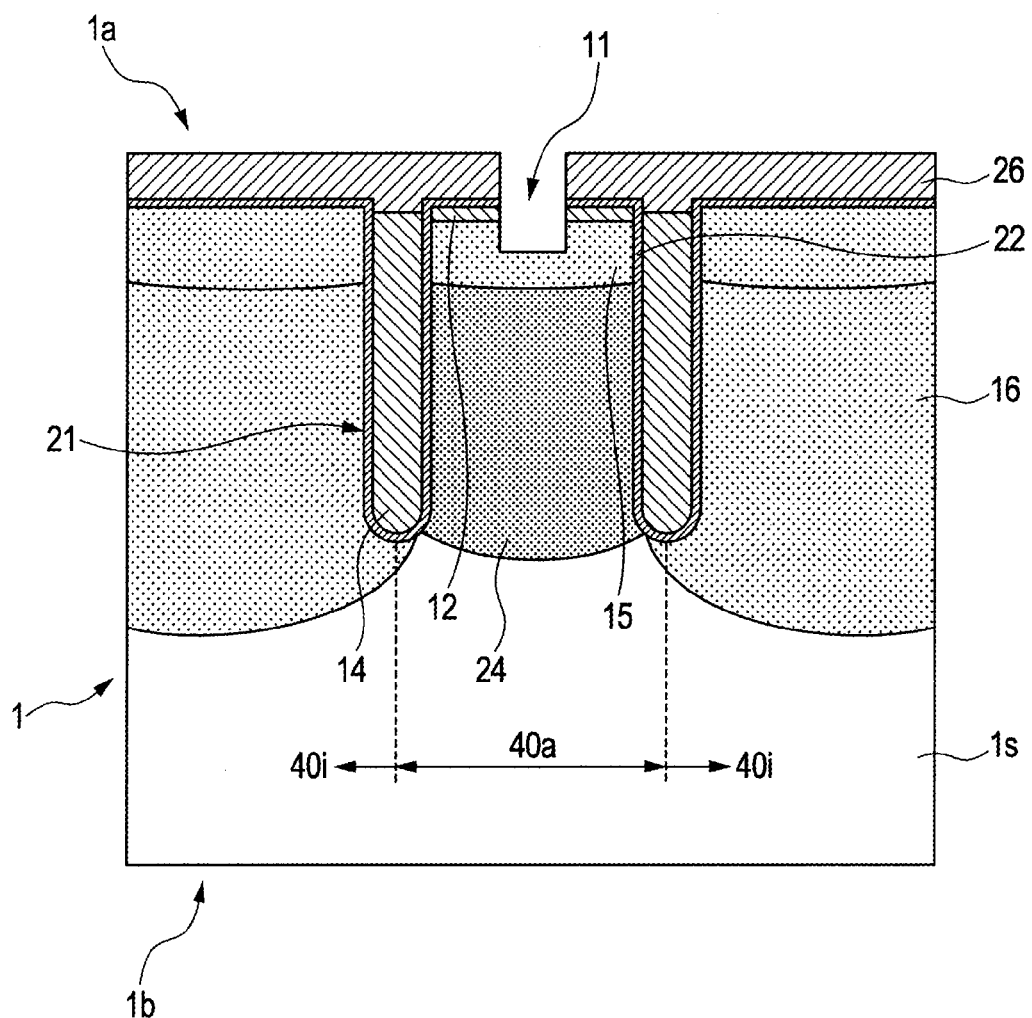
FIG. 23 is a cross-sectional view of the device in another step (substrate etching step) corresponding to FIG. 8 for explaining the manufacturing method of the device structure of the one embodiment of the invention in the present application.
Figure 24:
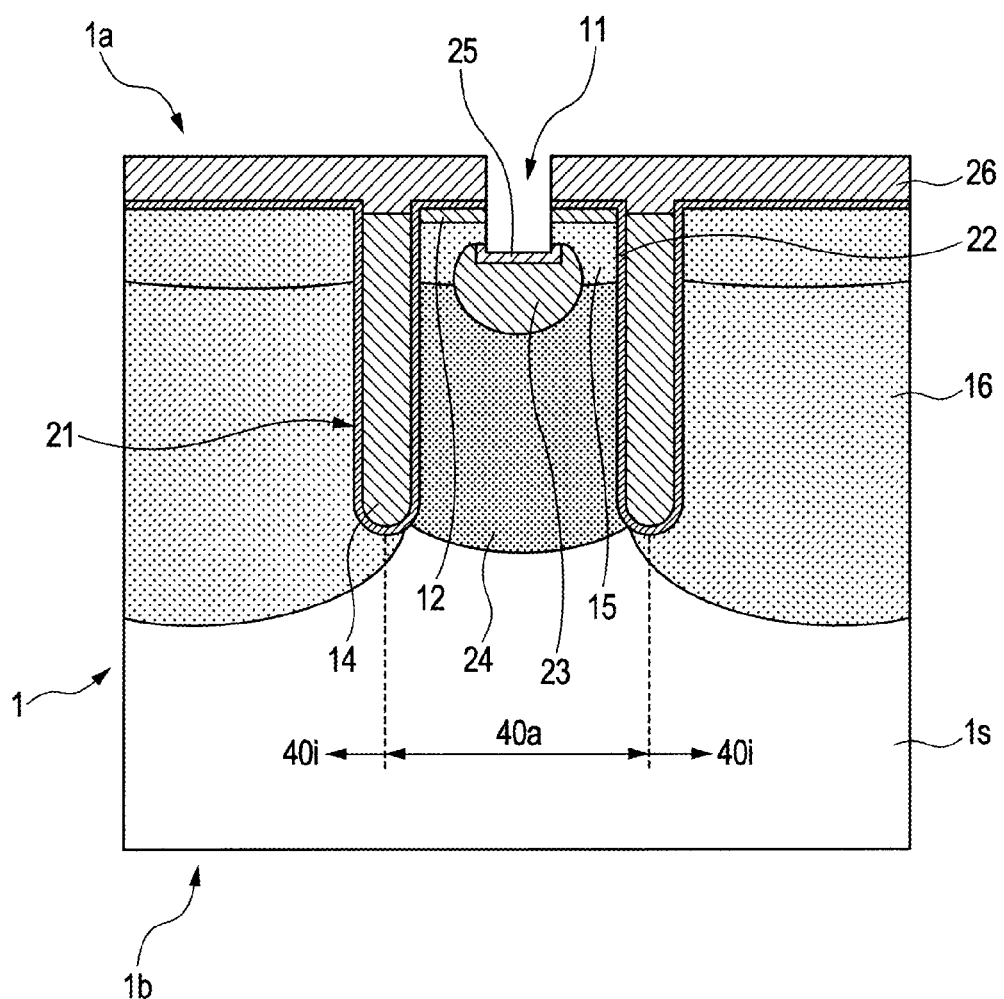
FIG. 24 is a cross-sectional view of the device in another step ($P^+$-type body contact region and $P^+$-type latch-up preventing region introduction step) corresponding to FIG. 8 for explaining the manufacturing method of the device structure of the one embodiment of the invention in the present application.
Figure 25:
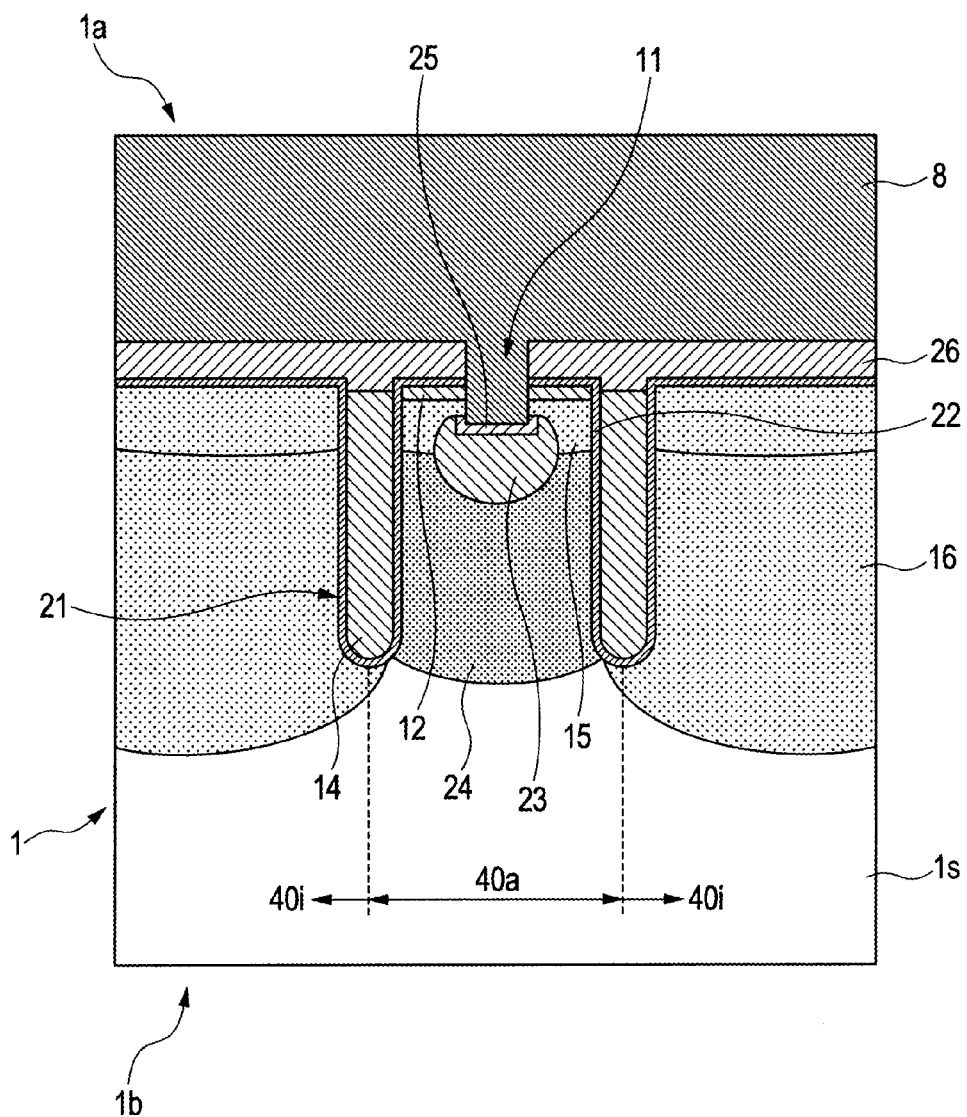
FIG. 25 is a cross-sectional view of the device in another step (surface metal deposition step) corresponding to FIG. 8 for explaining the manufacturing method of the device structure of the one embodiment of the invention in the present application.

FIG. 9 shows a cross-sectional view of the device in a manufacturing step (hole barrier region introduction step) corresponding to FIG. 8 for explaining a manufacturing method of the device structure of the one embodiment of the invention in the present application. FIG. 10 shows a cross-sectional view of the device in another manufacturing step (p-type floating region introduction step) corresponding to FIG. 8 for explaining the manufacturing method of the device structure of the one embodiment of the invention in the present application. FIG. 11 shows a cross-sectional view of the device in another manufacturing step (hard mask deposition step for trench processing) corresponding to FIG. 8 for explaining the manufacturing method of the device structure of the one embodiment of the invention in the present application. FIG. 12 shows a cross-sectional view of the device in another step (trench hard mask processing step) corresponding to FIG. 8 for explaining the manufacturing method of the device structure of the one embodiment of the invention in the present application. FIG. 13 shows a cross-sectional view of the device in another step (resist removal step for trench hard mask processing) corresponding to FIG. 8 for explaining the manufacturing method of the device structure of the one embodiment of the invention in the present application. FIG. 14 shows a cross-sectional view of the device in another step (trench processing step) corresponding to FIG. 8 for explaining the manufacturing method of the device structure of the one embodiment of the invention in the present application. FIG. 15 shows a cross-sectional view of the device in another step (hard mask removal step for trench processing) corresponding to FIG. 8 for explaining the manufacturing method of the device structure of the one embodiment of the invention in the present application. FIG. 16 shows a cross-sectional view of the device in another step (extending diffusion and gate oxidation step) corresponding to FIG. 8 for explaining the manufacturing method of the device structure of the one embodiment of the invention in the present application. FIG. 17 shows a cross-sectional view of the device in another step (gate polysilicon deposition step) corresponding to FIG. 8 for explaining the manufacturing method of the device structure of the one embodiment of the invention in the present application. FIG. 18 shows a cross-sectional view of the device in another step (gate polysilicon etching back step) corresponding to FIG. 8 for explaining the manufacturing method of the device structure of the one embodiment of the invention in the present application. FIG. 19 shows a cross-sectional view of the device in another step (gate oxidation film etching back step) corresponding to FIG. 8 for explaining the manufacturing method of the device structure of the one embodiment of the invention in the present application. FIG. 20 shows a cross-sectional view of the device in another step (P-type body region and N⁺-type emitter region introduction step) corresponding to FIG. 8 for explaining the manufacturing method of the device structure of the one embodiment of the invention in the present application. FIG. 21 shows a cross-sectional view of the device in another step (interlayer insulating film deposition step) corresponding to FIG. 8 for explaining the manufacturing method of the device structure of the one embodiment of the invention in the present application. FIG. 22 shows a cross-sectional view of the device in another step (contact hole formation step) corresponding to FIG. 8 for explaining the manufacturing method of the device structure of the one embodiment of the invention in the present application. FIG. 23 shows a cross-sectional view of the device in another step (substrate etching step) corresponding to FIG. 8 for explaining the manufacturing method of the device structure of the one embodiment of the invention in the present application. FIG. 24 shows a cross-sectional view of the device in another step (P⁺-type body contact region and P⁺-type latch-up preventing region introduction step) corresponding to FIG. 8 for explaining the manufacturing method of the device structure of the one embodiment of the invention in the present application. FIG. 25 shows a cross-sectional view of the device in another step (surface metal deposition step) corresponding to FIG. 8 for explaining the manufacturing method of the device structure of the one embodiment of the invention in the present application. Based on these drawings, the device surface formation process or the like regarding the IGBY of the one embodiment in the present application will be described below.

First, a wafer of 200 mmφ (note that other wafers of 150 mmφ, 100 mmφ, 300 mmφ, 450 mmφ or the like may be used) comprised of the N⁻-type silicon single crystal (for example, having a concentration of phosphorus of about $2 \times 10^{14}/cm^3$ and a resistivity of 22 to 30 Ωcm) is prepared. The wafer produced by a floating zone (FZ) method is most preferable, but a wafer produced by Czochralski (CZ) method may be used.

Then, as shown in FIG. 9, a resist film 31 for introduction of an N-type hole barrier region is formed substantially over the entire surface of the surface 1a (first main surface) of the semiconductor wafer 1 by application or the like. The wafer is patterned by the normal lithography. Then, N-type impurities are introduced by the ion implantation into the semiconductor substrate 1s on the front surface 1a (first main surface) side of the semiconductor wafer 1 (N-type single crystal silicon substrate), using the resist film 31 for introduction of the patterned N-type hole barrier region as a mask. Thus, the N-type hole barrier region 24 is formed. Preferable conditions for the ion implantation at this time can be, by way of example, Ion Species: phosphorus, Dose Amount: about $6 \times 10^{12}/cm^2$, Implantation Energy: about 80 KeV. Then, an unnecessary part of the resist film 31 is removed by ashing or the like.

Then, as shown in FIG. 10, a resist film 37 for introduction of the P-type floating region is formed substantially over the entire surface of the front surface 1a of the semiconductor wafer 1 by application or the like, and then is patterned by the normal photolithography. Using the patterned resist film 37 for introduction of the P-type floating region as a mask, P-type impurities are introduced into the semiconductor substrate 1s on the front surface 1a (first main surface) side of the semiconductor wafer 1, for example, by ion implantation to thereby form the P-type floating region 16. Preferable conditions for the ion implantation at this time can be, by way of example, Ion Species: boron, Dose Amount: about $3.5 \times 10^{13}/cm^2$, Implantation Energy: about 75 KeV. Then, an unnecessary part of the resist film 37 is removed by ashing or the like. Upon introducing the P-type floating region 16, the cell peripheral coupling region 35 and the floating field ring 36 shown in FIG. 2 are simultaneously introduced.

Then, as shown in FIG. 11, a hard mask film 32 for formation of a trench (for example, of about 450 nm in thickness), such as a silicon oxide insulating film, is deposited substantially over the entire front surface 1a of the semiconductor wafer 1, for example, by a chemical vapor deposition (CVD) or the like.

Then, as shown in FIG. 12, a resist film 33 for processing a trench hard mask film is formed by application and the like substantially over the entire front surface 1a of the semiconductor wafer 1, and then patterned by the normal lithography. The hard mask film 32 for formation of the trench is patterned, for example, by dry etching, using the patterned resist film 33 for processing the trench hard mask film as a mask.

Thereafter, as shown in FIG. 13, the unnecessary resist film 33 is removed by ashing or the like.

Then, as shown in FIG. 14, trenches 21 are formed, for example, by anisotropic dry etching, using the patterned hard mask film 32 for formation of the trench. Gas for the anisotropic dry etching can be, preferably, for example, $Cl_2/O_2$-based gas.

Thereafter, as shown in FIG. 15, the unnecessary hard mask film 32 for formation of the trench is removed by wet etching, for example, using an etchant for a hydrofluoric acid-based silicon oxide film.

Then, as shown in FIG. 16, the P-type floating region 16 and the N-type hole barrier region 24 are extended and diffused (for example, at a temperature of 1200° C. for about 30 minutes). Subsequently, for example, a gate insulating film 22 (for example, of about 120 nm in thickness) is formed substantially over the front surface 1a of the semiconductor wafer 1 and over the entire inner surface of the trench 21, for example, by thermal oxidization or the like.

Then, as shown in FIG. 17, a doped poly-silicon film 27 (for example, of about 600 nm in thickness) doped with phosphorus is deposited substantially over the front surface 1a of the semiconductor wafer 1 above the gate insulating film 22, and over the entire inner surface of the trench 21, for example, by a CVD or the like so as to fill the trench 21.

Then, as shown in FIG. 18, the poly-silicon film 27 is etched back, for example, by dry etching or the like (for example, using $SF_6$ or the like as a gas) to thereby form the trench gate electrode 14 in each trench 21.

Then, as shown in FIG. 19, the gate insulating film 22 outside the trench 21 is removed, for example, by wet etching using the etchant for the hydrofluoric acid-based silicon oxide film.

Thereafter, as shown in FIG. 20, a relatively thin silicon oxide film for ion implantation to be performed later (for example, having the same thickness as the gate insulating film) is formed substantially over the entire front surface 1a of the semiconductor wafer 1, for example, by the thermal oxidization or CVD. Subsequently, a resist film for introduction of the P-type body region is formed over the front surface 1a of the semiconductor wafer 1 by the normal lithography. The P-type body region 15 is formed by introducing P-type impurities into the substantially entire surface of the cell region 10 and other necessary parts, for example, by ion implantation, using the resist film for introduction of the P-type body region as a mask. Preferable conditions for the ion implantation at this time can be, by way of example, Ion Species: boron, Dose Amount: about $3 \times 10^{13}/cm^2$, Implantation Energy: about 75 KeV. Then, an unnecessary part of the resist film for introduction of the P-type body region is removed by ashing or the like.

Further, a resist film for introduction of an N⁺-type emitter region is formed over the front surface 1a of the semiconductor wafer 1 by the normal lithography. The N⁺-type emitter region 12 is formed substantially over the entire top surface of the P-type body region 15 in the linear active cell region 40a, for example, by introducing N-type impurities by ion implantation, using the resist film for introduction of the N⁺-type emitter region as a mask. Preferable conditions for the ion implantation at this time can be, by way of example, Ion Species: arsenic, Dose Amount: about $5 \times 10^{15}/cm^2$, Implantation Energy: about 80 KeV. Then, an unnecessary part of the resist film for introduction of the N⁺-type emitter region is removed by ashing or the like.

Then, as shown in FIG. 21, for example, a phosphsilicate glass (PSG) film (for example, of about 600 nm in thickness) is deposited substantially over the entire front surface 1a of the semiconductor wafer 1 as the interlayer insulating film 26, for example, by the CVD or the like. The suitable interlayer insulating film 26 can be, by way of example, a PSG film, a borophosphsilicate glass (BPSG) film, a non-doped silicate glass (NSF) film, a spin-on-glass (SOG) film, or a composite film thereof.

Then, as shown in FIG. 22, a resist film 28 for formation of the contact trench is formed on the interlayer insulating film 26 over the front surface 1a of the semiconductor wafer 1 by the normal lithography. Subsequently, for example, the contact trench 11 (or contact hole) is formed by the anisotropic dry etching or the like (using a gas, such as $Ar/CHF_3/CF_4$, or the like).

Thereafter, as shown in FIG. 23, the unnecessary resist film 28 is removed by ashing or the like. Subsequently, the contact trench 11 (or contact hole) is extended inside the semiconductor substrate, for example, by the anisotropic dry etching. Suitable gas at this time can be, for example, $Cl_2/O_2$-based gas.

Then, as shown in FIG. 24, for example, a $P^+$-type body contact region 25 is formed, for example, through the contact trench 11 by ion-implanting P-type impurities. Preferable conditions for the ion implantation at this time can be, by way of example, Ion Species: $BF_2$, Dose Amount: about $5 \times 10^{15}/cm^2$, Implantation Energy: about 80 KeV.

Likewise, for example, the $P^+$-type latch-up preventing region 23 is formed through the contact trench 11 by ion-implanting P-type impurities. Preferable conditions for the ion implantation at this time can be, by way of example, Ion Species: boron, Dose Amount: about $5 \times 10^{15}/cm^2$, Implantation Energy: about 80 KeV.

Then, as shown in FIG. 25, for example, an aluminum electrode film (metal emitter electrode 8) is formed by sputtering or the like. Specifically, for example, the following procedure will be performed. First, for example, a TiW film is formed, for example, by sputtering, as a barrier metal film substantially over the entire front surface 1a of the semiconductor wafer 1 (in a thickness of about 200 nm) (note that most of titanium elements in the TiW film moves at the silicon interface by the following heat treatment to thereby form a silicide, thus contributing to the improvement of the contact characteristics, but this is very complicated and cannot be shown in the figure).

Subsequently, for example, silicide annealing is performed, for example, at a temperature of around 600° C. for about 10 minutes under a nitrogen atmosphere. Then, an aluminum-based metal film (for example, of 5 µm in thickness) is formed of aluminum as a principal component (for example, several % of silicon additive, the balance being aluminum), substantially over the entire surface of the barrier metal film by sputtering deposition or the like, so as to fill the contact trench 11. Subsequently, the metal emitter electrode 8 comprised of the aluminum metal film and the barrier metal film is patterned by the normal lithography (using gas for dry etching, such as $Cl_2/BCl_3$ or the like). Further, as a final passivation film, for example, an organic film containing polyimide as a principal component (for example, of 2.5 µm in thickness) or the like is applied to substantially the entire device surface 1a of the wafer 1, and then an emitter pad 9 and the gate pad 6 as shown in FIG. 6 are opened by the normal lithography.

Thus, the device surface formation process is completed and then another process for the backside or the like is proceeded.

5. Description of Device Backside Formation Process in IGBY of One Embodiment in Present Application (See Mainly FIGS. 26 to 30)

This section will describe the device backside formation process regarding the IGBT of the one embodiment in the present application, following the section 4.

Figure 26:
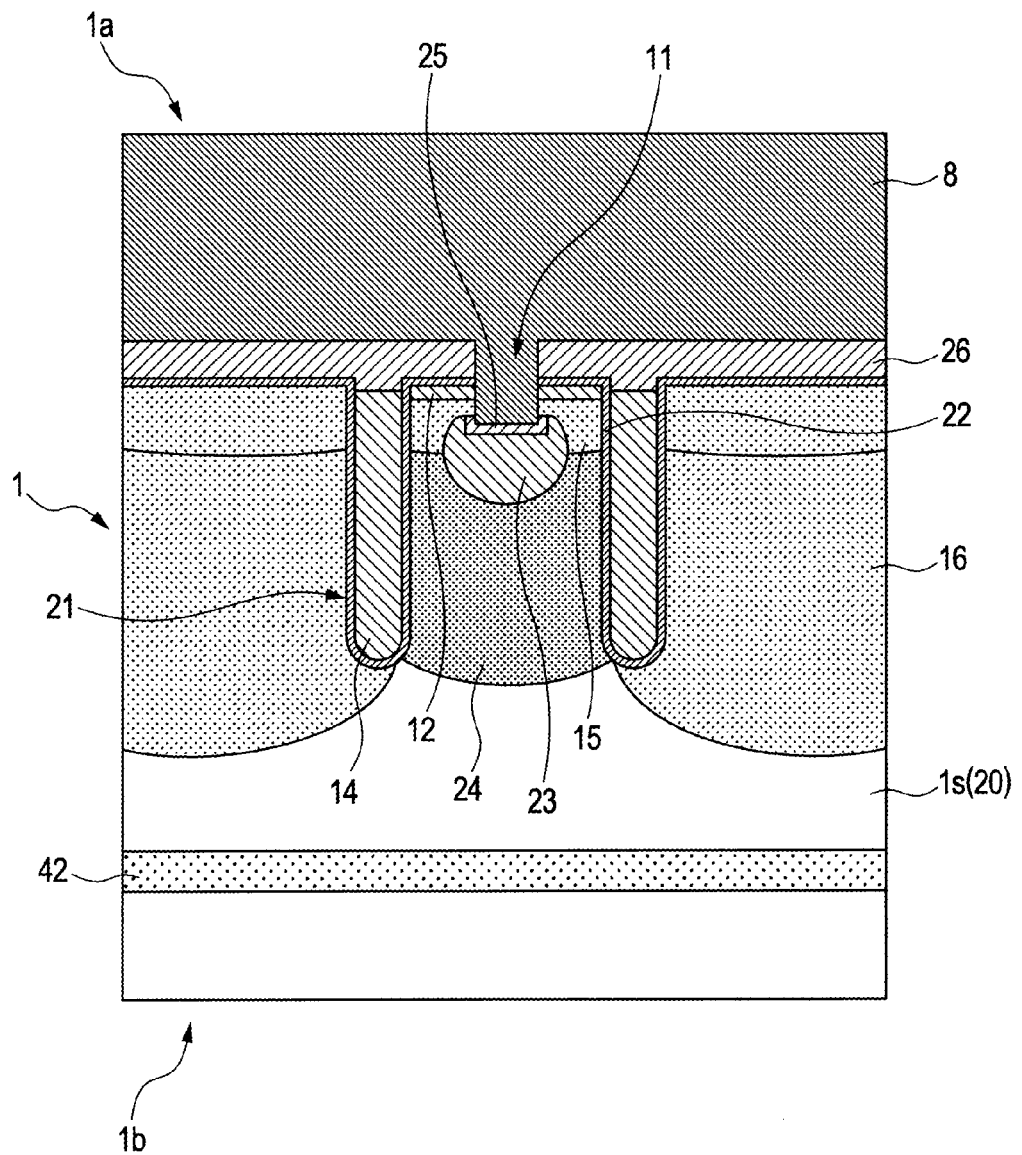
FIG. 26 is a cross-sectional view of the device in another step (N-type field stopping region introduction step) corresponding to FIG. 8 for explaining the manufacturing method of the device structure of the one embodiment of the invention in the present application.
Figure 27:
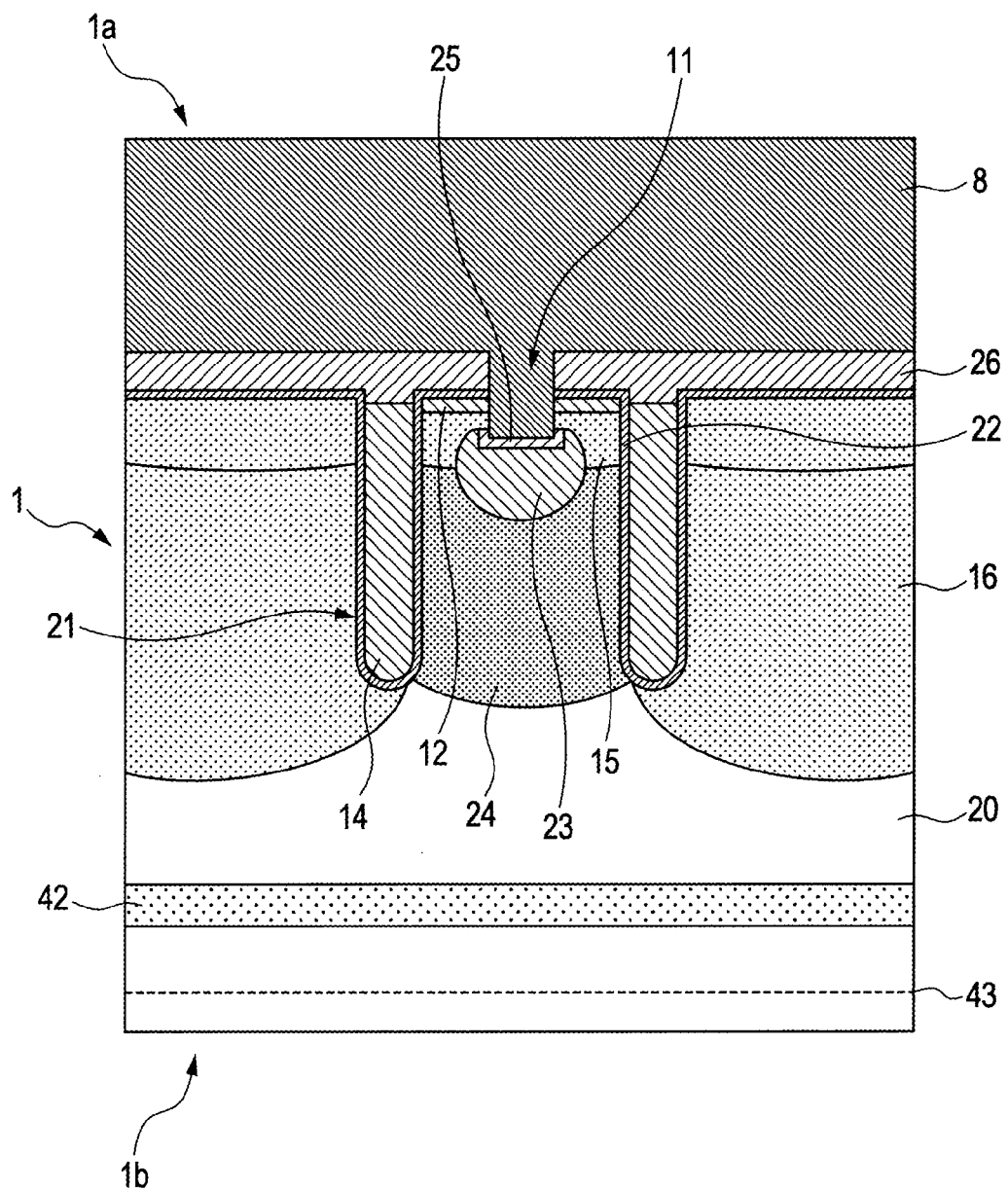
FIG. 27 is a cross-sectional view of the device in another step (back grind step) corresponding to FIG. 8 for explaining the manufacturing method of the device structure of the one embodiment of the invention in the present application.
Figure 28:
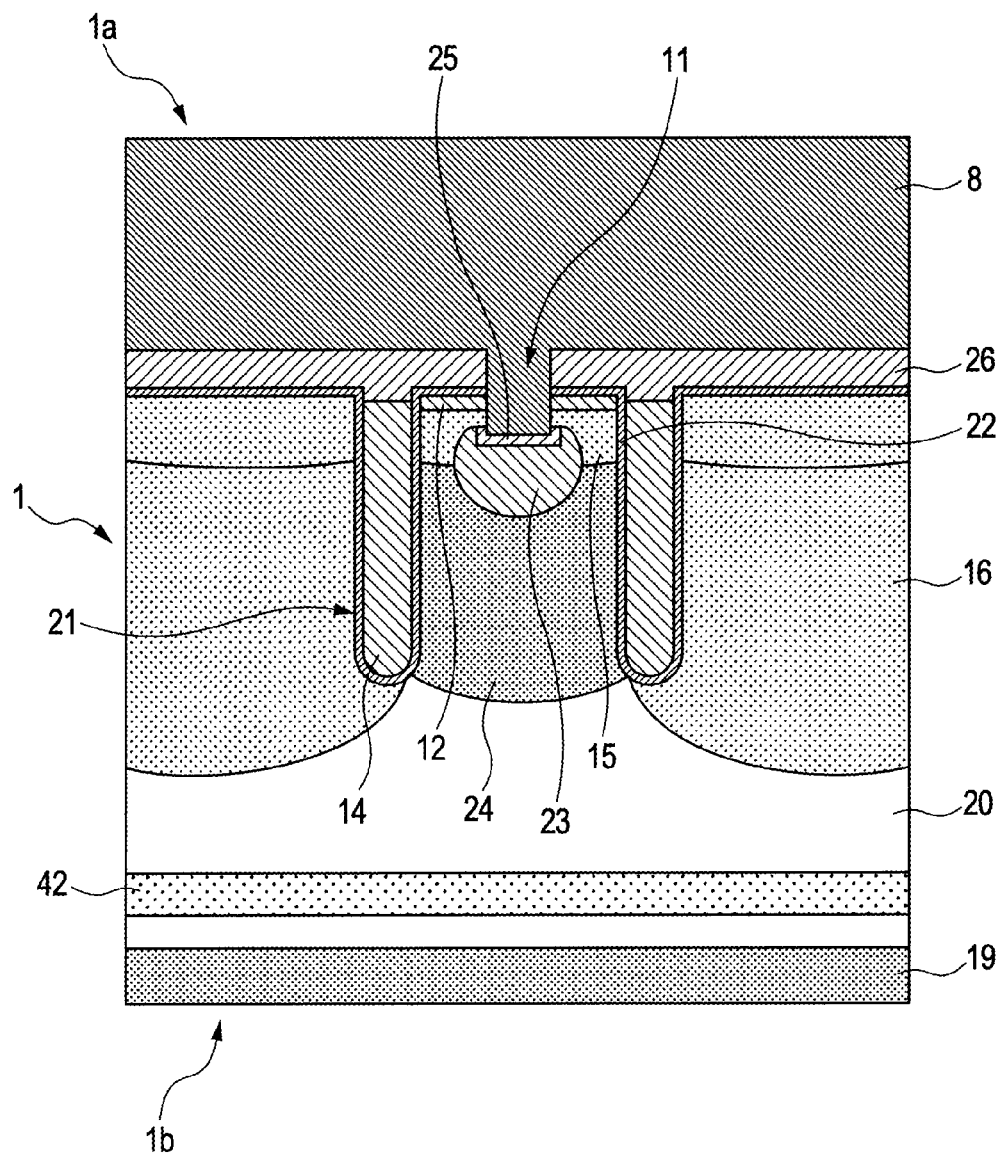
FIG. 28 is a cross-sectional view of the device in another step (N-type buffer region introduction step) corresponding to FIG. 8 for explaining the manufacturing method of the device structure of the one embodiment of the invention in the present application.
Figure 29:
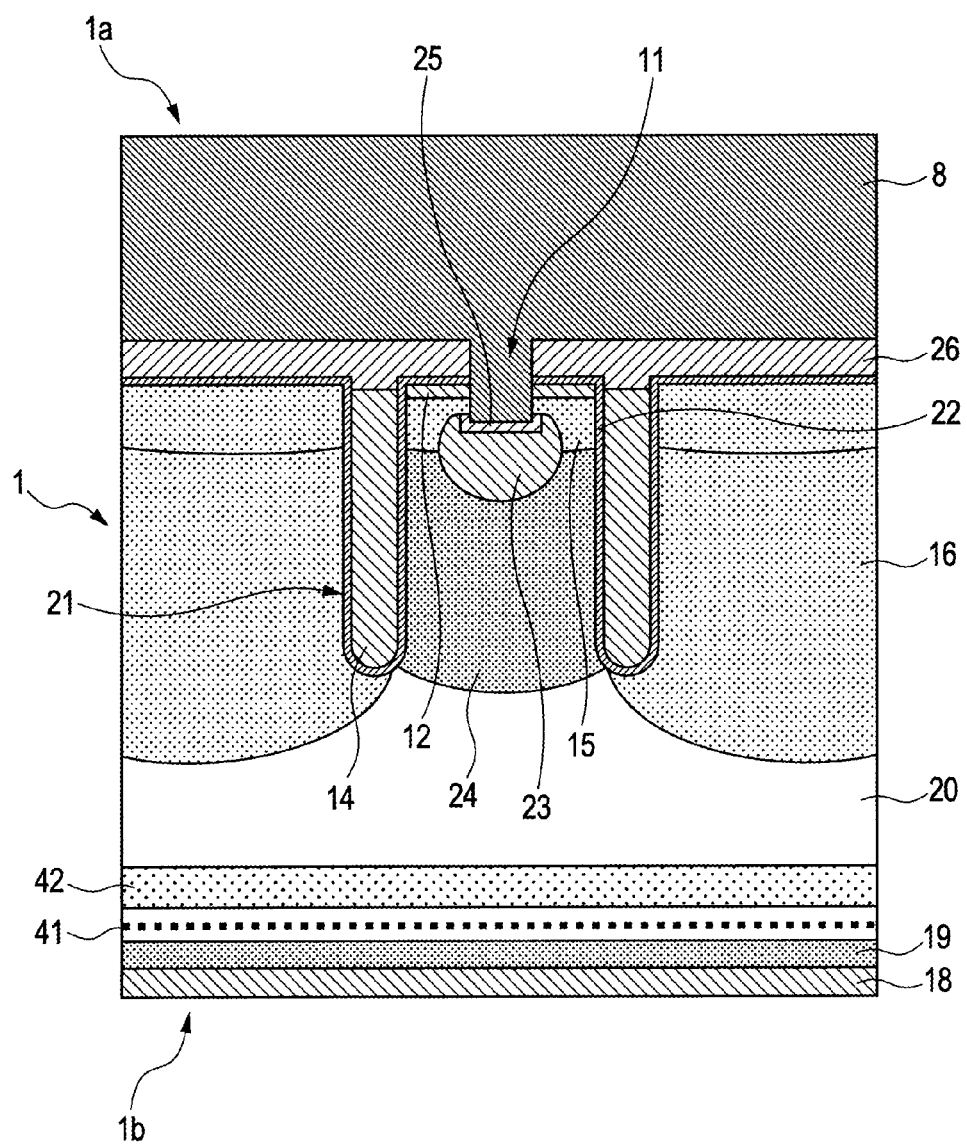
FIG. 29 is a cross-sectional view of the device in another step ($P^+$-type collector region introduction step) corresponding to FIG. 8 for explaining the manufacturing method of the device structure of the one embodiment of the invention in the present application.
Figure 30:
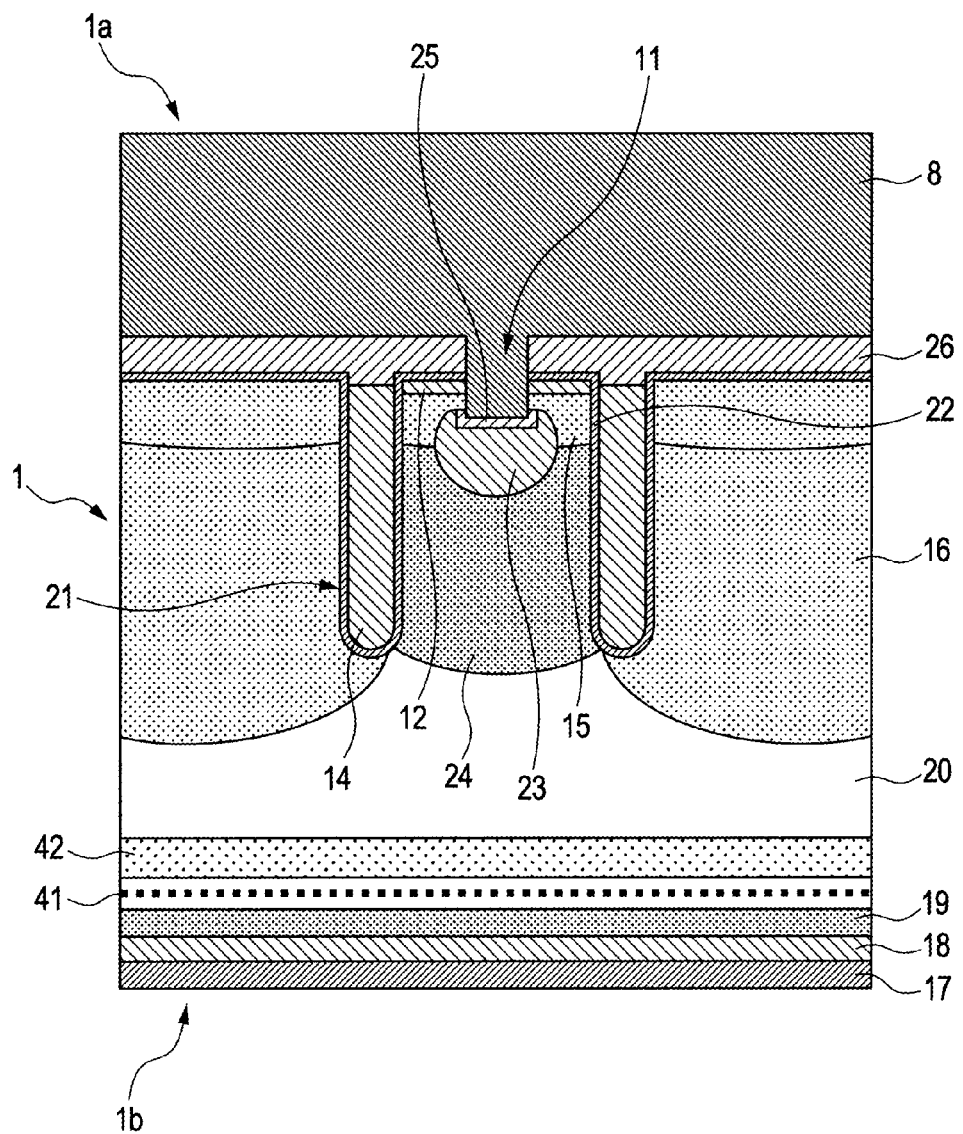
FIG. 30 is a cross-sectional view of the device in another step (metal collector electrode formation step) corresponding to FIG. 8 for explaining the manufacturing method of the device structure of the one embodiment of the invention in the present application.

FIG. 26 shows a cross-sectional view of the device in another step (N-type field stopping region introduction process) corresponding to FIG. 8 for explaining the manufacturing method of the device structure of the one embodiment of the invention in the present application. FIG. 27 shows a cross-sectional view of the device in another step (back grind step) corresponding to FIG. 8 for explaining the manufacturing method of the device structure of the one embodiment of the invention in the present application. FIG. 28 shows a cross-sectional view of the device in another step (N-type buffer region introduction step) corresponding to FIG. 8 for explaining the manufacturing method of the device structure of the one embodiment of the invention in the present application. FIG. 29 shows a cross-sectional view of the device in another step ($P^+$-type collector region introduction step) corresponding to FIG. 8 for explaining the manufacturing method of the device structure of the one embodiment of the invention in the present application. FIG. 30 shows a cross-sectional view of the device in another step (metal collector electrode formation step) corresponding to FIG. 8 for explaining the manufacturing method of the device structure of the one embodiment of the invention in the present application. Based on the drawings, the device backside formation process of the IBGT of the one embodiment in the present application will be described below.

As shown in FIG. 26, for example, the N-type field stopping region 42 of about 10 µm in thickness is introduced into the entire $N^-$-type drift region 20 located in the position apart from the substrate surface by about 50 µm by implanting protons (hydrogen ions) from the front surface 1a side of the wafer 1. Application conditions can be, by way of example, Ion Species (implanted particles): protons (hydrogen ions), Implantation Method: vertical implantation, Implantation Energy: about 4.3 MeV, Dose Amount for each time: $1 \times 10^{13}/cm^2$, and Number of Implantation: about twice). For example, an industrial cyclotron or the like can be used as the implanting device. The implanted particles may be made of not only hydrogen ions, but also helium ions or the like.

Subsequently, the activation annealing of protons is performed, for example, at a temperature of about 400 to 500° C.

Then, as shown in FIG. 27, the backside 1b of the wafer 1 is subjected to a back grinding process (if necessary, chemical etching or the like for removing the damages on the backside), which thins the area up to a back-grinding position 43 by machining or the like as indicated by a dashed line in the figure. The last thickness of the wafer 1 is decreased up to, for example, about 30 to 200 µm, if necessary, from the original thickness of the wafer of about 800 µm (preferably, in a range of 450 to 1000 µm). For example, for the withstand voltage of about 600 volts, the last thickness is about 70 µm (note that the lower limit of the thickness is defined by the required withstand voltage).

Then, as shown in FIG. 28, the n-type buffer region 19 is introduced over the surface region of the backside 1b of the wafer 1 by performing ion-implantation on the entire surface from the backside 1b of the thinned wafer 1 ($N^-$-type drift region 20 before the introduction). Preferable conditions for the ion implantation at this time can be, by way of example, Ion Species: phosphorus, Implantation Method: vertical implantation, Implantation Energy: about 350 KeV, Dose Amount for each time: about $7 \times 10^{12}/cm^2$, and Number of Implantation Processes: one time.

Then, as shown in FIG. 29, for example, the ion implantation is performed on the entire front surface region of the backside 1b of the wafer 1 ($N^-$-type drift region 20 before introduction of the N-type buffer region 19) from the backside 1b of the wafer to thereby introduce the $P^+$-type collector region 18. Preferable conditions for the ion implantation at this time can be, by way of example, Ion Species: boron, Implantation Method: vertical implantation, Implantation Energy: about 40 KeV, Dose Amount for each time: about $3 \times 10^{13}/cm^2$, and Number of Implantation Processes: one time.

Subsequently, the activation annealing (activation ratio is, for example, about 40%, preferably, in a range of about 30 to 64%) is performed on the P$^+$-type collection region 18 over the substantially entire backside 1b of the wafer 1. Preferable annealing conditions (laser application conditions) can be, by way of example, Annealing Method: irradiation of backside 1b of the wafer 1 with a laser light, Wavelength of Laser: 527 nm, Pulse Width: about 100 ns, Energy Density: about 1.8 J/cm$^2$, Application System: two-pulse system, Delay Time between Both Pulses: about 500 ns, and Pulse Overlap Rate: about 50%.

Thus, Crystal defects generated by the ion implantation on the backside are left along the N-type buffer region 19 from the vicinity of a boundary (boundary between the N-type buffer region 19 and the N$^-$-type drift region 20) to a part near the above boundary of the N$^-$-type drift region 20 between the N-type field stopping region 42 and the N-type buffer region 19, which forms the crystal defect region 41.

Figure 33:
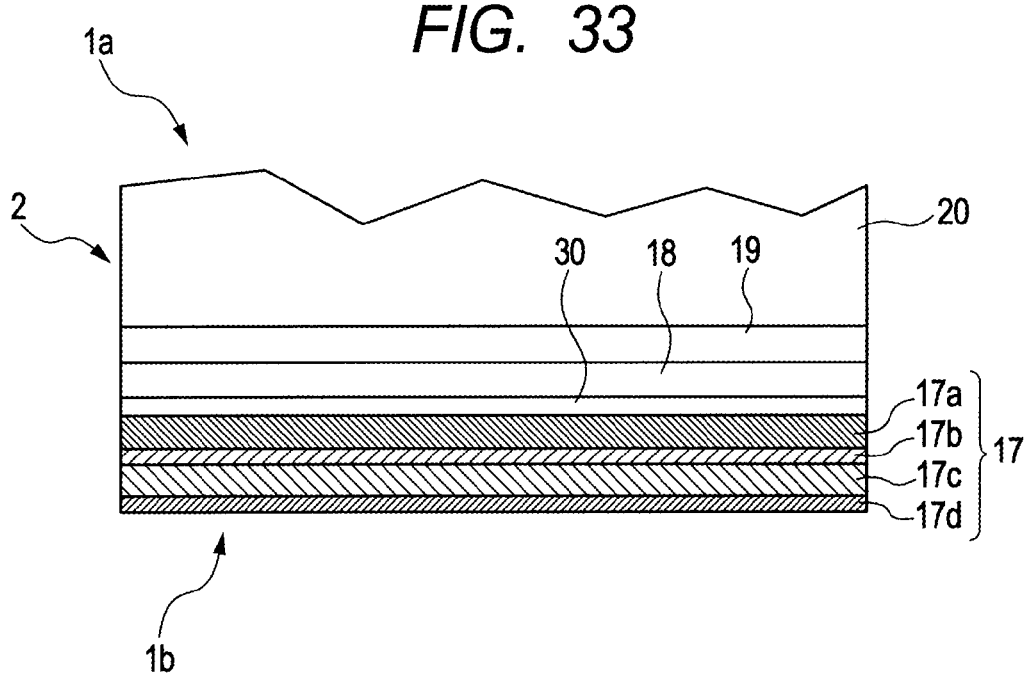
FIG. 33 is a cross-sectional view of the local details of the backside of the device for explaining the device structure and the manufacturing method thereof in another modified example (aluminum doped contact) of a detailed structure of the backside of the IGBT of the one embodiment of the invention in the present application.

Then, as shown in FIG. 30, for example, the metal collector electrode 17 is formed substantially over the entire backside 1b of the semiconductor wafer 1, for example, by sputtering (more specifically, see FIG. 33 and a description thereof). Thereafter, the semiconductor wafer 1 is separated into chip regions by dicing or the like, and sealed with a package if necessary, thus completing the device.

6. Description of Modified Example of Cell Structure of IGBT (Full-Active Cell Region) of One Embodiment in Present Application (See Mainly FIGS. 31 and 32)

In the sections 2 to 5, the IE-type trench gate IGBT has been specifically described by way of example, but in each embodiment of the invention in the present application, other unit cell structures, for example, a unit cell structure of the full-active trench gate IGBT can also be apparently applied. Thus, in this section, the unit cell structure of the full-active trench gate IGBT will be descried below.

Figure 31:
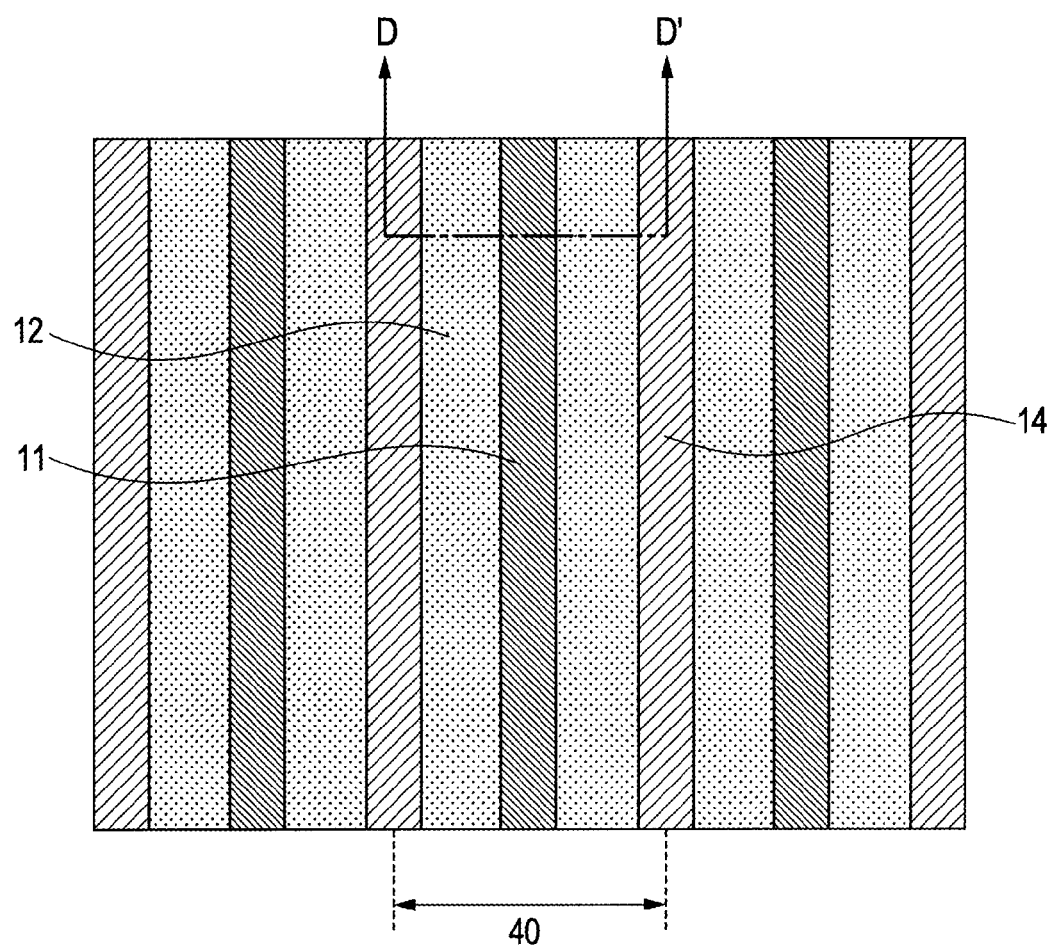
FIG. 31 is an enlarged top view of a cut region R3 inside the cell region shown in FIG. 6 in a modified example (full active-type cell region) of the cell structure of the IGBT of the one embodiment of the invention in the present application.
Figure 32:
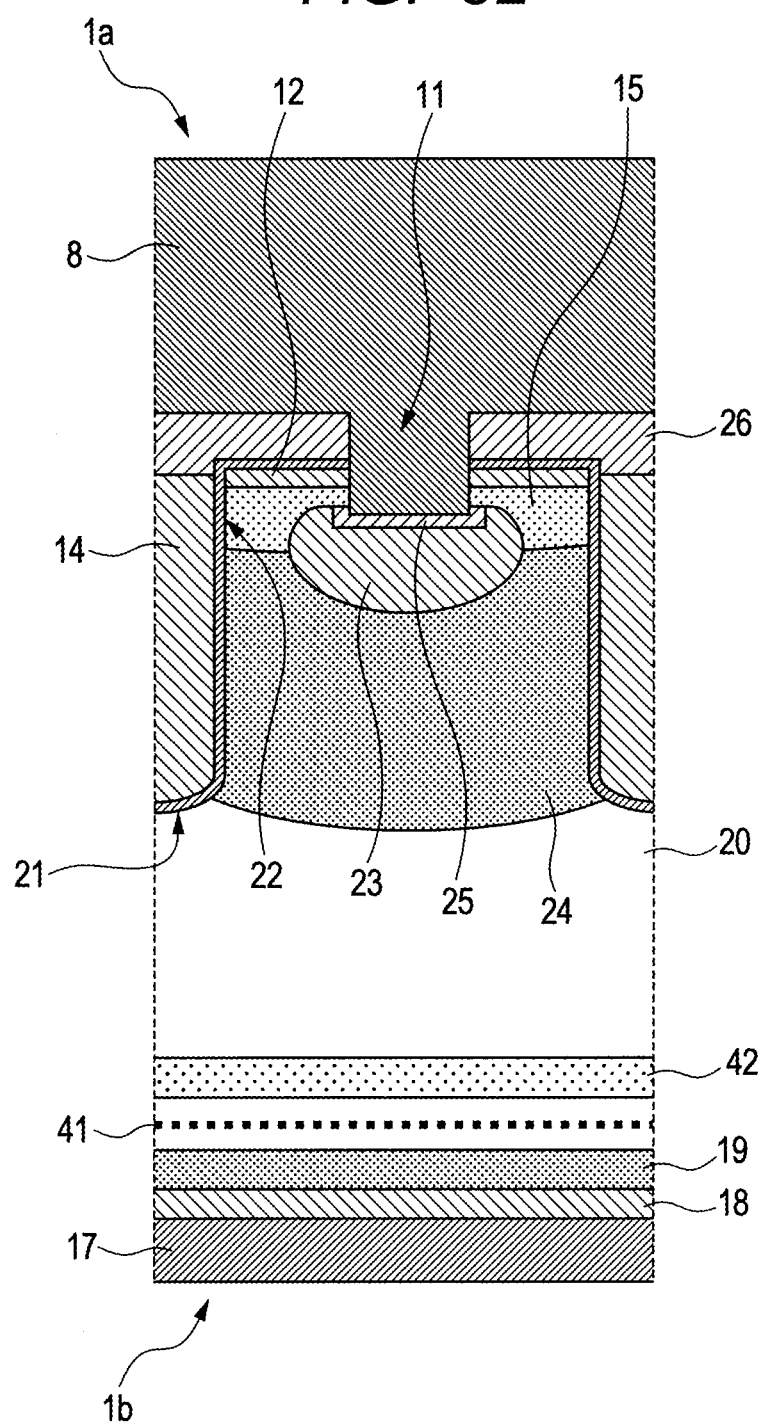
FIG. 32 is a cross-sectional view of the device taken along the line D-D' of FIG. 31.

FIG. 31 shows an enlarged top view (corresponding to FIG. 7 in the section 3) of a cut region R3 inside the cell region shown in FIG. 6 in a modified example (full active-type cell region) of the cell structure of the IGBT of the one embodiment of the invention in the present application. FIG. 32 shows cross-sectional view (corresponding to FIG. 8 in the section 3) of the device taken along the line D-D' of FIG. 31. Based on the drawings, the modified example (full active-type cell region) of the cell structure of the IGBT of the one embodiment of the invention in the present application will be described below.

As shown in FIG. 31, the cell region 10 is comprised of the linear active cell regions 40a repeatedly arranged mainly in the lateral direction (note that the entire linear unit cell regions 40 are comprised of the linear active cell regions 40a). A trench gate electrode 14 is disposed between the linear unit cell regions 40. At the center of the linear unit cell region 40, the linear contact trench 11 (or contact hole) is disposed. The linear unit cell region 40 located on each side of the contact trench 11 is provided with a linear N$^+$-type emitter region 12.

Next, FIG. 32 shows a cross-sectional view taken along the line D-D' of FIG. 31. As shown in FIG. 32, in the semiconductor region at the backside 1b of the wafer 1, the P$^+$-type body region 18 is provided on the upper side, and the N-type buffer region 19 is provided on the lower side. The metal collector electrode 17 is formed over the backside 1 of the semiconductor chip 2. That is, as described above, the N-type buffer region 19 is provided at the N$^-$-type drift region 20 located on the inner side of the collector region 18 so as to be in contact with the P$^+$-type collector region 18. The crystal defect region 41 is provided over the N$^-$-type drift region 20 around the outer periphery of the N-type buffer region 19 along the region 19. Further, the N-type field stopping region 42 having a higher concentration than that of the N$^-$-type drift region 20 is provided over the W-type drift region 20 on the first main surface side along the crystal defect region 41.

The N$^-$-type hole barrier region 24, the P-type body region 15, and the N$^+$-type emitter region 12 are provided from the bottom in that order over the N$^-$-type drift region 20 (front surface side semiconductor region of the semiconductor substrate) on the front surface 1a side (first main surface) of the semiconductor chip 2 in the linear unit cell region 40. An interlayer insulating film 26 is formed over the front surface 1a of the semiconductor chip 2. The interlayer insulating film 26 in the linear unit cell region 40 has the contact trenches 11 (or contact holes) reaching the inside of the semiconductor substrate. The P$^+$-type body contact region 25 and the P$^+$-type latch-up preventing region 23 are provided from above in that order in the semiconductor region at the bottom of each contact trench 11 or the like. The P-type body region 15 and the N$^+$-type emitter region 12 are coupled to the metal emitter electrode 8 provided over the interlayer insulating film 26 via the contact trench 11 or the like.

The N-type hole barrier region 24 is a barrier region for blocking the flow of holes through a route from the W-type drift region 20 to the N$^+$-type emitter region 12. The concentration of impurities of the N-type hole barrier region 24 is lower than that of the N$^+$-type emitter region 12 and higher than that of the N$^-$-type drift region 20. The presence of the N-type hole barrier region 24 can effectively prevent the holes stored in the N$^-$-type drift region 20 from entering an emitter passage (a passage from the N$^-$-type drift region 20 to the P+-type body contact region 25). It is apparent that the N-type hole barrier region 24 is not essential.

As described above, the full-active type cell region 10 has no linear inactive cell 40i shown in FIG. 4. The entire linear unit cell region 40 shown in FIG. 3 becomes the linear active cell region 40a.

7. Description of Modified Example (Aluminum Doped Contact) of Detailed Structure of Backside of IGBT of One Embodiment in Present Application (See Mainly FIG. 33)

The example of this section can be applied to all examples other than in this section. This embodiment can also be apparently applied to the IGBT including the general front surface side structure.

For convenience of description, this section will describe the device structure, along the example of the section 3. The process of this section will be briefly descried below with reference to the section 5.

In the following, the IE-type trench gate IGBT will be specifically described below. The backside structure is not limited to the IE-type IGBT or trench gate IGBT (full-active type trench gate IGBT), and can also be applied to other forms of IGBT (for example, planar IGBT) and the like.

FIG. 33 is a cross-sectional view of the local details of the backside of the device for explaining the device structure and the manufacturing method thereof in another modified example (aluminum doped contact) of a detailed structure of the backside of the IGBT of the one embodiment of the invention in the present application.

Specifically, FIG. 33 shows an enlarged cross-sectional view of the backside of the semiconductor chip 2 shown in FIG. 8 and its surroundings (which exemplarily shows an enlarged structure of the backside and its surroundings in the thickness direction of the chip). As shown in FIG. 33, a relatively thin P-type semiconductor region (of 0.04 to 0.1 μm in thickness), that is, an aluminum doped region 30 (second conductive type high-concentration collector contact region) is provided in a semiconductor region at the lower end of the P+-type collector region 18 on the backside of the semiconductor substrate 2. The concentration of impurities of the doped region 30 (for example, about $1\times10^{19}/cm^3$) is higher than that of the P+-type collector region 18. The metal collector electrode 17 is formed in contact with the aluminum doped region 30 over the backside 1b of the semiconductor substrate 2. By way of example, the electrode 17 is formed from the side closer to the semiconductor substrate 2 as follows. That is, the electrode 17 is comprised of an aluminum backside metal film 17a (for example, of about 600 nm in thickness) serving as an impurity source of the aluminum doped region 30, a titanium backside metal film 17b (for example, of about 100 nm in thickness), a nickel backside metal film 17c (for example, of about 600 nm in thickness), and a gold backside metal film 17d (for example, of about 100 nm in thickness).

Now, a manufacturing method will be briefly described. Like the process described in the section 5 with reference to FIG. 30, that is, the above aluminum backside metal film 17a, the titanium backside metal film 17, the nickel backside metal film 17c, and the gold backside metal film 17d are deposited by sputtering in that order during the sputtering deposition. Further, the heat generated at this time causes aluminum to be introduced into the silicon substrate to thereby form the aluminum doped region 30. Thereafter, the semiconductor wafer 1 is separated into chip regions by dicing or the like to provide the structure shown in FIG. 8 (which does not show the detailed structure).

In each embodiment of the present application, the holes are stored on the emitter side in the on state to promote the implantation of electrons. Conversely, a PN diode on the side of the backside collector becomes a diode having a low efficiency of implantation, and thus reduces switching loss. In order to form the backside diode with the low efficiency of implantation, it is very effective to decrease the ratio of a carrier concentration Qp of the P+-type collector region 18 to a carrier concentration Qn of an N-type field stopping region 19 (hereinafter referred to as a "carrier concentration ratio"), that is, (Qp/Qn). The excessive decrease in carrier concentration Qp of the P+-type collector region 18 degrades the characteristics of the backside metal contact. In this example, the aluminum doped region 30 is provided which has a higher concentration of impurities than that of the P+-type collector region 18 introduced from the aluminum film on the backside. The carrier concentration ratio can be preferably, for example, about 1.5 (in a range of, for example, about 1.1 to 4).

This section has described the backside metal structure or the like (containing the contact region) applied to the case where the PN diode on the backside collector side has a low efficiency of implantation. The backside metal structure or the like is not limited to the aluminum doped region 30, or an aluminum backside metal film 17a, and may be comprised of a combination of other metal films.

8. Description of Modified Example (Epitaxial Process) of Device Surface Formation Process of IGBT of One Embodiment in Present Application (See FIGS. 34 and 35)

The sections 4 and 5 have described the non-epitaxial process not using an epitaxial process. Various types of devices described in the present application can be manufactured even by various kinds of epitaxial processes using the epitaxial process. This section will describe an example of the epitaxial processes corresponding to the sections 4 and 5.

Figure 34:
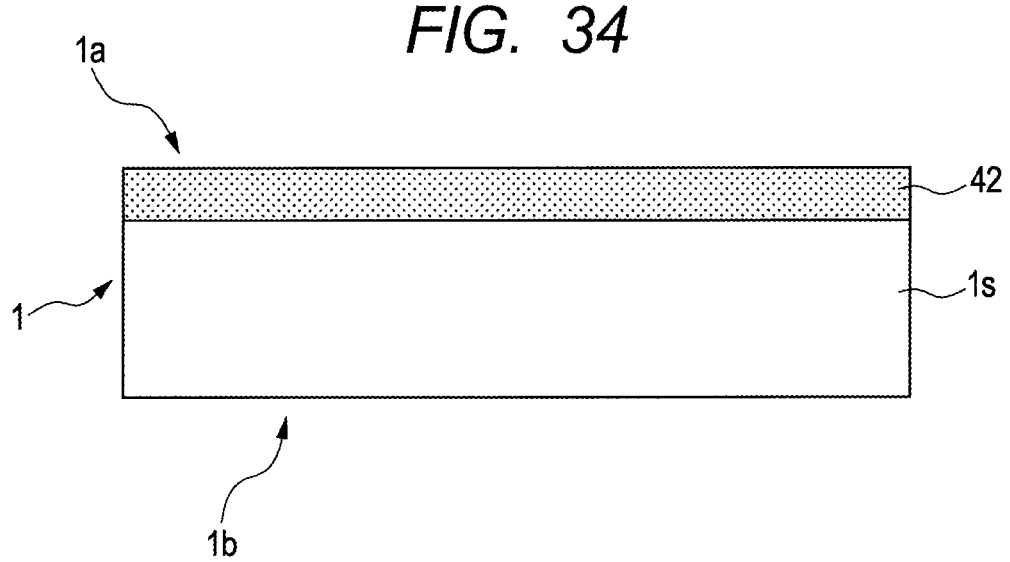
FIG. 34 is a cross-sectional view of the device in another manufacturing step corresponding to FIG. 8 (N-type field stopping region introduction step) for explaining a modified example (epitaxial process) of a formation process of the device surface in the IGBT of the one embodiment of the invention in the present application.
Figure 35:
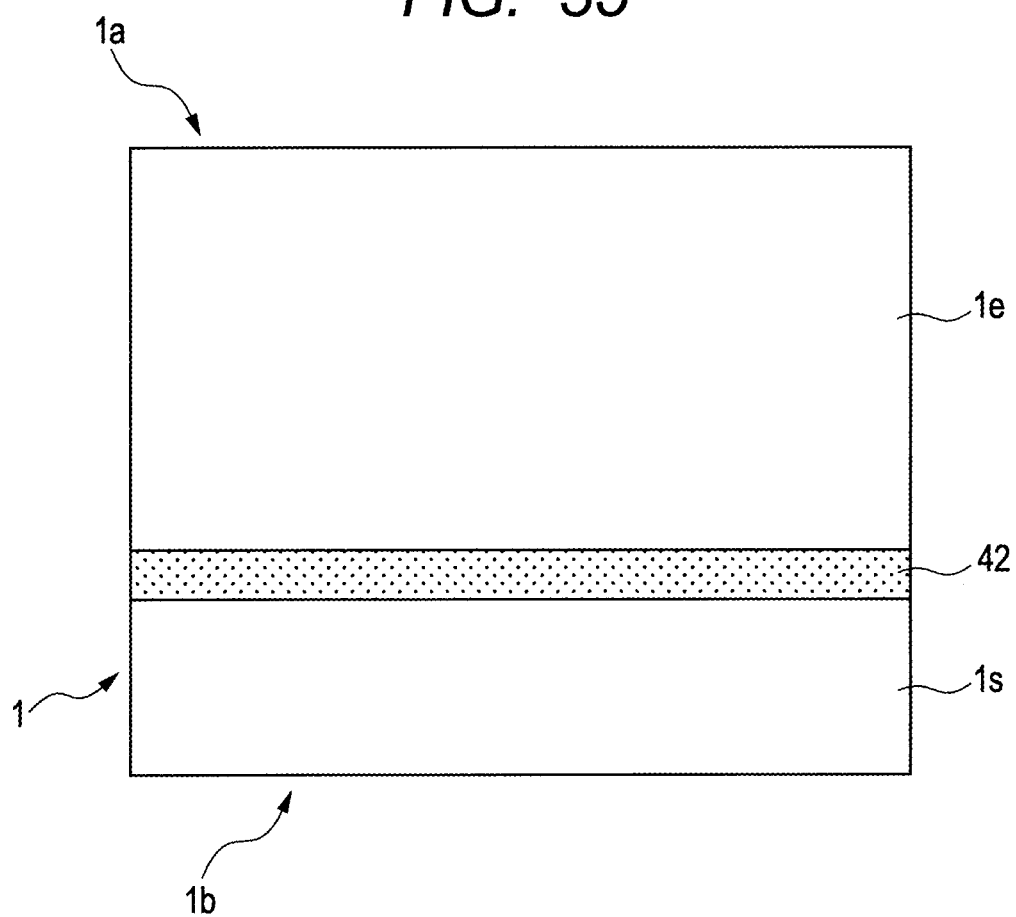
FIG. 35 is a cross-sectional view of the device in another manufacturing step corresponding to FIG. 8 (N⁻-type silicon epitaxial region formation step) for explaining a modified example (epitaxial process) of a formation process of the device surface in the IGBT of the one embodiment of the invention in the present application.

FIG. 34 shows a cross-sectional view of the device in another manufacturing step corresponding to FIG. 8 (N-type field stopping region introduction step) for explaining a modified example (epitaxial process) of a formation process of the surface of the device in the IGBT of the one embodiment of the invention in the present application. FIG. 35 shows a cross-sectional view of the device in another manufacturing step corresponding to FIG. 8 (N-type silicon epitaxial region formation step) for explaining a modified example (epitaxial process) of the device surface formation process of the IGBT of the one embodiment of the invention in the present application. Based on the drawings, the modified example (epitaxial process) of the device surface formation process of the IGBT of the one embodiment of the invention in the present application will be described below.

First, a wafer of 200 mm water (note that other wafers of 150 mmφ, 100 mmφ, 300 mmφ, 450 mmφ or the like may be used) comprised of the N−-type silicon single crystal (for example, having a concentration of phosphorus of about $2\times10^{14}/cm^3$ and a resistivity of 22 to 30 Ωcm) is prepared. The wafer produced by a Czochralski (CZ) method is most preferable, but a wafer produced by Floating Zone (FZ) method may be used.

Then, as shown in FIG. 34, the N-type field stopping region 42 is introduced into a semiconductor surface region (within an W-type single crystal silicon substrate 1s to serve as an N−-type drift region 20) at the front surface 1a of the wafer 1 by performing ion-implantation on the entire front surface 1a of the wafer 1 from the front surface 1a side. Preferable conditions for the ion implantation at this time can be, by way of example, Ion Species: phosphorus, Implantation Method: vertical implantation, Implantation Energy: about 75 KeV, Dose Amount for Each Implantation: $5\times10^{11}/cm^2$, Number of Implantation Processes: one time.

Subsequently, the activation annealing (for example, at a temperature of 1200° C. for about 30 minutes) is applied to the N-type field stopping region 42 if necessary.

Then, as shown in FIG. 35, an N-type silicon epitaxial region 1e (for example, having a thickness of about 50 μm and a resistivity of about 22 Ωcm at a withstand voltage of about 600 volts) is formed over the front surface 1a of the wafer 1 by epitaxial growth.

Thereafter, the processes described in the section 4 with reference to FIGS. 9 to 25 are performed, and further, the processes described in the section 5 with reference to FIGS. 27 to 30 are described.

9. Description of Basic Example (PIN Diode having Crystal Defect Region and Intermediate Field Stopping Regions) of Power Diode of One Embodiment in Present Application (See Mainly FIGS. 36 and 37)

The sections 2 to 8 mainly describe the case in which the basic theory of the invention in the present application is applied to the IGBT, but the sections 9 to 13 will mainly describe the case in which the basic theory of the invention is applied to the diode.

This section will describe the entire chip structure and the main device region structure of the PIN diode with the crystal defect region and the intermediate field stopping regions. This is because the PIN diode does not include a repeated structure, and its main PN junction has only the main part (center part) and only an end. Now, the main part of the main PN junction, specifically, a part serving as a unit cell part of the cell region in the cell structure will be extracted and described below. The device structure as described in the following sections 11 and 12 has a surrounding structure like the IGBT, and thus, the unit cell part will be extracted and described in the same manner as the case of the IGBT.

Figure 36:
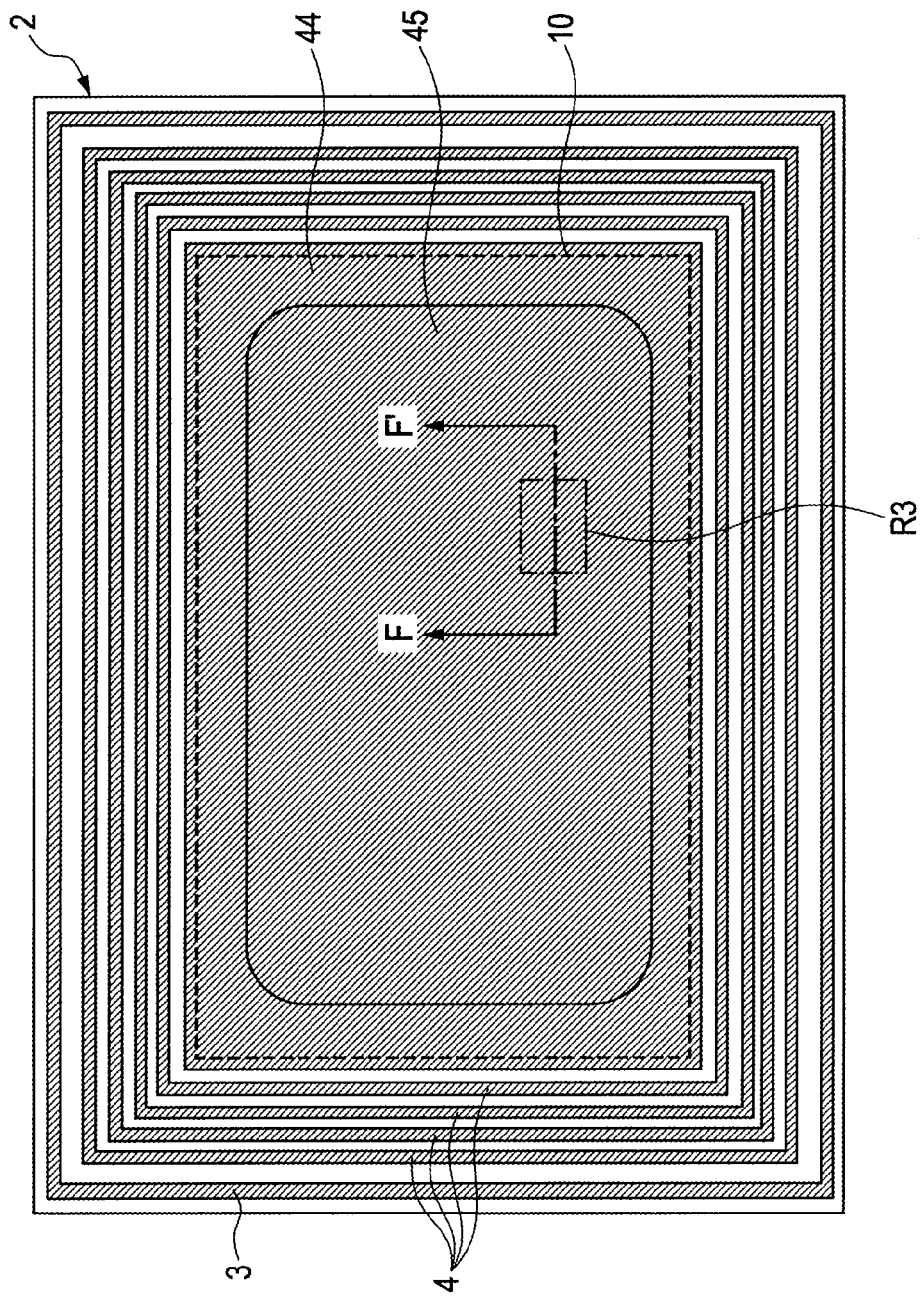
FIG. 36 is a top view of the entire diode chip corresponding to FIG. 6 in a basic example (PIN diode having the crystal defect region and the intermediate field stopping region) of a power diode of the one embodiment of the invention in the present application.

The peripheral structure shown in FIG. 36 is substantially the same as that described with reference to FIGS. 3 and 4 except that the dummy cell is not included.

Figure 37:
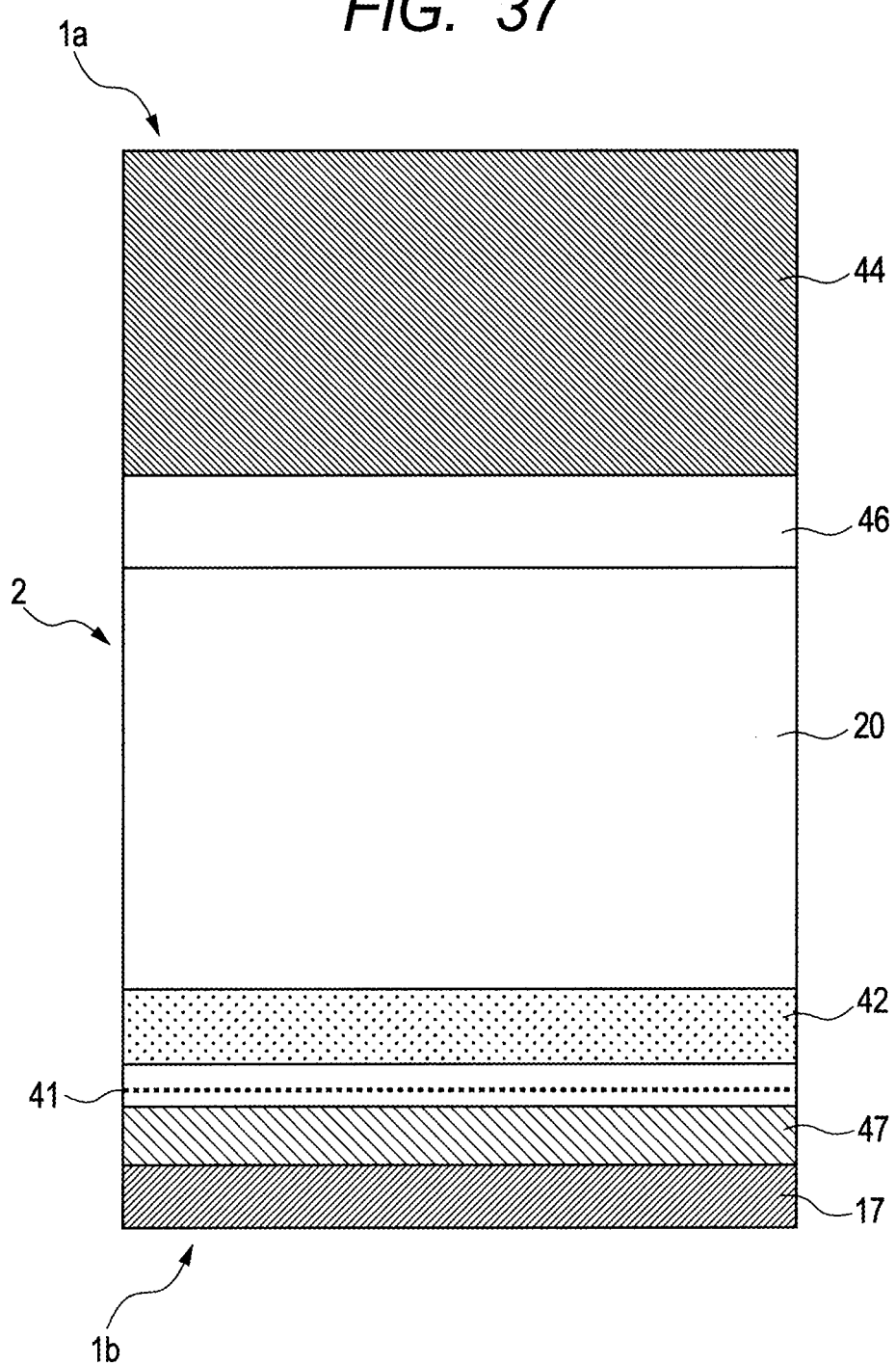
FIG. 37 is a cross-sectional view of the device in a main device region, taken along the line F-F' of FIG. 36.

FIG. 36 is a top view of the entire diode chip corresponding to FIG. 6 in a basic example of a power diode (PIN diode including the crystal defect region and the intermediate field stopping region) of the one embodiment of the invention in the present application. FIG. 37 is a cross-sectional view of the device in a main device region, taken along the line F-F' of FIG. 36 (corresponding to FIG. 8 in the section 3). Based on the drawings, the basic example of the power diode of the one embodiment in the present application (PIN diode including a crystal defect region and an intermediate field stopping region) will be described below.

As shown in FIG. 36, for example, a ring-like guard ring 3 comprised of, for example, an aluminum wiring layer or the like, is provided at the outer periphery of the upper surface 1*a* of the PIN diode device chip 2. Inside the ring 3, several (single or a plurality of) ring-like field plates 4 coupled to the ring-like floating field ring or the like are provided (for example, comprised of the same aluminum wiring layer or the like as mentioned above). The main PN junction region 10 is provided inside the field plates 4 (floating field ring 36 shown in FIG. 4) and in the main part of the inner region at the upper surface 1*a* of the chip 2. The main PN junction region 10 is covered with a metal anode electrode 44 comprised of, for example, the same aluminum wiring layer or the like as described above, up to the vicinity of its outer periphery. The center part of the metal anode electrode 44 becomes an anode pad 45 for coupling to a bonding wire or the like.

Then, FIG. 37 shows the cross-sectional view of the cut region R3 inside the cell region taken along the line F-F' of FIG. 36. As shown in FIG. 37, a high-concentration N-type cathode region 47 is formed to have a higher concentration than that of the N$^-$-type drift region 20 in the semiconductor region (N$^-$-type drift region 20) at the backside 1*b* of the semiconductor chip 2, and the metal cathode electrode 17 is formed over the backside 1*b* of the semiconductor chip 2. The crystal defect region 41 is provided along the N-type cathode region 47 over the N$^-$-type drift region 20 in the vicinity of its outer periphery. Further, the N-type field stopping region 42 is provided along the crystal defect region 41 in the N$^-$-type drift region 20 on the first main surface side. The field stopping region 42 has a higher concentration than that of the drift region 20.

A P-type anode region 46 is provided in the N$^-$-type drift region 20 (front surface side semiconductor region of the semiconductor substrate) on the front surface 1*a* (first main surface) side of the semiconductor chip 2 in the main PN junction region 10. An anode metal electrode 44 is formed over the front surface 1*a* of the semiconductor chip 2, and coupled to the P-type anode region 46 (in ohmic contact therewith).

10. Description of Basic Manufacturing Process Regarding Basic Example of Power Diode (PIN Diode Including Crystal Defect Region and Intermediate Field Stopping Region) of One Embodiment in Present Application (See Mainly FIGS. 38 to 43)

This section will describe a manufacturing process of the diode (non-epitaxial process) corresponding to that described in the sections 4 and 5 about the manufacturing method of the IGBT.

Figure 38:
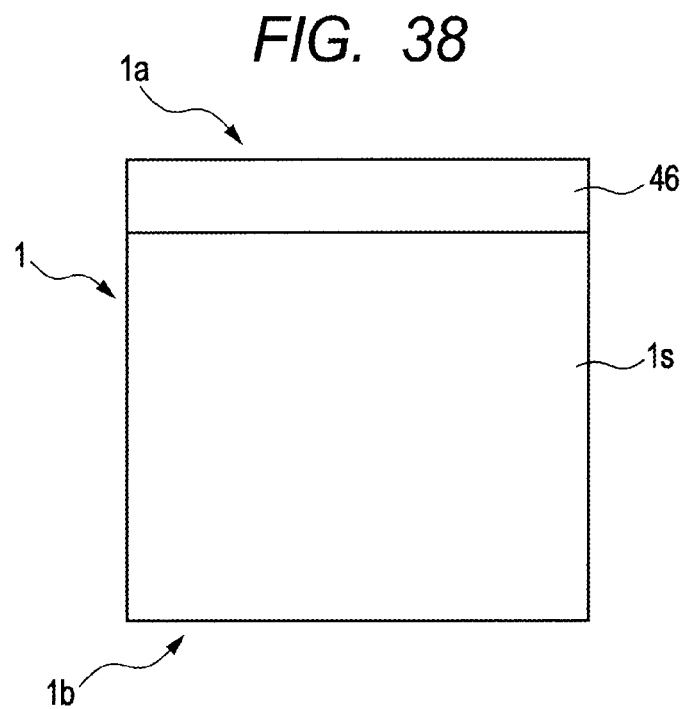
FIG. 38 is a cross-sectional view of the device in another manufacturing step corresponding to FIG. 37 (P-type anode region introduction step) for explaining a basic example of a manufacturing process of the power diode of the one embodiment of the invention in the present application.
Figure 39:
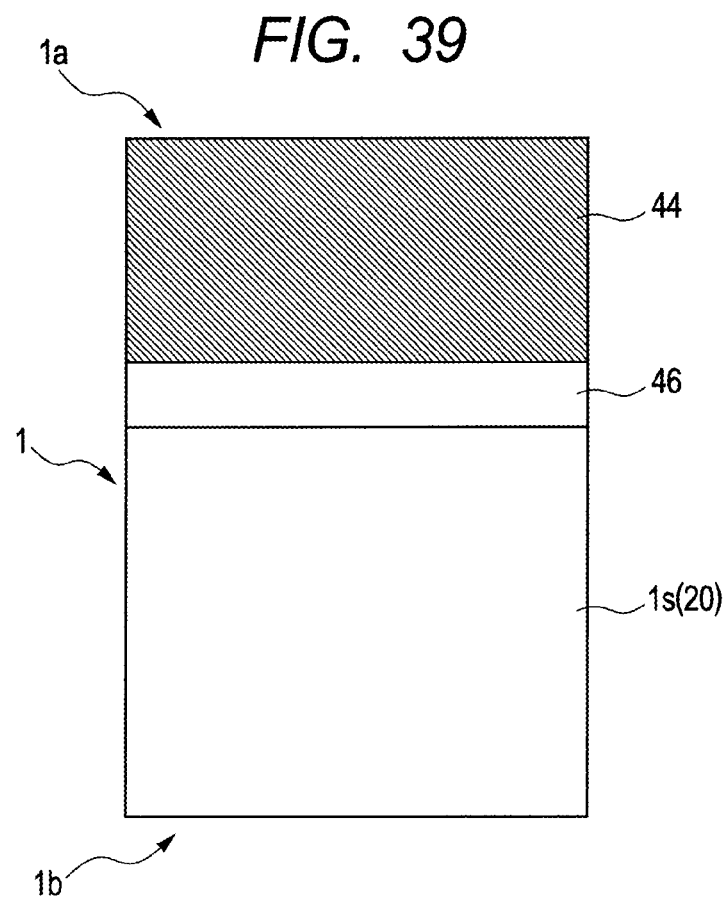
FIG. 39 is a cross-sectional view of the device in another manufacturing step corresponding to FIG. 37 (metal anode electrode formation step) for explaining the basic example of the manufacturing process of the power diode of, the one embodiment of the invention in the present application.
Figure 40:
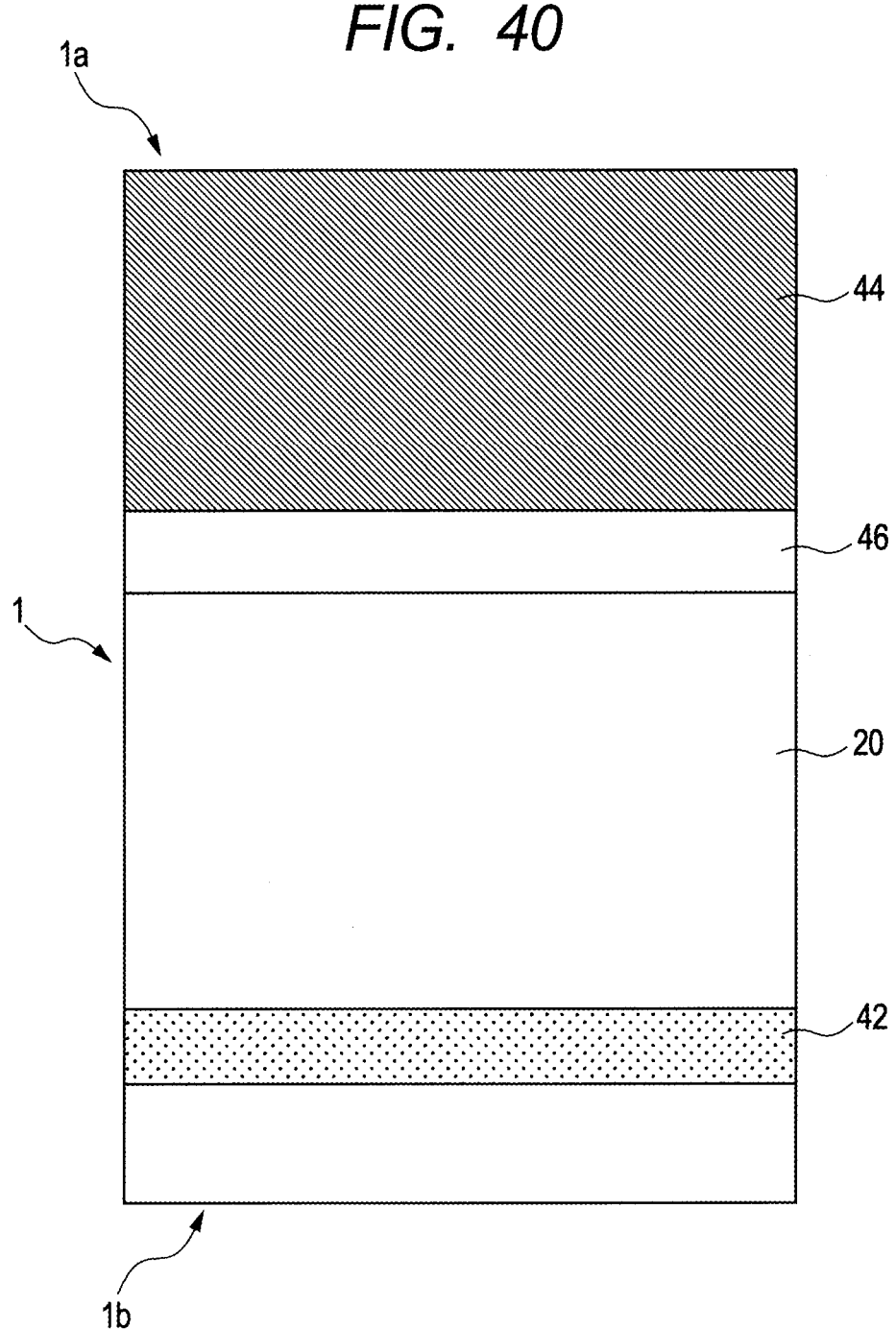
FIG. 40 is a cross-sectional view of the device in another manufacturing step corresponding to FIG. 37 (N-type field stopping region introduction step) for explaining the basic example of the manufacturing process of the power diode of the one embodiment of the invention in the present application.
Figure 41:
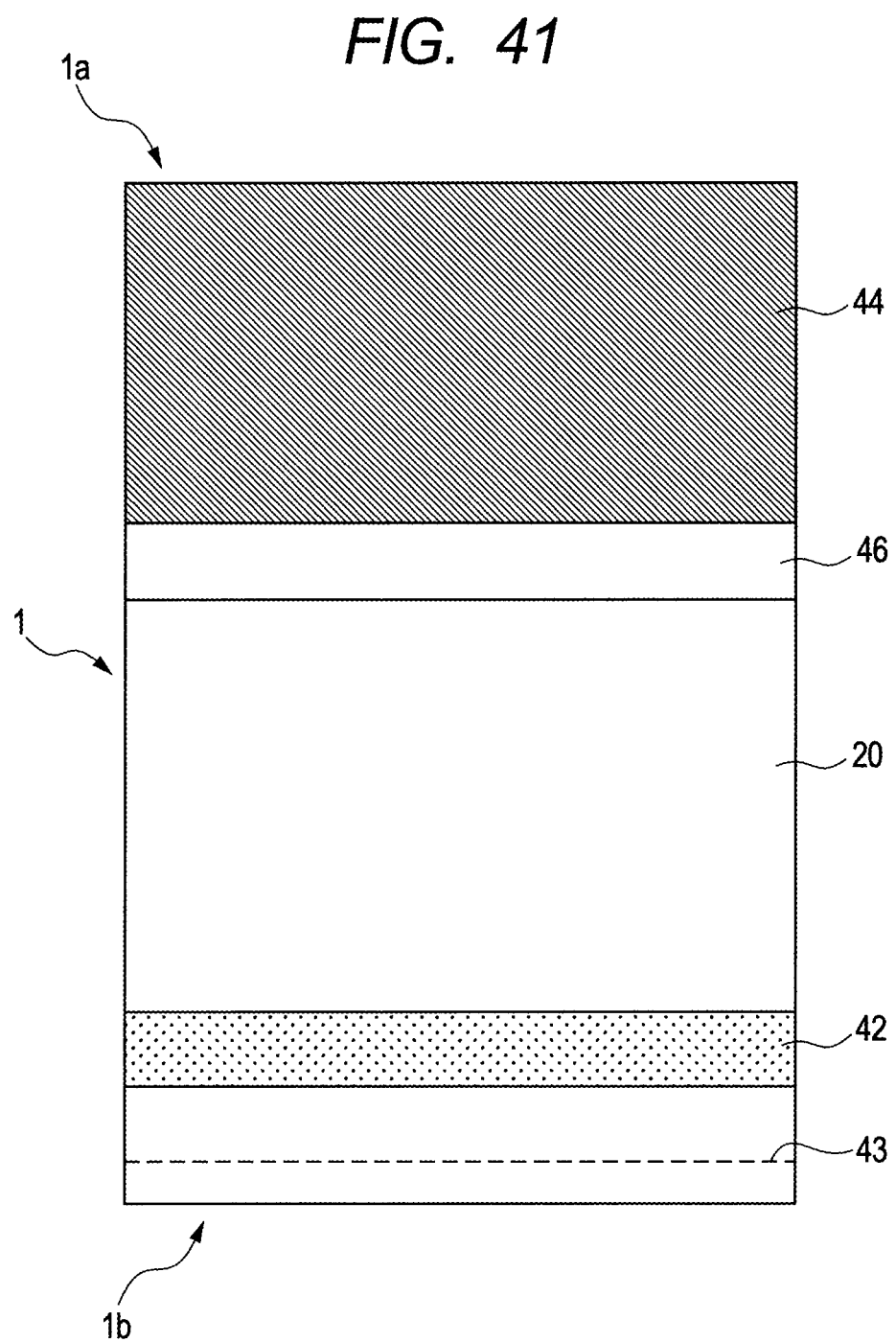
FIG. 41 is a cross-sectional view of the device in another manufacturing step corresponding to FIG. 37 (back grind step) for explaining the basic example of the manufacturing process of the power diode of the one embodiment of the invention in the present application.
Figure 42:
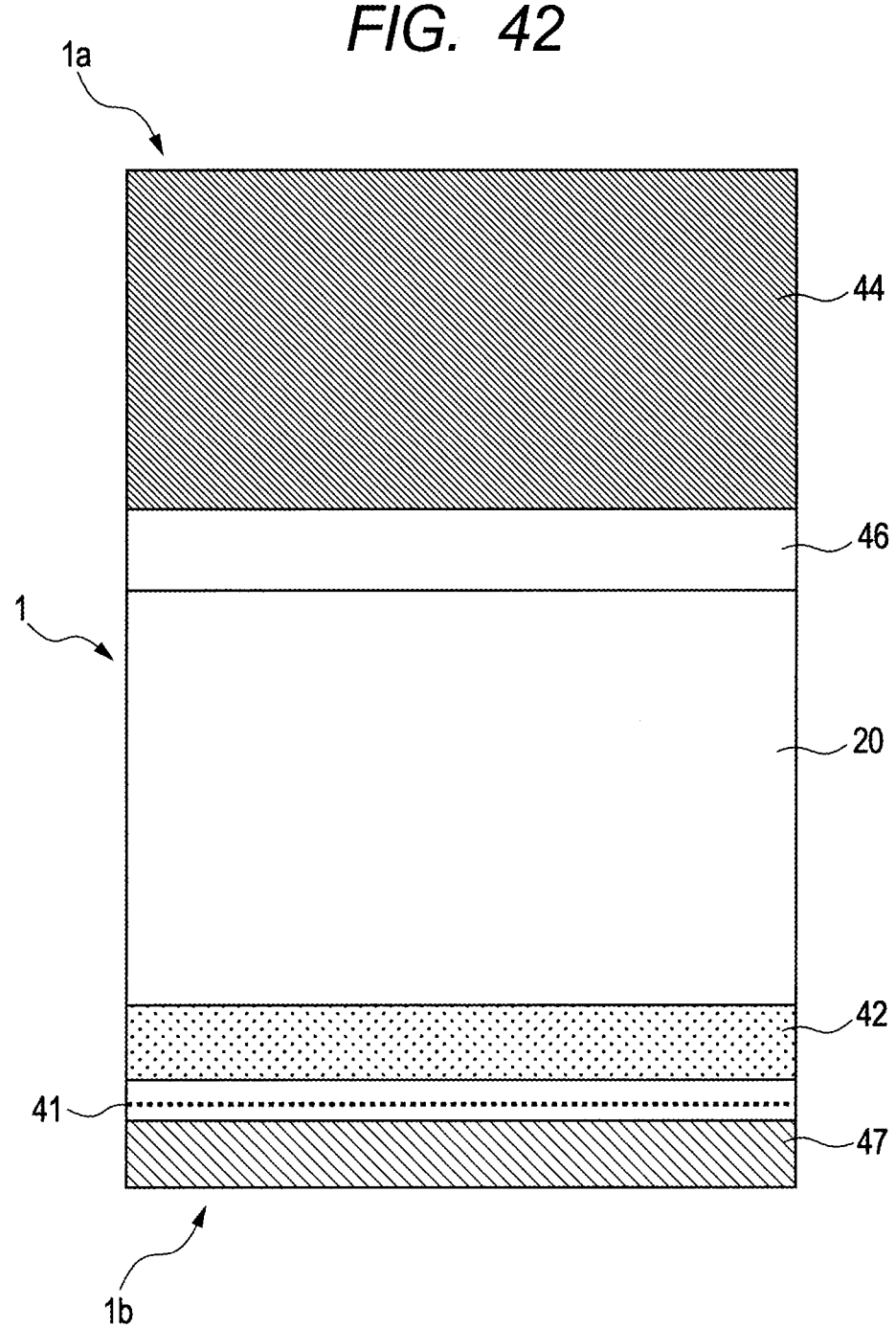
FIG. 42 is a cross-sectional view of the device in another manufacturing step corresponding to FIG. 37 (N-type cathode region introduction step) for explaining the basic example of the manufacturing process of the power diode of the one embodiment of the invention in the present application.
Figure 43:
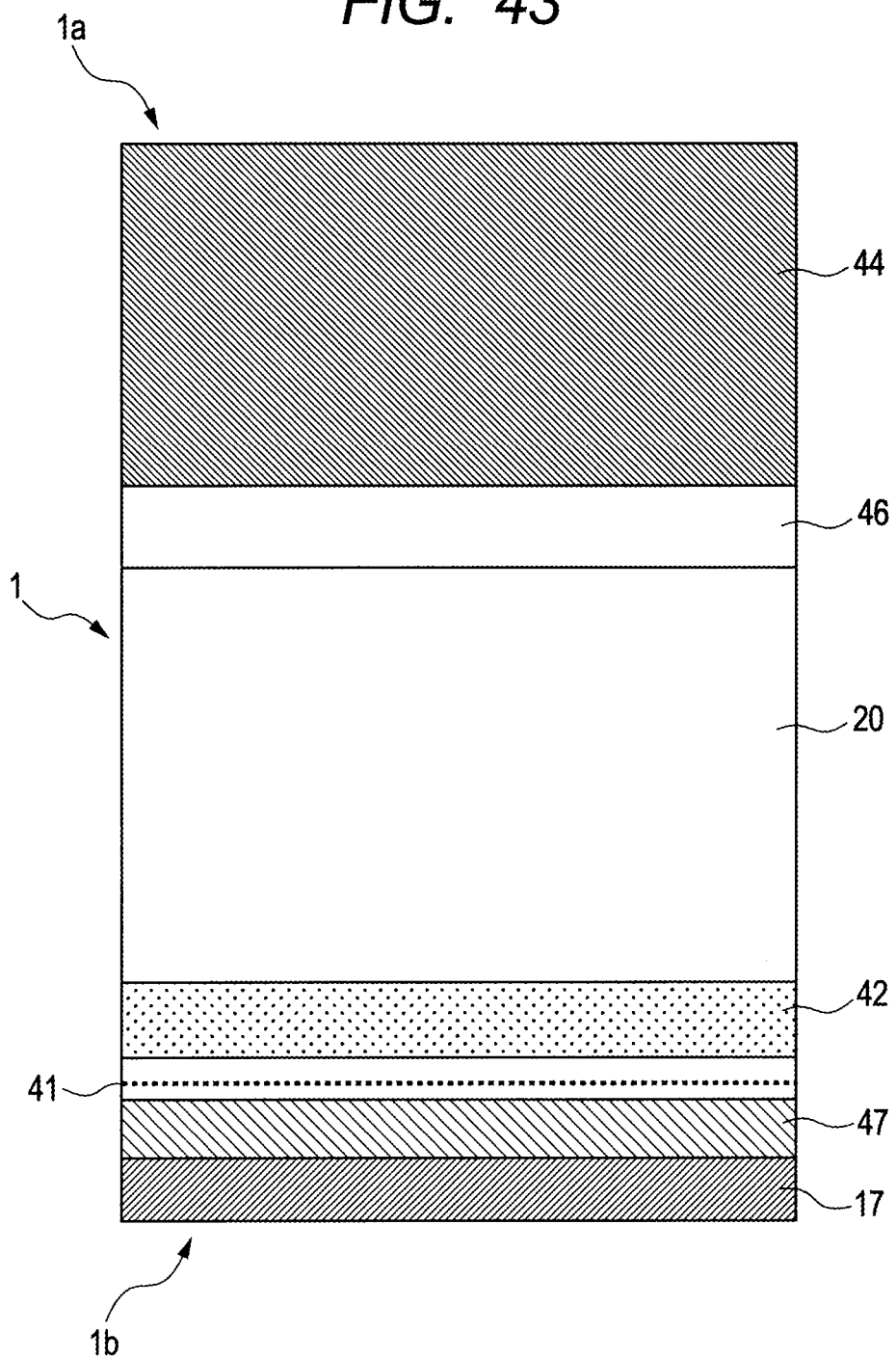
FIG. 43 is a cross-sectional view of the device in another manufacturing step corresponding to FIG. 37 (metal cathode electrode formation step) for explaining the basic example of the manufacturing process of the power diode of the one embodiment of the invention in the present application.

FIG. 38 shows a cross-sectional view of the device in another manufacturing step corresponding to FIG. 37 (P-type anode region introduction step) for explaining a basic example of a manufacturing process of the power diode of the one embodiment of the invention in the present application. FIG. 39 shows a cross-sectional view of the device in another manufacturing step corresponding to FIG. 37 (metal anode electrode formation step) for explaining the basic example of the manufacturing process of the power diode of the one embodiment of the invention in the present application. FIG. 40 shows a cross-sectional view of the device in another manufacturing step corresponding to FIG. 37 (N-type field stopping region introduction step) for explaining the basic example of the manufacturing process of the power diode of the one embodiment of the invention in the present application. FIG. 41 shows a cross-sectional view of the device in another manufacturing step corresponding to FIG. 37 (back grind step) for explaining the basic example of the manufacturing process of the power diode of the one embodiment of the invention in the present application. FIG. 42 shows a cross-sectional view of the device in another manufacturing step corresponding to FIG. 37 (N-type cathode region introduction step) for explaining the basic example of the manufacturing process of the power diode of the one embodiment of the invention in the present application. FIG. 43 shows a cross-sectional view of the device in another manufacturing step corresponding to FIG. 37 (metal cathode electrode formation step) for explaining the basic example of the manufacturing process of the power diode of the one embodiment of the invention in the present application. Based on the drawings, the basic manufacturing process regarding the basic example of the power diode of the one embodiment in the present application (PIN diode including the crystal defect region and the intermediate field stopping region) will be described below.

First, a wafer of 200 mmφ water (note that other wafers of 150 mmφ, 100 mmφ, 300 mmφ, 450 mmφ, or the like may be used) comprised of the N$^-$-type silicon single crystal (for example, having a concentration of phosphorus of about $2\times10^{14}/cm^3$ and a resistivity of 22 to 30 Ωcm) is prepared. The wafer produced by a floating zone (FZ) method is most preferable, but a wafer produced by Czochralski (CA) method may be used.

Then, as shown in FIG. 38, P-type impurities, such as boron, are ion-implanted into the entire surface of the main PN junction region 10 from the front surface 1*a* side of the wafer 1, so that the P-type anode region 46 is introduced at the semiconductor surface region of the front surface 1*a* of the wafer 1 (into the N$^-$-type single crystal silicon substrate 1*s* to serve as the N$^-$-type drift region 20).

Then, as shown in FIG. 39, like the metal emitter electrode 8 described in the previous section 4, the anode metal electrode 44 is formed over the front surface 1*a* of the wafer 1 above the P-type anode region 46.

Then, as shown in FIG. 40, an N-type field stopping region 42 is formed inside the N$^-$-type drift region 20 in the same manner as that described in the previous section 5 with reference to FIG. 26.

Then, as shown in FIG. 41, the wafer is thinned by back-grinding in the same manner as that described in the previous section 5 with reference to FIG. 27.

Then, as shown in FIG. 42, the N-type cathode region 47 is formed over the front surface region on the second main surface side of the W-type drift region 20, like the N-type buffer region 19 described in the previous section 5 with reference to FIG. 28. Preferable conditions for the ion implantation at this time can be, by way of example, Ion Species: phosphorus, Implantation Method: vertical implantation, Implantation Energy: about 125 KeV, Dose Amount for Each Implantation: $1\times10^{15}/cm^2$, Number of Implantation Processes: one time.

Preferable activation annealing conditions (laser application conditions) can be, by way of example, Annealing Method: irradiation of backside 1*b* of the wafer 1 with a laser light, Wavelength of Laser: 527 nm, Pulse Width: about 100 ns, Energy Density: about 1.8 J/cm$^2$, Application System:

two-pulse system, Delay Time between Both Pulses: about 500 ns, and Pulse Overlap Rate: about 50 to 66%.

Then, as shown in FIG. 43, the metal cathode electrode 17 or the like is formed over the backside 1b of the wafer 1 in the same manner as that described in the previous section 5 with reference to FIG. 30. The metal cathode electrode 17 or the like may be formed in the same manner as that shown in FIG. 33.

Thereafter, the semiconductor wafer 1 is separated into chip regions by dicing or the like, which are then sealed in a package if necessary, so that the device is completed.

11. Description of Modified Example 1 (MPS Diode with Crystal Defect Region and Intermediate Field Stopping Region) of Power Diode of One Embodiment in Present Application (See Mainly FIG. 44)

This section will describe the modified example 1 with respect to the diode structure described in the section 9. The manufacturing method in this section is not substantially different from that described in section 10, and thus a description thereof will not be repeated in principle.

Figure 44:
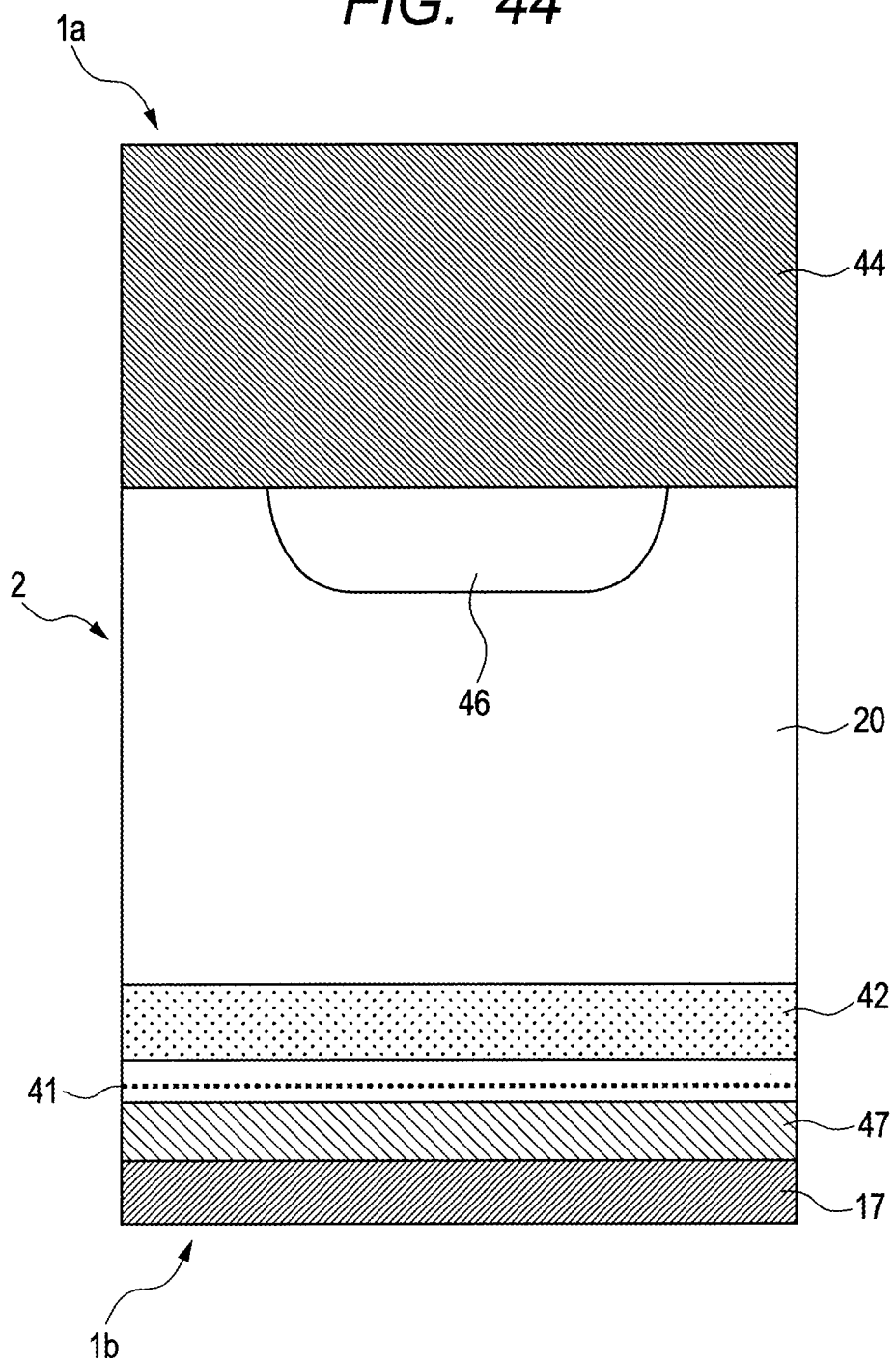
FIG. 44 is a cross-sectional view of a unit cell of the device taken along the line F-F' of FIG. 36 in a modified example 1 of a power diode (MPS diode including a crystal defect region and an intermediate field stopping region) of the one embodiment of the invention in the present application.

FIG. 44 is a cross-sectional view of the unit cell of the device taken along the line F-F' of FIG. 36 in the modified example 1 of the power diode of the one embodiment in the present application (MPS diode including the crystal defect region and the intermediate field stopping region). Based on the drawings, the modified example 1 of the power diode of the one embodiment in the present application (MPS diode including the crystal defect region and the intermediate field stopping region) will be described below.

Unlike the general IGBT, in the unit cell region of the cell region 10 (see FIG. 36) in this example, disk-like P-type anode regions 46 are distributed and arranged in a reticular pattern (for example, in the form of a two-dimensional hexagonal close-packed lattice) over the front surface 1a of the semiconductor substrate 2 in the N-type drift region 20. Thus, the P-type anode region 46 and the anode metal electrode 44 are in ohmic contact with each other, and a schottky junction is established at a part without the P-type anode region 46. The structures of other components are completely the same as those shown in FIG. 37.

12. Description of Modified Example 2 (SSD Including Crystal Defect Region and Intermediate Field Stopping Region) of Power Diode of One Embodiment in Present Application (See Mainly FIG. 45)

This section will describe a modified example 2 with respect to the diode structure described in the section 9. The manufacturing method in this section is not substantially different from that described in section 10, and thus a description thereof will not be repeated in principle.

Figure 45:
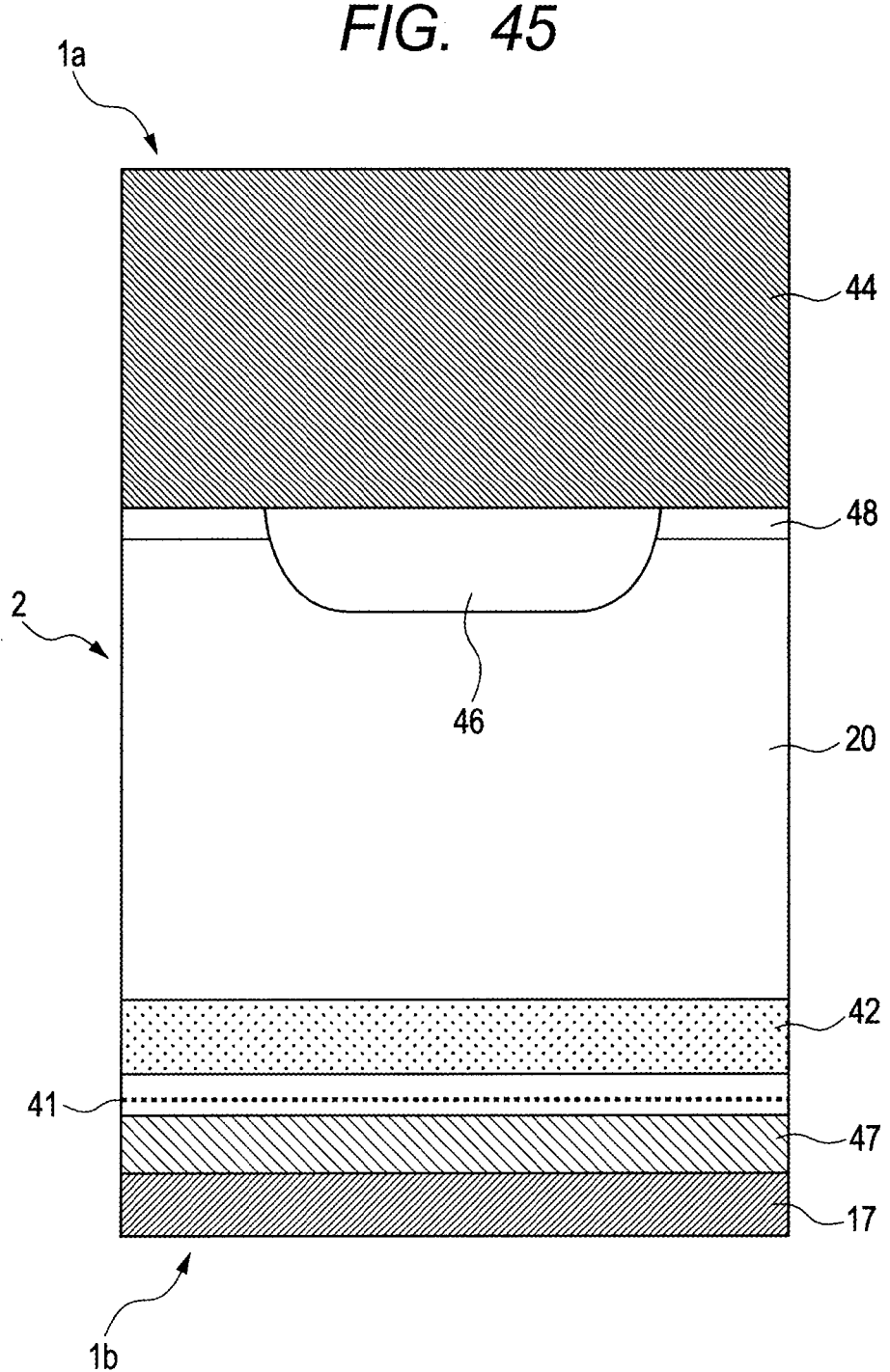
FIG. 45 is a cross-sectional view of a unit cell of the device taken along the line F-F' of FIG. 36 in the modified example 2 of the power diode (SSD including a crystal defect region and an intermediate field stopping region) of the one embodiment of the invention in the present application.

FIG. 45 shows a cross-sectional view of a unit cell of the device taken along the line F-F' of FIG. 36 in the modified example 2 of the power diode (SSD including a crystal defect region and an intermediate field stopping region) of the one embodiment of the invention in the present application. Based on the drawings, the modified example 2 of the power diode of the one embodiment in the present application (SSD diode including the crystal defect region and the intermediate field stopping region) will be described below.

In this example, a shallow thin impurity region (doped not to make full depletion at the maximum withstand voltage, for example, doped with aluminum or the like as the P-type impurity), that is, a P-type surface region 48 is added, as compared to the P-type anode region 46 for relieving the concentration of electric field near the schottky barrier junction of the MPS diode described in the previous section 11.

13. Description of Modified Example of Diode Manufacturing Process (See Mainly FIGS. 34 and 35)

In this section, the epitaxial process in the diode will be described with reference to the manufacturing process (in the section 8) of the IGBT.

Like the section 8, first, a wafer of 200 mm$\phi$ water (note that other wafers of 150 mm$\phi$, 100 mm$\phi$, 300 mm$\phi$, 450 mm$\phi$ or the like may be used) comprised of the N$^-$-type silicon single crystal (for example, having a concentration of phosphorus of about $2\times10^{14}$/cm$^3$ and a resistivity of 22 to 30 $\Omega$cm) is prepared. The wafer produced by the czochralski (CA) method is most preferable, but a wafer produced by the floating zone (FZ) method may be used.

Then, as shown in FIG. 34, the N-type field stopping region 42 is introduced into a semiconductor front surface region (within an N$^-$-type single crystal silicon substrate 1s to serve as the N$^-$-type drift region 20) of the front surface 1a of the wafer 1 by performing ion-implantation on the entire front surface 1a of the wafer 1 from the front surface 1a side. Preferable conditions for the ion implantation at this time can be, by way of example, Ion Species: phosphorus, Implantation Method: vertical implantation, Implantation Energy: about 75 KeV, Dose Amount for Each Implantation: $5\times10^{11}$/cm$^2$, Number of Implantation Processes: one time.

Subsequently, if necessary, the activation annealing (for example, at a temperature of 1200° C. for about 30 minutes) is applied to the N-type field stopping region 42.

Then, as shown in FIG. 35, the N-type silicon epitaxial region 1e (having a thickness of about 50 μm and a resistivity about 22 $\Omega$cm at a withstand voltage of about 600 volts) is formed over the front surface 1a side of the wafer 1 by epitaxial growth.

Thereafter, the processes described in the section 10 with reference to FIGS. 38 and 39 are performed, and further the processes described in the same section with reference to FIGS. 41 to 43 are performed.

14. Consideration about Overall Present Application and Supplementary Description of Respective Embodiments In this section, the consideration about the overall present application and the supplementary description of respective embodiments (including modified examples) in the present application will be given below. Now, the IGBT will be specifically described below by way of example, but the same goes for the diode as it is.

As described above, the IGBT or the like (in the case of the diode, the N-type high-concentration region or N-type contact region) has an N-type buffer (Buffer) region being in contact with the P-type collector region on its backside, and having a higher concentration than that of the N$^-$-type drift region (or N$^-$-type base region). Crystal defects generated by the ion implantation for introduction of the P-type collector region or N-type buffer region are left in the N$^-$-type drift region near the N-type buffer region to thereby improve the switching speed. This method is known as the device formation method. In such an "ion implantation residual defect type IGBT", residual crystal defects work as the center of recombination to improve the switching speed at the off time, while a depletion layer is brought into contact with the crystal defects at the off time to increase a leak current, which is the adverse effect.

Thus, in each embodiment of the invention, the independent N-type field stopping region 42 is provided separately from the N-type buffer region 19 forming the backside PN junction for determining the implantation efficiency of holes. Thus, in the off state, the depletion layer reaches up to an upper part (part close to the N-type field stopping region 42) with respect to the crystal defect region 41 of the N$^-$-type drift region 20 between the N-type buffer region 19 and the N-type field stopping region 42, which cannot result in an increase in leak current. This is because the crystal defect region 41 is distributed from a part close to a base on the N-type field stopping region 42 side of the impurity distribution of the N-type buffer region 19 (that is, a part near the boundary between the N-type buffer region 19 and the N⁻-type drift region 20) over a part near the boundary inside the N⁻-type drift region 20 between the N-type field stopping region 42 and the N-type buffer region 19.

The same goes for the diode. That is, the impurity structure on the backside of the diode is one provided by removing the P⁺-type collector region 18 from the IGBT. The N-type cathode region 47 in the diode corresponds to the N-type buffer region 19 of the IGBT.

15. Summary

Although the invention made by the inventors has been specifically described based on the preferred embodiments, the invention is not limited thereto. It is apparent that various modifications can be made to the embodiments without departing from the scope of the invention.

For example, in the above embodiments, the device mainly using the aluminum surface electrode has been described, but the invention is not limited thereto. Any other devices using materials other than the above metal can also be apparently applied.

Although the above embodiments have specifically described the IGBT and the diode mainly using the silicon substrate, the invention is not limited thereto. The invention can be apparently applied to one using a SiC-based substrate, a GaN substrate, a GaAs substrate, an InP substrate, and the like.

Although the above embodiments have specifically described mainly the device including the N-type drift region, the invention is not limited thereto. The invention can also be applied to a device including a P-type drift region.

The above embodiments have specifically described mainly a fly-back diode as the diode, but the invention is not limited thereto. The invention can also be apparently applied to any other diodes for other applications.

Although in the above embodiments, the crystal defect region maintains defects generated by the ion implantation at the time of annealing, the invention is not limited thereto. However, a crystal defect region may be newly formed by implanting hydrogen ions, helium ions, other ions, or particles.

What is claimed is:

1. An IGBT, comprising:
   (a) a semiconductor substrate having a first main surface and a second main surface,
   (b) a drift region of a first conductive type occupying a main part of the semiconductor substrate;
   (c) a channel region of a second conductive type opposite to the first conductive type, provided at a front surface region on the first main surface side of the drift region;
   (d) an emitter region of the first conductive type provided at a front surface region on the first main surface side of the channel region;
   (e) a collector region of the second conductive type provided at the second main surface side of the drift region;
   (f) a buffer region of the first conductive type provided along an inner side of the collector region and in contact with the collector region, said buffer region having a higher concentration than that of the drift region;
   (g) a crystal defect region provided between the buffer region and the drift region; and
   (h) a field stopping region of the first conductive type provided between the crystal defect region and the drift region, said field stopping region having a higher concentration than that of the drift region,
   wherein the buffer region is provided between the collector region and the crystal defect region.

2. The IGBT according to claim 1, wherein the semiconductor substrate is a single crystal silicon substrate.

3. The IGBT according to claim 2, wherein the single crystal silicon substrate is formed by a FZ method.

4. The IGBT according to claim 3, wherein the field stopping region is formed by ion-implanting hydrogen ions or helium ions.

5. The IGBT according to claim 2, wherein the IGBT is of a trench gate type.

6. The IGBT according to claim 5, wherein the IGBT is an IE-type trench gate IGBT.

7. The IGBT according to claim 2, further comprising:
   (i) a metal collector electrode provided over the second main surface of the semiconductor substrate; and
   (j) a high-concentration collector contact region provided at the collector region on the metal collector electrode side, said collector contact region having the same conductive type as that of the collector region, and a higher impurity concentration than that of the collector region,
   wherein the high-concentration collector contact region is a region doped with aluminum.

8. The IGBT according to claim 7, wherein a part of the metal collector electrode in contact with the high-concentration collector contact region is a metal film containing aluminum as a principal component.

9. A diode comprising:
   (a) a semiconductor substrate having a first main surface and a second main surface,
   (b) a drift region of a first conductive type occupying a main part of the semiconductor substrate;
   (c) an anode metal electrode provided over the first main surface of the semiconductor substrate;
   (d) a cathode region of the first conductive type provided at the second main surface side of the drift region, said cathode region having a higher concentration than that of the drift region;
   (e) a crystal defect region provided along an inner side of the cathode region, and between the cathode region and the drift region; and
   (f) a field stopping region of the first conductive type provided along an inner side of the crystal defect region, and between the drift region and the crystal defect region, said field stopping region having a higher concentration than that of the drift region.

10. The diode according to claim 9, wherein the semiconductor substrate is a single crystal silicon substrate.

11. The diode according to claim 10, wherein the single crystal silicon substrate is formed by a FZ method.

12. The diode according to claim 11, wherein the field stopping region is formed by ion-implanting hydrogen ions or helium ions.

* * * * *